(12) United States Patent
Tsurumi

(10) Patent No.: US 8,273,463 B2
(45) Date of Patent: Sep. 25, 2012

(54) MULTILAYER FILM FOR PLATING, METHOD OF MANUFACTURING METAL FILM-COATED MATERIAL AND METAL FILM-COATED MATERIAL

(75) Inventor: Mitsuyuki Tsurumi, Kanagawa (JP)

(73) Assignee: FUJIFILM Corporation, Tokyo (JP)

( * ) Notice: Subject to any disclaimer, the term of this patent is extended or adjusted under 35 U.S.C. 154(b) by 577 days.

(21) Appl. No.: 12/427,761

(22) Filed: Apr. 22, 2009

(65) Prior Publication Data

US 2009/0269599 A1 Oct. 29, 2009

(30) Foreign Application Priority Data

Apr. 23, 2008 (JP) ................................. 2008-113207

(51) Int. Cl.
*B32B 27/00* (2006.01)
*B32B 15/08* (2006.01)
*C08J 7/04* (2006.01)
*C23C 18/16* (2006.01)

(52) U.S. Cl. ...................... 428/458; 428/32.51; 430/200

(58) Field of Classification Search .................. 428/458, 428/32.51; 430/200
See application file for complete search history.

(56) References Cited

U.S. PATENT DOCUMENTS

2009/0022885 A1 * 1/2009 Matsumoto et al. ......... 427/98.5

FOREIGN PATENT DOCUMENTS

| JP | 2004-243752 | 9/2004 |
|---|---|---|
| JP | 2005-54357 | 3/2005 |
| JP | 2006-237400 | 9/2006 |
| JP | 2007-125862 | 5/2007 |

* cited by examiner

*Primary Examiner* — Kelechi Egwim
(74) *Attorney, Agent, or Firm* — SOLARIS Intellectual Property Group, PLLC

(57) ABSTRACT

Disclosed is a multilayer film for plating comprising, on a surface of a first substrate, a plating receptive layer which contains a polymer having a polymerizable group and a functional group, wherein the plating receptive layer satisfies at least one of the following (1)-(4):

(1) the saturated water absorption ratio is from 0.01 to 10% by mass in an environment of a temperature of 25° C. and relative humidity of 50%;
(2) the saturated water absorption ratio is from 0.05 to 20% by mass in an environment of a temperature of 25° C. and relative humidity of 95%;
(3) the water absorption ratio is from 0.1 to 30% by mass after immersion in boiling water at 100° C. for one hour; and
(4) the surface contact angle of distilled water is from 50° to 150° after 5 µl of the distilled water is dropped onto the plating receptive layer and allowed to stand for 15 seconds in an environment of a temperature of 25° C. and relative humidity of 50%.

15 Claims, No Drawings

MULTILAYER FILM FOR PLATING, METHOD OF MANUFACTURING METAL FILM-COATED MATERIAL AND METAL FILM-COATED MATERIAL

CROSS-REFERENCE TO RELATED APPLICATION

This application claims priority under 35 USC 119 from Japanese Patent Application No. 2008-113207, the disclosure of which is incorporated by reference herein.

BACKGROUND

1. Field of the Invention

The present invention relates to a multilayer film for plating, a method of manufacturing a metal film-coated material and a metal film-coated material, and more specifically, a multilayer film for plating capable of forming a plating receptive layer on any substrate surface, a method of manufacturing a metal film-coated material using the multilayer film, and the metal film-coated material obtained using the manufacturing method.

2. Related Art

In recent years, with demand for highly-functional electric devices and the like, the high-density integration of electronic components, the high-density packaging and the like have been advanced, and to this end, miniaturization and high-density technology of printed circuit boards applicable to these the high-density packaging and like have also been advanced.

The copper clad laminates (CCL) in which a metal film is formed on the surface of an insulating resin film or various insulating laminate material have been widely used in order to produce boards for packaging semiconductors for driving for displaying an image on a liquid crystal display, or boards used for a movable part which requires flexibility. In recent years, a COF [chip-on film] has received attention as a technique of packaging a driver IC chip for displaying a liquid crystal image display. It is said that the COF enables fine pitch packaging and miniaturization of a driver IC and costs reduction, as compared with the TCP (tape carrier package) which is the mainstream in the conventional packaging method. In recent years, in the COF, electronic circuits with high definition and fine pitch are strongly required with the recent development of a liquid crystal display screen with high definition and the miniaturization of an IC for driving liquid crystal.

In forming these fine pitch wirings, the "subtractive method" and the "semi-additive method" as methods of forming conventional conductive patterns, in particular, methods for forming metal patterns useful in the field of the printed circuit boards have been known.

The subtractive method is the method in which a photosensitive layer sensitive to irradiation with actinic light on a metal film formed on an insulating resin film of a copper clad laminate is provided, and the photosensitive layer is imagewise exposed, and subjected to development to form a resist image, subsequently, a metal pattern is formed by etching, and finally, the resist is peeled off. The copper clad laminate used for the subtractive method is prepared in such a manner that a resin varnish layer is formed on a metal foil and is cured; a thermoplastic layer is formed on an insulating resin film, and a metal foil is laminated on the thermoplastic layer; or an electric power supply layer formed by a certain method is formed on the surface of an insulating resin film and an electroplating of the electric power supply layer is performed by flowing electric current. As the electric power supply layer formed by this technique, a plating method, a sputtering method, a vapor-deposition method, or a thin metal foil laminating method is used.

On the other hand, the semi-additive method is the method in which an electric power supply layer formed by a certain method is formed on the surface of an insulating resin film, and a photosensitive layer sensitive to irradiation with actinic light is formed on the electric power supply layer, and the photosensitive layer is imagewise exposed, and is subjected to development to form a resist image, and an electroplating of the electric power supply layer is performed by flowing electric current. After a metal wiring is formed in the area where the resist is not formed, the electric power supply layer where the metal wiring is not provided is subjected to an etching process to form a metal pattern. As the electric power supply layer formed by this technique, a plating method, a sputtering method, a vapor-deposition method, or a thin metal foil laminating method is used. In this method, a copper clad laminate, in which a metal film is formed, is also preferably used.

As the copper clad laminate used for the above subtractive method and the semi-additive method, it has been known that a laminate for a flexible printed circuit board, in which a polyimide film is subjected to a plasma treatment, followed by a silane coupling treatment, and after a catalyst is adsorbed thereto, an electroless plating and electroplating plating are performed, is prepared (for example, Japanese Patent Application Laid-Open (JP-A No. 2005-54357). The laminate does not require a special adhesive layer, and does not particularly require the surface-roughening treatment of the polyimide film by virtue of the plasma treatment and silane coupling processing, and has the metal film excellent in adhesiveness with the polyimide film, but a large-sized apparatus for the plasma treatment and the like is required.

As a method of forming a metal pattern excellent in the insulation reliability among wirings, a method of hydrophobicizing with a plating pretreatment after a plating receptive layer is formed using a graft polymer is disclosed (for example, refer to JP-A No. 2006-237400). However, in this method, since a primer layer or a graft layer is formed by a coating method, a pattern coating such as an inkjet method or a printing method is required when it is desired to form a pattern in part, is required, and a high definition pattern formation is difficult. On the other hand, the method in which a plating receptive layer formed by a transfer method is used for a primer layer, is also disclosed (for example, refer to JP-A No. 2007-125862). However, in order to form a layer on a hydrophobic surface with the use of a transfer method, it is necessarily required that both a primer layer and an adhesion auxiliary layer (graft layer) are laminated, and, there is a fear that an additional process, in which the primer layer is transferred to the hydrophobic layer in an extra process, is required. Further, the plating receptive graft layer used here is composed of a hydrophilic polymer, the adhesiveness between the primer layer and the adhesive auxiliary layer prior to the transfer is poor, and there are problems such that the primer layer tends to be insufficiently transferred.

Moreover, a method of forming a pattern and forming a metal film using a transfer film has been known for many years, and, for example, the method in which a metal film formed by a vapor deposition process and the like are transferred to the surface of a board is generally used (for example, refer to JP-A No. 2004-243752), and in the transfer of the metal film, unevenness caused by the transfer tends to arise and the method is not suitable for a high definition wiring.

SUMMARY

The present invention has been made in view of the above circumstances and provides a multilayer film for plating, a method of manufacturing a metal film-coated material and a metal film-coated material. A first aspect of the invention provides a multilayer film for plating comprising, on a surface of a first substrate, a plating receptive layer which contains a polymer having a polymerizable group and a functional group that interacts with a plating catalyst or a plating catalyst precursor, or which contains a polymer precursor capable of forming a polymer having a polymerizable group and a functional group that interacts with a plating catalyst or a plating catalyst precursor, wherein the plating receptive layer on the first substrate is transferable to a second substrate to form the plating receptive layer on the second substrate, and the plating receptive layer satisfies at least one of the following (1)-(4):
(1) the saturated water absorption ratio of the plating receptive layer is from 0.01% by mass to 10% by mass in an environment of a temperature of 25° C. and relative humidity of 50%;
(2) the saturated water absorption ratio of the plating receptive layer is from 0.05 % by mass to 20% by mass in an environment of a temperature of 25° C. and relative humidity of 95%;
(3) the water absorption ratio of the plating receptive layer is from 0. 1% by mass to 30% by mass after immersion of the plating receptive layer in boiling water at 100° C. for one hour; and
(4) the surface contact angle of distilled water is from 50° to 150° after 5 µl of the distilled water is dropped onto the plating receptive layer and allowed to stand for 15 seconds in an environment of a temperature of 25° C. and relative humidity of 50%.

DETAILED DESCRIPTION OF THE INVENTION

Hereinafter, the invention is described in detail.
<Multilayer Film for Plating>
The multilayer film for plating comprising, on a surface of a first substrate, a plating receptive layer which contains a polymer having a polymerizable group and a functional group that interacts with a plating catalyst or a plating catalyst precursor, or which contains a polymer precursor capable of forming a polymer having a polymerizable group and a functional group that interacts with a plating catalyst or a plating catalyst precursor, wherein the plating receptive layer on the first substrate is transferable to a second substrate to form the plating receptive layer on the second substrate, and the plating receptive layer satisfies at least one of the following (1)-(4):
(1) the saturated water absorption ratio of the plating receptive layer is from 0.01% by mass to 10% by mass in an environment of a temperature of 25° C. and relative humidity of 50%;
(2) the saturated water absorption ratio of the plating receptive layer is from 0.05 % by mass to 20% by mass in an environment of a temperature of 25° C. and relative humidity of 95%;
(3) the water absorption ratio of the plating receptive layer is from 0. 1% by mass to 30% by mass after immersion of the plating receptive layer in boiling water at 100° C. for one hour; and
(4) the surface contact angle of distilled water is from 50° to 150° after 5 µl of the distilled water is dropped onto the plating receptive layer and allowed to stand for 15 seconds in an environment of a temperature of 25° C. and relative humidity of 50%.

In this multilayer film for plating, a polymer having a polymerizable group and a functional group which is capable of interacting with a plating catalyst, or a plating catalyst precursor contained in a film, or a film on which polymer precursor capable of forming a polymer having a polymerizable group and a functional group which is capable of interacting with a plating catalyst or a plating catalyst presursor is adsorbed may be used. In such an embodiment, the plating receptive layer containing a plating catalyst or a plating catalyst precursor may be formed on any substrate, and the substrate having such a plating receptive layer in situ can be subjected to a plating process.

As the constitutions of the multilayer film for plating of the invention, a multilayer having a plating receptive layer on one surface of a resin film, and optionally a protective layer is adhered to the surface of the plating receptive layer; and a multilayer having a plating receptive layer on one surface of a resin film and an adhesion auxiliary layer on this surface of the plating receptive layer for further enhancing the adhesiveness of the plating receptive layer to a substrate, which will be described later, to be formed by transfer, and optionally a protective layer is adhered to the surface of the adhesion auxiliary layer, may be exemplified.

Hereinafter, these constitutions will be described in sequence.

(Resin Film)

The substrate (resin film) used for the multilayer film of the invention, after the plating receptive layer formed on the surface of the substrate is temporarily adhered to any substrate formed by forming a glass epoxy, a polyester, a polyimide, a thermosetting polyphenylene ether, a polyamid, a polyaramid, paper and a liquid crystal polymer, in a film-like shape, which are generally used for an electronic board, the substrate is peeled off, so that the resin film is not specifically restricted, but may be any film usually used as a temporary support including a polyolefin such as polyethylene, polypropylene and polyvinyl chloride; resin sheets including a polyester such as polyethylene terephthalate; polyamide, polyimide and polycarbonate; and a sheet with a controlled surface adhesive property such as a releasing paper formed by laminating a resin sheet, may be used.

In particular, from the viewpoint of the smoothness, flexibility, heat-resistance and releasability, polyethylene, polypropylene, polyester, polyimide, polyvinyl chloride, polyvinylidene chloride and polytetrafluoroethylene are desirable.

The thickness of the resin film is generally from 2 µm to 200 µm, but preferably 5 µm to 50 µm, and more preferably 10 µm to 30 µm. When the resin film is too thick, there may be problems in handling property in the case of transferring with the use of the multilayer film for plating in practice.

In addition, the surface of the resin film may be subjected to a releasing treatment in addition to a matting treatment and a corona treatment.

Further, when the width of the resin film to be formed is set to about 5 mm wider than the width of the plating receptive layer, the adhesion of the resin at the laminating can be prevented in the case of laminating the plating receptive layer to the substrate, and an advantage that removal of the temporary support becomes easy, can be obtained.

In the substrate, the surface of the substrate on which the plating receptive layer is formed, which will be described later, has preferably a surface roughness Rz of 5 µm or less and more preferably Rz of 1 µm or less measured by the ten point average height method in accordance with JIS B 0601 (1994) from the viewpoint of improving the physical properties of the metal film to be formed. If the surface smoothness of a substrate is within the above range, namely, in a state of high smoothness, the substrate can be favorably used when a printed circuit board having an extremely fine circuit (for example, a circuit pattern with a value of line/space of 25/25 µm or less) is manufactured.

(Plating Receptive Layer)

A polymer having a polymerizable group and a functional group which is capable of interacting with a plating catalyst or a plating catalyst precursor, or a precursor capable of forming a polymer having a polymerizable group and a functional group which is capable of interacting with a plating catalyst or a plating catalyst precursor is contained in the plating receptive layer in the invention. The compound contains a reactive functional group (in the invention, referred to as a polymerizable group) which interacts with an adhesion auxiliary layer, which will be described later, when the compound is adjacently arranged to the adhesion auxiliary layer, and is capable of forming a chemical bond with active centers generated at the time of application of energy.

Here, the plating receptive layer is formed by containing a monomer, an oligomer or a polymer (hereinafter, may be referred to as "specific polymerizable compound", as occasion demands), which can combine with the substrate, which will be described later, by applying energy ray, and has adsorptivity to a plating catalyst or metal ions as a plating catalyst precursor. Accordingly, after the substrate is brought into contact with the plating receptive layer, the substrate is irradiated with energy ray, a chemical interaction between the substrate and the plating receptive layer is formed, so that the substrate and the plating receptive layer are adhered to each other firmly.

In particular, when the substrate or the adhesion auxiliary layer, which will be described later, can generate active centers capable of interacting with a specific polymerizable compound, or when the adhesion auxiliary layer, which will be described later, is being formed, the active centers are generated upon being irradiated with actinic ray, and from the active centers as initiation points, the reaction of a polymer having a polymerizable group and a functional group capable of interacting with a plating catalyst or a plating catalyst precursor, or precursor of such polymer, such as a monomer, oligomer or polymer,(specific polymerizable compound) is spread, so that the plating receptive layer chemically bonded to the substrate or the adhesion auxiliary layer can be formed.

(Surface Graft)

In the invention, when the plating receptive layer is formed by chemically bonding to the substrate or the adhesion auxiliary layer, it is desirable to use a process generally called surface graft polymerization.

The graft polymerization is a method of synthesizing a graft polymer by providing an active species on a polymer compound chain, and further polymerizing another monomer, which initiate polymerization by the active species to form a graft (graftage) polymer. In particularly, in the case where a polymer compound providing an active species forms a solid surface, the method is referred to as surface graft polymerization.

As the surface graft polymerization method applicable to the invention, all of the known methods described in literatures may be used. For example, a photograft polymerization method and a plasma-induced graft polymerization method are described as the surface graft polymerization method, in New Polymer Experimentology, Vol. 10, edited by the Society of Polymer Science, Japan, published by Kyoritsu Shuppan Co., Ltd., pp. 135 (1994).

Furthermore, a radiation-induced graft polymerization method using γ-ray, electron beam or the like are described in Handbook of Adsorption Technology, NTS Co., Ltd., reviewed by Takeuchi, published in February 1999, pp. 203 and pp. 695.

Specific examples of the photograft polymerization method include the methods described in JP-A Nos. 63-92658, 10-296895 and 11-119413.

When a resin film having metal ion adsorptivity such as plating receptive layer formed by chemically bonding to the substrate or the adhesion auxiliary layer is formed, in addition to the above-described surface graft methods, the method in which a functional group such as an oxetane group, an epoxy group and a group containing an active hydrogen, and a reactive functional group such as a trialkoxysilyl group, an isocyanate group, an amino group, a hydroxyl group and a carboxyl group are applied to the ends of a polymer compound chain, and these functional groups are bonded to functional groups present on the surface of a substrate by a coupling reaction, may also be applied.

Among these methods, it is preferable to form a resin film by a photograft polymerization method, particularly from the viewpoint of producing more polymers to be chemically bonded to the substrate and the adhesion auxiliary layer.

In the invention, after this specific polymerizable compound is brought into contact with a substrate (or an adhesion auxiliary layer), the method in which a resin formed by polymerizing the specific polymerizable compound is directly chemically bonding to the substrate (or the adhesion auxiliary layer) by applying energy ray, is preferable.

Although the above contact may be performed by immersing the substrate or the substrate formed an adhesion auxiliary layer thereon in a liquid composition containing the specific polymerizable compound, from the viewpoint of handling property or production efficiency, a coating film or a layer containing the specific polymerizable compound as a main component may be formed by being coated on the substrate (or the adhesion auxiliary layer) or the substrate having the adhesion auxiliary layer thereon, as described later.

Here, a monomer, oligomer, or polymer (hereinafter, may be referred to as a "specific polymerizable compound" as occasion demands) which are polymerized with energy ray, and has metal ion adsorptivity will be explained.

This specific polymerizable compound is polymerized with energy ray, and has preferably functional groups including radically polymerizable unsaturated double bonds in the molecule or the following reactive functional groups in order to combine the specific polymerizable compounds together, or combine the specific polymerizable compound with the substrate (or a polymerization initiation layer or an adhesion auxiliary layer on the surface of the substrate). Hereinafter, the functional groups including radically polymerizable unsaturated double bonds in the molecule or the following reactive functional groups may be generally referred to as a "polymerizable group".

The functional group containing a radically polymerizable unsaturated double bond includes a vinyl group, a vinyloxy group, an allyl group, an acryloyl group, a methacryloyl group, and the like. Among them, an acryloyl group and a methacryloyl group have high reactivity, and good result can be obtained.

Further, the specific polymerizable compound may have a reactive functional group other than the functional group including a radically polymerizable unsaturated double bond, and more specifically the reactive functional group includes an oxetane group, an epoxy group, an isocyanate group, a functional group containing an active hydrogen, an active group in an azo compound, and a functional group which reacts by using a crosslinking agent in combination.

Furthermore, the specific polymerizable compound in the invention has sites which undergo an interaction with a plating catalyst or a plating catalyst precursor. The sites which undergo the interaction includes a non-dissociable functional group (functional group which does not generate a proton due to dissociation), such as a polar group (hydrophilic group), a group capable of forming a multidentat, a nitrogen-containing functional group, a sulfur-containing functional group and a oxygen-containing functional group. In particular, in order to reduce the water absorptivity or the hygroscopicity of the resin film formed in this process, it is desirable to use the non-dissociative functional group as the sites which exhibit metal ion adsorptivity.

The polar groups include a functional group having a positive charge such as an ammonium and a phosphonium; or an acidic group having a negative charge or dissociable to a negative charge such as a sulfonic acid group, a carboxyl group, a phosphoric acid group and a phosphonic acid group. These groups adsorb metal ions in the form of the counter ions of the dissociable groups.

Further, for example, nonionic polar groups such as a hydroxyl group, an amide group, a sulfonamide group, an alkoxy group and a cyano group may also be used.

In addition, an imino group, a primary or secondary amino group, an amide group, a urethane group, a hydroxyl group (phenol is also included), a thiol group and the like may also be used.

Moreover, examples of the non-dissociable functional groups include a group capable of forming a multidentat, a nitrogen-containing functional group, a sulfur-containing functional group, an oxygen-containing functional group and the like, and in particular, nitrogen-containing functional groups such as an imide group, a pyridine group, a tertiary amino group, an ammonium group, a pyrrolidone group, an amidino group, a group containing a triazine ring structure, a group containing an isocyanuric structure, a nitro group, a nitroso group, an azo group, a diazo group, an azide group, a cyano group and a cyanate (R—O—CN) group; oxygen-containing functional groups such as an ether group, a carbonyl group, an ester group, a group containing an N-oxide structure, a group containing an S-oxide structure and a group containing an N-hydroxy structure; sulfur-containing functional groups such as a thioether group, a thioxy group, a sulfoxide group, a sulfone group, a sulfite group, a group containing a sulfoximine structure, a group containing a sulfoxonium structure and a group containing a sulfonic ester structure; phosphorus-containing functional groups such as a phosphine group; a group containing a halogen atom such as chlorine or bromine; unsaturated ethylene groups; and the like. In an exemplary embodiment showing non-dissociability in relation to adjacent atoms or atomic groups, an imidazole group, a urea group or a thiourea group may also be used.

Among them, an ether group (more specifically, a structure represented by —O—$(CH_2)_n$—O— (wherein n is an integer from 1 to 5)) or a cyano group is particularly preferable from the viewpoint of having high polarity and high adsorptivity to a plating catalyst or the like, and a cyano group can be exemplified as the most preferable group.

Moreover, as a non-dissociable functional group in the invention, an alkylcyano group is still more desirable. Although the electron in an aromatic cyano group is attracted by the aromatic ring, and the unpaired electron-donating property, which is important as the adsorptivity to the plating catalyst and the like, tends to lower, because the alkylcyano group does not bond to the aromatic ring, the alkylcyano group is preferable in view of the adsorptivity to the plating catalyst and the like.

In the invention, the specific polymerizable compound may be any form of a monomer, a macro monomer, an oligomer and a polymer, and among them, it is desirable to use a polymer since the specific polymerizable compound has preferably a high molecular weight to a certain degree beforehand, from the viewpoint of forming the resin film after polymerization with a certain high order structure stably.

Examples of the monomer having a polar group and a polymerizable group as one of the specific polymerizable compounds, include, for example, monomers having functional groups such as a carboxyl group, a sulfonic acid group, a phosphoric group, an amino group or salts thereof, a hydroxyl group, an amide group, a phosphine group, an imidazole group, pyridine groups or salts thereof, and an ether group; such as (meth)acrylic acid or an alkali metal salt and an amine salt thereof, itaconic acid or an alkali metal salt and an amine salt thereof, 2-hydroxyethyl (meth)acrylate, (meth)acrylamide, N-monomethylol (meth)acrylamide, N-dimethylol (meth) acrylamide, allylamine or a halide salt thereof, 3-vinyl propionic acid or an alkali metal salt and an amine salt thereof, vinyl sulfonic acid or an alkali metal salt and an amine salt thereof, 2-sulfoethyl (meth)acrylate, polyoxyethylene glycol mono(meth)acrylate, 2-acrylamide 2-methyl propanesulfonic acid, acid phosphoxy polyoxyethylene glycol mono(meth)acrylate, N-vinyl pyrrolidone, and the like. The monomers may be used alone, or may also be used in combination of two or more kinds.

Further, as the polymer having the polar group and the polymerizable group which are one of the specific polymerizable compounds, a polymer formed by introducing an ethylene addition-polymerizable unsaturated group (polymerizable group) such as a vinyl group, an allyl group and an acryl (meth) group as a polymerizable group to a homopolymer or a copolymer obtained by the use of at least one kind selected from monomers having a polar group and a polymerizable group is preferably used. The polymer having the polar group and the polymerizable group is the polymer having the polymerizable group at least at the terminal end or the side-chain, and the polymer having the polymerizable group at the terminal end is desirable, and in particular, the polymer having the polymerizable group at the terminal end and the side-chain is still more desirable.

In the polymer having the polar group and the polymerizable group, the unit derived from a monomer having the polar group and the polymerizable group is preferably contained in the range of from 50% by mole to 95% by mole, and more preferably contained in the range of from 60% by mole to 90% by mole in the polymer, from the viewpoint of the adsorptivity of metal ions.

The polymer having the polar group and the polymerizable group can be synthesized by the following manner:

The synthetic methods include (i) a method of copolymerizing monomers having a polar group and monomers having a polymerizable group; (ii) a method of copolymerizing monomers having a polar group and monomers having a double bond precursor, subsequently introducing a double bond by treating with a base and the like; and (iii) a method of allowing monomers having a polar group to react with monomers having a polymerizable group to introduce double bonds (introducing polymerizable group). Desirable synthetic methods are (ii) a method of copolymerizing monomers having a polar group and monomers having a double bond precursor, subsequently introducing a double bond by treating with a base and the like; and (iii) a method of allowing monomers having a polar group to react with monomers having a polymerizable group to introduce polymerizable groups, from the viewpoint of synthetic suitability.

As a monomer having the polar group used for synthesizing the polymer having the polar group and the polymerizable group, a monomer similar to the monomer having the polar group in the above may be used. The monomer may be used alone, or may also be used in combination of two or more kinds.

Examples of monomers having the polymerizable group to be copolymerized with the monomers having the polar group, include an allyl(meth)acrylate, 2-allyloxyethyl methacrylate and the like. Further, examples of monomers having a double bond precursor include, 2-(3-chloro-1-oxopropoxy) ethylmethacrylate, 2-(3-bromo-1-oxopropoxy)ethylmethacrylate and the like.

Examples of the monomers having the polymerizable group used for introducing an unsaturated group utilizing the reaction of a functional group such as the carboxyl group, an amino groups or the salts thereof, a hydroxyl group and an epoxy group in the polymer having a polar group, include (meth)acrylic acid, a glycidyl(meth)acrylate, allylglycidyl ether, 2-isocyanatoethyl (meth)acrylate and the like.

Moreover, in the invention, a macro monomer can also be used as a specific polymerizable compound. As the method of producing a macro monomer used in the invention, various kinds of production methods are proposed, for example, by "Synthesis of Macro Monomer" in Chapter 2 in "Chemistry and Industry of Macro Monomer", (edited by Yuya Yamashita) published by IPC Publishing Office, Sep. 20, 1989. Examples of macro monomers particularly useful for the macro monomer having the polar group and the polymerizable group used in the exemplary embodiment, include macro monomers derived from a monomer containing a carboxyl group such as acrylic acid and methacrylic acid; sulfonic acid-based macro monomers derived from a monomer such as 2-acrylamide-2-methyl propane sulfonic acid, vinyl styrene sulfonic acid, and the salts thereof, amide macro monomers derived from a amide-based monomer such as (meth)acrylamide, N-vinyl acetamide, N-vinyl formamide and N-vinyl carboxylic amide; macro monomers derived from a monomer containing a hydroxyl group such as hydroxyethyl methacrylate, hydroxyethyl acrylate and glycerol monomethacrylate; and macro monomers derived from a monomer containing an alkoxy group or an ethyleneoxide group such as methoxyethyl acrylate, methoxy polyethylene glycol acrylate and polyethylene glycol acrylate. Further, monomers having a polyethylene glycol chain or a polypropylene glycol chain may also be useful as a macro monomer used in the invention.

The useful molecular weight of the macro monomers is in the range of from 250 to 100,000, and particularly desirably in the range of from 400 to 30,000.

Moreover, as the monomers having the non-dissociable functional group and the polymerizable group as one of the specific polymerizable compounds in the invention, the following monomers can specifically be used. The monomers may be used alone, or may also be used in combination of two or more kinds.

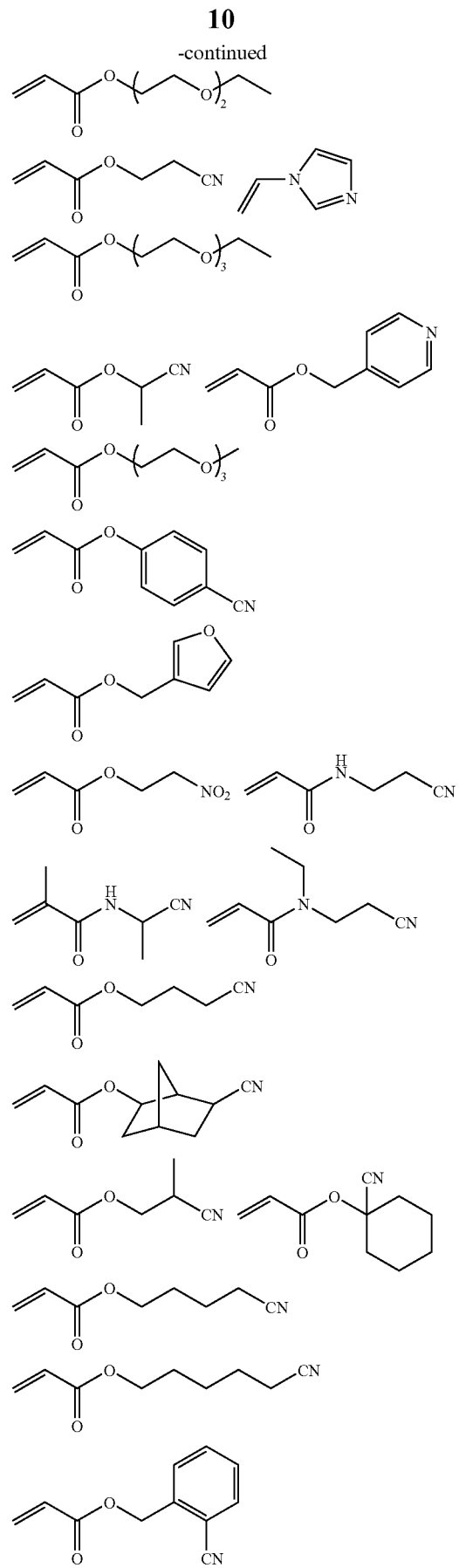

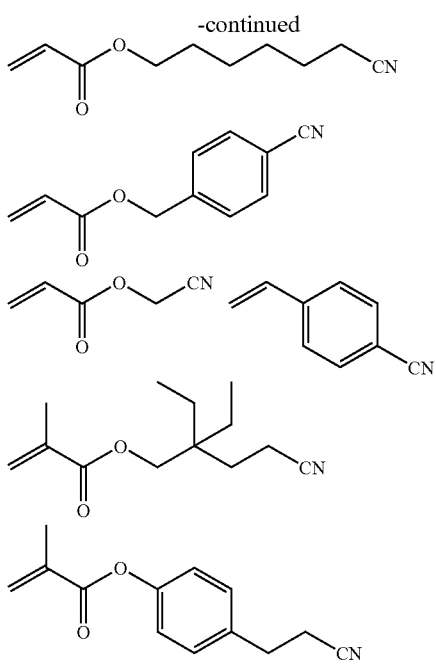

As the polymer having the non-dissociable functional group and the polymerizable group as one of the specific polymerizable compounds, a polymer obtained by introducing an ethylene addition polymerizable group (polymerizable group) such as a vinyl group, an allyl group and a (meth) acrylate group as a polymerizable group into a homopolymer or a copolymer obtained by the use of at least one selected from monomers having the non-dissociable functional group and the polymerizable group is preferably used. The polymer having the non-dissociable functional group and the polymerizable group is a polymer having a polymerizable group at least at the terminal end or the side-chain, and in particular, the polymer having a polymerizable group at the terminal end, and a polymer having a polymerizable group at the terminal end and the side-chain is still more desirable.

In the polymer having the non-dissociable functional group and the polymerizable group, the unit derived from a monomer having the non-dissociable functional group and the polymerizable group is preferably contained in the range of from 50% by mole to 95% by mole, and more preferably contained in the range of from 60% by mole to 90% by mole in the polymer, from the viewpoint of the adsorptivity of metal ions.

When a polymer having a polymerizable group and a non-dissociable functional group is obtained, monomers other than the monomer having the non-dissociable functional group and the polymerizable group may also be used, in order to lower the water absorptivity and to enhance the hydrophobicity. As the other monomers, common polymerizable monomers may be used, and diene-based monomers, acrylic monomers and the like may be exemplified.

Such a polymer having a non-dissociable functional group and a polymerizable group may be synthesized as follows.

The synthetic method includes (I) a method of copolymerizing a monomer having a non-dissociable functional group and a monomer having a polymerizable group; (II) a method of copolymerizing a monomer having a non-dissociable functional group and a monomer having a double bond precursor, and subsequently introducing a double bond thereto by treatment with a base or the like; and (III) a method of allowing a polymer having a non-dissociable functional group to react with a monomer having a polymerizable group, and introducing a double bond thereto (introducing a polymerizable group). From the viewpoint of synthesis suitability, (II) a method of copolymerizing a monomer having a non-dissociable functional group and a monomer having a double bond precursor, and subsequently introducing a double bond thereto by treatment with a base or the like; and (III) a method of allowing a polymer having the non-dissociable functional group to react with a monomer having a polymerizable group to introduce a polymerizable group, are preferable.

As the monomer having the non-dissociable functional group used in the synthesis of the polymer having the non-dissociable functional group and the polymerizable group, the monomers similar to the above monomers having the non-dissociable functional group may be used. The monomers may be used alone, or may also be used in combination of two or more kinds.

As the monomer having the polymerizable group which is copolymerized with monomer having the non-dissociable functional group, allyl (meth)acrylate, 2-allyloxyethyl methacrylate and the like may be exemplified.

Furthermore, as the monomer having a double bond precursor, 2-(3-chloro-1-oxopropoxy)ethylmethacrylate, 2-(3-bromo-1-oxopropoxy)ethylmethacrylate and the like may be exemplified.

Further, of the polymer having a non-dissociable functional group, examples of the monomers having a polymerizable group which is used to introduce an unsaturated group by using reaction with a functional group such as a carboxyl group, an amino group or a salt thereof, a hydroxyl group or an epoxy group, include (meth)acrylic acid, glycidyl (meth) acrylate, allyl glycidyl ether, 2-isocyanatoethyl (meth)acrylate and the like.

Hereinafter, specific examples of the polymer having the non-dissociable functional group and the polymerizable group, which is suitably used in the invention, will be described, but the invention is not intended to be limited thereto.

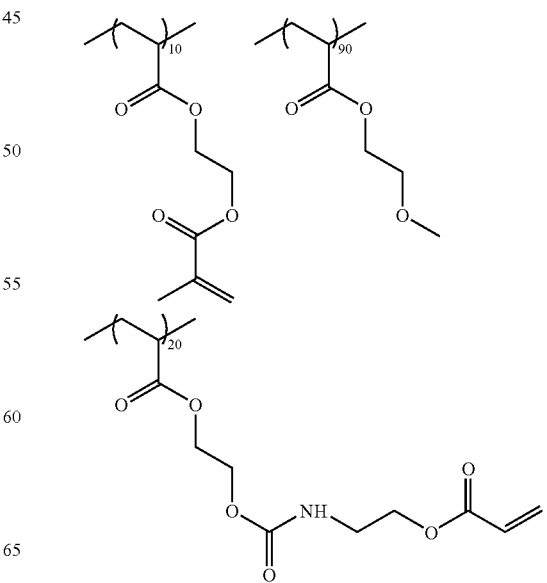

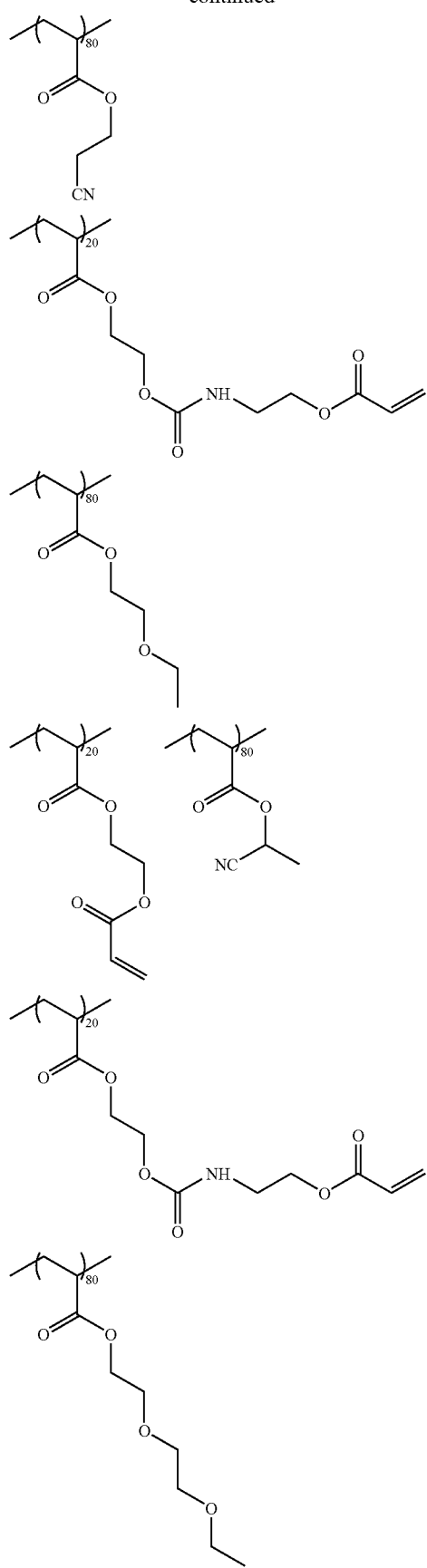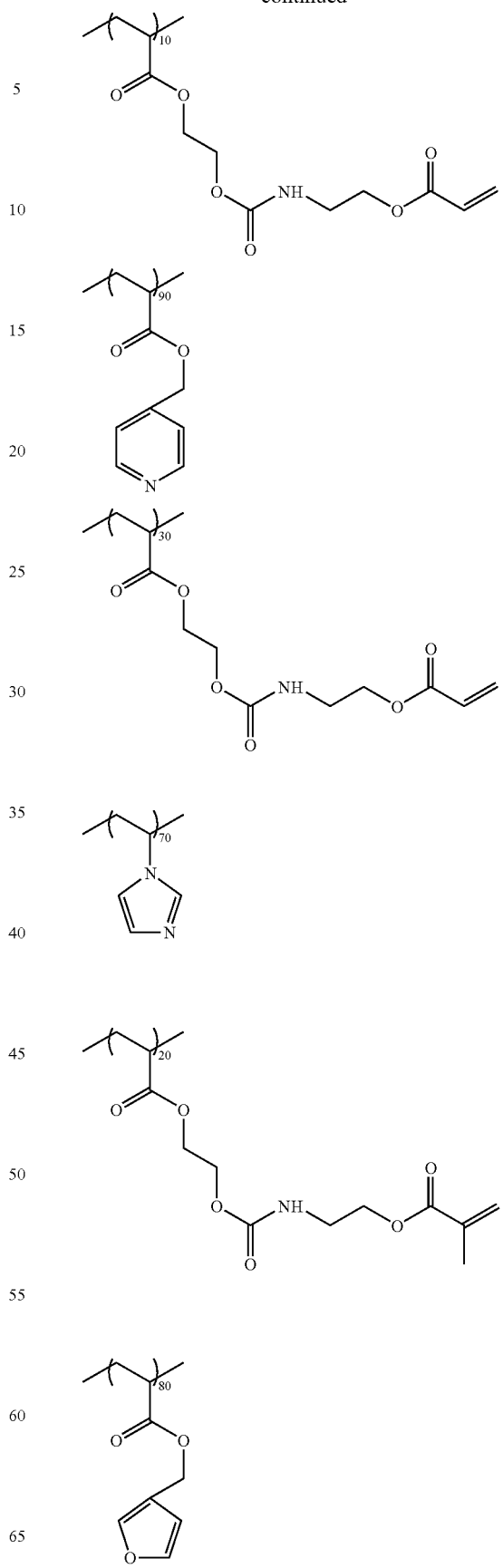

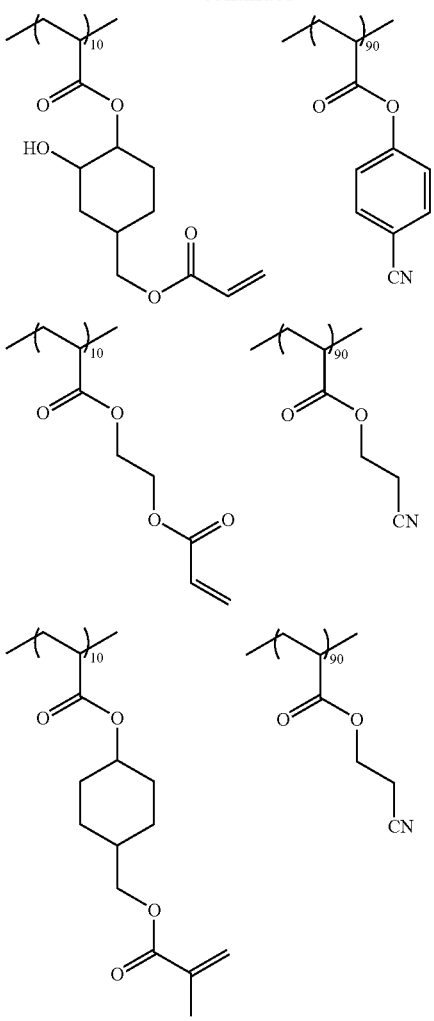

Next, a polymer having the most desirable cyano group and the polymerizable group (hereafter, may be referred to as "cyano group-containing polymerizable polymer", as occasion demands) as a specific polymerizable compound in the invention, is explained.

For example, the cyano group-containing polymerizable polymer in the invention is preferably a copolymer which contains a unit represented by the following formula (1) and a unit represented by the following formula (2):

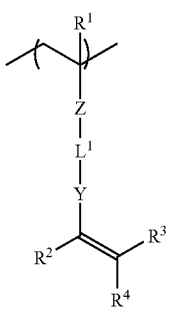

Formula (1)

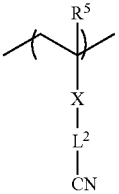

Formula (2)

In the formula (1) and formula (2), $R^1$ to $R^5$ each independently represent a hydrogen atom, or a substituted or unsubstituted alkyl group; X, Y and Z each independently represent a single bond, a substituted or unsubstituted divalent organic group, an ester group, an amide group or an ether group; and $L^1$ and $L^2$ each independently represent a substituted or unsubstituted divalent organic group.

In the case where $R^1$ to $R^5$ each represent a substituted or unsubstituted alkyl group, examples of the unsubstituted alkyl group include, a methyl group, an ethyl group, a propyl group or a butyl group, and examples of the substituted alkyl group include a methyl group, an ethyl group, a propyl group or a butyl group, which is substituted with a methoxy group, a hydroxyl group, a chlorine atom, a bromine atom, a fluorine atom or the like.

Here, $R^1$ is preferably a hydrogen atom, a methyl group, or a methyl group substituted with a hydroxyl group or a bromine atom.

$R^2$ is preferably a hydrogen atom, a methyl group, or a methyl group substituted with a hydroxyl group or a bromine atom.

$R^3$ is preferably a hydrogen atom.

$R^4$ is preferably a hydrogen atom.

$R^5$ is preferably a hydrogen atom, a methyl group, or a methyl group substituted with a hydroxyl group or a bromine atom.

In the case where X, Y and Z each represent a substituted or unsubstituted divalent organic group, examples of the divalent organic group include a substituted or unsubstituted aliphatic hydrocarbon group, and a substituted or unsubstituted aromatic hydrocarbon group.

Preferable examples of the substituted or unsubstituted aliphatic hydrocarbon group include a methylene group, an ethylene group, a propylene group, a butylene group, and groups formed by substituting these groups with a methoxy group, a hydroxyl group, a chlorine atom, a bromine atom, a fluorine atom or the like.

Preferable examples of the substituted or unsubstituted aromatic hydrocarbon group include an unsubstituted phenyl group and a phenyl group substituted with a methoxy group, a hydroxyl group, a chlorine atom, a bromine atom, a fluorine atom or the like.

Among them, —$(CH_2)_n$— (wherein n is an integer from 1 to 3) is preferable, and —$CH_2$— is more preferable.

$L^1$ is preferably a divalent organic group having a urethane bond or a urea bond, more preferably a divalent organic group having a urethane bond, and in particular, a group having a total carbon number of 1 to 9 is preferable. Here, the total number of carbon atoms of $L^1$ means the total number of carbon atoms contained in the substituted or unsubstituted divalent organic group represented by $L^1$.

More specifically, the structure of $L^1$ is preferably a structure represented by the following formula (1-1) or formula (1-2).

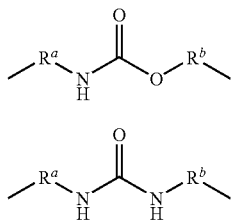

Formula (1-1)

Formula (1-2)

In the formula (1-1) and formula (1-2), $R^a$ and $R^b$ each independently represent a divalent organic group formed using two or more atoms selected from the group consisting of a carbon atom, a hydrogen atom and an oxygen atom, and preferable examples thereof include a methylene group, an ethylene group, a propylene group and a butylene group, an ethylene oxide group, a diethylene oxide group, a triethylene oxide group, a tetraethylene oxide group, a dipropylene oxide group, a tripropylene oxide group and a tetrapropylene oxide group, all of which may be substituted or unsubstituted,.

$L^2$ is preferably a linear, branched or cyclic alkylene group, an aromatic group, or a group resulting from a combination of these groups. The group combining an alkylene group and an aromatic group may further have an ether group, an ester group, an amide group, a urethane group or a urea group between the alkylene group and the aromatic group. Among them, $L^2$ is preferably a group having a total number of carbon atoms of 1 to 15, and particularly preferably an unsubstituted group. Here, the total number of carbon atoms of $L^2$ means the total number of carbon atoms contained in the substituted or unsubstituted divalent organic group represented by $L^2$.

Specific examples thereof include a methylene group, an ethylene group, a propylene group, a butylene group, a phenylene group, and groups formed by substituting these groups with a methoxy group, a hydroxyl group, a chlorine atom, a bromine atom, a fluorine atom or the like, and further groups formed by combining these groups.

As a preferable example of the cyano group-containing polymerizable polymer of the invention, a polymer, in which the unit represented by formula (1) is a unit represented by the following formula (3), is preferable.

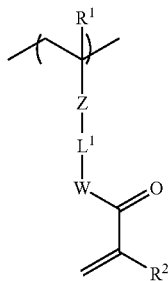

Formula (3)

In the formula (3), $R^1$ and $R^2$ each independently represent a hydrogen atom, or a substituted or unsubstituted alkyl group; Z represents a single bond, a substituted or unsubstituted divalent organic group, an ester group, an amide group, or an ether group; W represents an oxygen atom, or NR (wherein R represents a hydrogen atom or an alkyl group, and is preferably a hydrogen atom or an unsubstituted alkyl group having 1 to 5 carbon atoms); and $L^1$ represents a substituted or unsubstituted divalent organic group.

$R^1$ and $R^2$ in the formula (3) are synonymous with $R^1$ and $R^2$ in the formula (1), and the preferable examples thereof are also synonymous with those of $R^1$ and $R^2$ in the formula (1).

Z in the formula (3) is synonymous with Z in the formula (1), and the preferable examples thereof are also synonymous with those of Z in the formula (1).

$L^1$ in the formula (3) is synonymous with $L^1$ in the formula (1), and the preferable examples thereof are also synonymous with $L^1$ in the formula (1).

As the cyano group-containing polymerizable polymer of the invention, a polymer in which the unit represented by formula (3) is a unit represented by the following formula (4) is preferable.

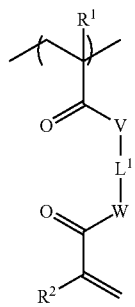

Formula (4)

In the formula (4), $R^1$ and $R^2$ each independently represent a hydrogen atom, or a substituted or unsubstituted alkyl group; V and W each independently represent an oxygen atom, or NR (wherein R represents a hydrogen atom or an alkyl group, and is preferably a hydrogen atom or an unsubstituted alkyl group having 1 to 5 carbon atoms); and $L^1$ represents a substituted or unsubstituted divalent organic group.

$R^1$ and $R^2$ in the formula (4) are synonymous with $R^1$ and $R^2$ in the formula (1), and the preferable examples thereof are also synonymous with $R^1$ and $R^2$ in the formula (1).

$L^1$ in the formula (4) is synonymous with $L^1$ in the formula (1), and the preferable examples thereof are also synonymous with $L^1$ in the formula (1).

In the formula (3) and formula (4), W is preferably an oxygen atom.

In the formula (3) and formula (4), $L^1$ is preferably an unsubstituted alkylene group, or a divalent organic group having a urethane bond or a urea bond, more preferably a divalent organic group having a urethane bond, and among them, a group having a total carbon number of 1 to 9 is particularly preferable.

As the cyano group-containing polymerizable polymer of the invention, a polymer in which the unit represented by formula (2) in the above is a unit represented by the following formula (5) is preferable.

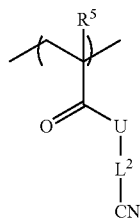

Formula (5)

In the formula (5), $R^5$ represents a hydrogen atom, or a substituted or unsubstituted alkyl group; U represents an oxygen atom, or NR' (wherein R' represents a hydrogen atom or an alkyl group, and is preferably a hydrogen atom or an unsubstituted alkyl group having 1 to 5 carbon atoms); and $L^2$ represents a substituted or unsubstituted divalent organic group.

$R^5$ in the formula (5) is synonymous with $R^1$ and $R^2$ in the formula (1), and is preferably a hydrogen atom.

$L^2$ in the formula (5) is synonymous with $L^2$ in the formula (1), and is preferably a linear, branched or cyclic alkylene group, an aromatic group, or a group resulting from a combination of these groups.

Particularly, in the formula (5), a structure in which the linking site to the cyano group in $L^2$ is a divalent organic group having a linear, branched or cyclic alkylene group is preferable, and in particular, a structure in which the divalent organic group has a total carbon number of 1 to 10 is more preferable.

In another preferable exemplary embodiment, a structure in which the linking site to the cyano group in $L^2$ in the formula (5) is a divalent organic group having an aromatic group is preferable, and in particular, a structure in which the divalent organic group has a total carbon number of 6 to 15 is more preferable.

The cyano group-containing polymerizable polymer of the invention is constituted to include the units represented by formula (1) to formula (5), and is a polymer having the polymerizable group and the cyano group at the side chain.

This cyano group-containing polymerizable polymer may be synthesized, for example, as follows.

As the type of the polymerization reaction usable in the synthesis of the cyano group-containing polymerizable polymer of the invention, radical polymerization, cationic polymerization and anionic polymerization may be exemplified. From the viewpoint of the reaction control, it is preferable to use the radical polymerization or cationic polymerization.

The methods of synthesizing the cyano group-containing polymerizable polymer of the invention vary according to the situation, namely; (1) in the case where the mode of polymerization for forming the polymer main chain is different from the mode of polymerization of the polymerizable group to be introduced into the side chain, and (2) in the case where the mode of polymerization for forming the polymer main chain is identical to the mode of polymerization of the polymerizable group to be introduced into the side chain.

(1) The case where the mode of polymerization for forming polymer main chain is different from the mode of polymerization of polymerizable group to be introduced into side chain;

(1-1) the mode where the formation of the polymer main chain is performed by cationic polymerization, and the polymerization of the polymerizable group to be introduced into the side chain is radical polymerization, and (1-2) the mode where the formation of the polymer main chain is performed by radical polymerization, and the polymerization of the polymerizable group to be introduced into the side chain is cationic polymerization.

(1-1) The case where the formation of polymer main chain is performed by cationic polymerization, and the polymerization of polymerizable group to be introduced into side chain is radical polymerization;

in the invention, as the monomer which may be used in the mode where the formation of the polymer main chain is performed by cationic polymerization, and the polymerization of the polymerizable group to be introduced into the side chain is radical polymerization, the following compounds may be exemplified.

Monomer Used for Forming Polymerizable Group-Containing Unit

Example of monomers which may be used in the formation of the polymerizable group-containing unit used in the present exemplary embodiment, include vinyl (meth)acrylate, allyl (meth)acrylate, 4-(meth)acryloylbutane vinyl ether, 2-(meth)acryloylethane vinyl ether, 3-(meth)acryloylpropane vinyl ether, (meth)acryloyloxydiethylene glycol vinyl ether, (meth)acryloyloxytriethylene glycol vinyl ether, (meth)acryloyl 1st terpineol, 1-(meth)acryloyloxy-2-methyl-2-propene, 1-(meth)acryloyloxy-3-methyl-3-butene, 3-methylene-2-(meth)acryloyloxy-norbornane, 4,4'-ethylidenediphenol di(meth)acrylate, methacrolein di(meth)acryloylacetal, p-((meth)acryloylmethyl)styrene, allyl (meth)acrylate, vinyl 2-(bromomethyl)acrylate, allyl 2-(hydroxymethyl)acrylate and the like.

Monomer Used for Forming Cyano Group-Containing Unit

Examples of monomers which may be used in the formation of the cyano group-containing unit used in the present exemplary embodiment, include 2-cyanoethyl vinyl ether, cyanomethyl vinyl ether, 3-cyanopropyl vinyl ether, 4-cyanobutyl vinyl ether, 1-(p-cyanophenoxy)-2-vinyloxyethane, 1-(o-cyanophenoxy)-2-vinyloxy-ethane, 1-(m-cyanophenoxy)-2-vinyloxy-ethane, 1-(p-cyanophenoxy)-3-vinyloxy-propane, 1-(p-cyanophenoxy)-4-vinyloxy-butane, o-cyanobenzyl vinyl ether, m-cyanobenzyl vinyl ether, p-cyanobenzyl vinyl ether, allyl cyanide and allylcyano acetate. Furthermore, the following compounds may be exemplified.

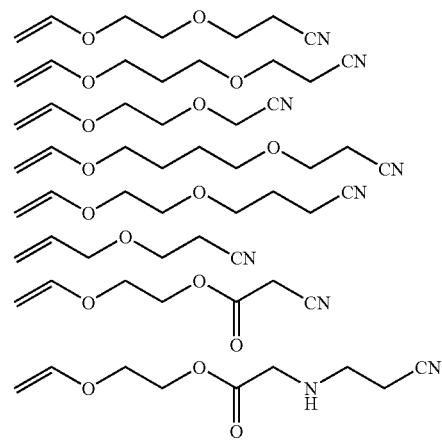

As for the polymerization method, the methods recited in Lectures on Experimental Chemistry, "Polymer Chemistry," Chapter 2-4 (pp. 74), or the general cationic polymerization methods recited in "Experimental Methods in Polymer Synthesis," written by Takayuki Otsu, Chapter 7 (pp. 195), may be used. In addition, examples of the initiator that may be used in the cationic polymerization include protonic acids, metal halides, organic metal compounds, organic salts, metal oxides, solid acids and halogens. Among them, metal halides and organic metal compounds are preferable as highly active initiators capable of synthesizing high molecular weight polymers.

Specific examples include boron trifluoride, boron trichloride, aluminum chloride, aluminum bromide, titanium tetrachloride, tin tetrachloride, tin bromide, phosphorus pentafluoride, antimony chloride, molybdenum chloride, tungsten chloride, iron chloride, dichloroethyl aluminum, chlorodiethyl aluminum, dichloromethyl aluminum, chlorodimethyl aluminum, trimethyl aluminum, trimethylzinc and methyl Grignard reagents.

(1-2) The case where the formation of polymer main chain is performed by radical polymerization, and the mode of the polymerization of polymerizable group to be introduced into the side chain is cationic polymerization;

in the invention, as the monomer which may be used in the mode where the formation of the polymer main chain is performed by radical polymerization, and the polymerization of the polymerizable group to be introduced into the side chain is cationic polymerization, the following compounds may be exemplified.

Monomer Used Forming Polymerizable Group-Containing Unit

The same monomers as the monomers used for forming the polymerizable group-containing unit recited in the above mode (1-1), may be used.

Monomers Used for Forming Cyano Group-Containing Unit

Examples of the monomer used for forming the cyano group-containing unit used in this exemplary embodiment, include cyanomethyl (meth)acrylate, 2-cyanoethyl (meth)acrylate, 3-cyanopropyl (meth)acrylate, 2-cyanopropyl (meth)acrylate, 1-cyanoethyl (meth)acrylate, 4-cyanobutyl (meth)acrylate, 5-cyanopentyl (meth)acrylate, 6-cyanohexyl (meth)acrylate, 7-cyanoheptyl (meth)acrylate, 8-cyanooctyl (meth)acrylate, 2-cyanoethyl (2-(bromomethyl)acrylate), 2-cyanoethyl (2-(hydroxymethyl)acrylate), p-cyanophenyl (meth)acrylate, o-cyanophenyl (meth)acrylate, m-cyanophenyl (meth)acrylate, 5-(meth)acryloyl-2-carbonitrilo-norbornene, 6-(meth)acryloyl-2-carbonitrilo-norbornene, 1-cyano-1-(meth)acryloyl-cyclohexane, 1,1-dimethyl-1-cyanomethyl-(meth)acrylate, 1-methyl-1-ethyl-1-cyanomethyl-(meth)acrylate, o-cyanobenzyl (meth)acrylate, m-cyanobenzyl (meth)acrylate, p-cyanobenzyl (meth)acrylate, 1-cyanocycloheptyl acrylate, 2-cyanophenyl acrylate, 3-cyanophenyl acrylate, vinyl cyanoacetate, vinyl 1-cyano-1-cyclopropanecarboxylate, allyl cyanoacetate, allyl 1-cyano-1-cyclopropanecarboxylate, N,N-dicyanomethyl (meth)acrylamide, N-cyanophenyl (meth)acrylamide, allyl cyanomethyl ether, allyl-o-cyanoethyl ether, allyl-m-cyanobenzyl ether, allyl-p-cyanobenzyl ether and the like.

Furthermore, the monomers having a structure in which a part of hydrogen atoms of the above monomers is substituted with a hydroxyl group, an alkoxy group, a halogen atom, a cyano group or the like, may also be used.

As for the polymerization method, the methods recited in Lectures on Experimental Chemistry, "Polymer Chemistry," Chapter 2-2 (pp. 34), or the general radical polymerization methods recited in "Experimental Methods in Polymer Synthesis," written by Takayuki Otsu, Chapter 5 (p. 125), may be used. In addition, as for the initiator for radical polymerization, it has been known that there are high temperature initiators which require heating to temperatures of 100° C. or higher, common initiators which initiate by heating at temperatures of 40° C. to 100° C., redox initiators which initiate at very low temperatures and the like. However, from the viewpoint of the stability of the initiator and the easiness of handling of the polymerization reaction, common initiators are preferable.

Examples of the common initiators include benzoyl peroxide, lauroyl peroxide, peroxodisulfate, azobisisobutyronitrile and azobis-2,4-dimethylvaleronitrile.

(2) The case where the mode of the polymerization for forming polymer main chain is identical to the mode of the polymerization of polymerizable group to be introduced into side chain;

the case where the mode of polymerization for forming the polymer main chain is identical to the mode of the polymerization of the polymerizable group to be introduced into the side chain includes (2-1) a case in which both the modes are cationic polymerization and (2-2) a case in which both the modes are radical polymerization.

(2-1) The case in which both the modes are cationic polymerization

In the case in which both modes are cationic polymerization, the same monomers as the monomers are used for forming the cyano group-containing unit recited in the above case (1-1) may be used as the monomer having a cyano group.

From the viewpoint of preventing gelation during the polymerization, it is preferable to use a method of synthesizing the polymer having the cyano group beforehand, and thereafter, allowing the polymer to react with a compound having the polymerizable group which is capable of cationic polymerization (hereinafter, may be referred to as a "reactive compound", as occasion demands), to introduce the polymerizable group which is capable of cationic polymerization into the side chain.

It is also preferred that the polymer having a cyano group has a reactive group as recited below, for the reaction with the reactive compound.

Further, it is preferred that the polymer having a cyano group and the reactive compound is appropriately selected so as to obtain the combination of functional groups as recited below.

Specific examples of the combination include (reactive group of polymer, functional group of reactive compound)= (carboxyl group, carboxyl group), (carboxyl group, epoxy group), (carboxyl group, isocyanate group), (carboxyl group, benzyl halide), (hydroxyl group, carboxyl group), (hydroxyl group, epoxy group), (hydroxyl group, isocyanate group), (hydroxyl group, benzyl halide), (isocyanate group, hydroxyl group), (isocyanate group, carboxyl group), and the like.

Here, specific examples of the reactive compound include allyl alcohol, 4-hydroxybutane vinyl ether, 2-hydroxyethane vinyl ether, 3-hydroxypropane vinyl ether, hydroxytriethylene glycol vinyl ether, 1st terpineol, 2-methyl-2-propenol, 3-methyl-3-butenol, 3-methylene-2-hydroxynorbornane and p-(chloromethyl)styrene.

(2-2) The case in which both the modes are radical polymerization

The case in which both modes are cationic polymerization, as the synthetic method includes (i) a method of copolymerizing a monomer having a cyano group and a monomer having a polymerizable group, (ii) a method of copolymerizing a monomer having a cyano group and a monomer having a double bond precursor, and thereafter, introducing a double bond by treatment with a base or the like, and (iii) a method of allowing a polymer having a cyano group to react with a monomer having a polymerizable group to introduce a double bond (introducing a polymerizable group). From the viewpoint of synthesis suitability, (ii) a method of copolymerizing the monomer having a cyano group and the monomer having a double bond precursor, and, thereafter, introducing a double bond by treatment with a base or the like; and (iii) a method of allowing the polymer having a cyano group to react with a monomer having a polymerizable group to introduce the polymerizable group, are preferable.

As the monomer having a polymerizable group that is used in the synthetic method (i) in the above, allyl (meth)acrylate or the following compounds may be exemplified.

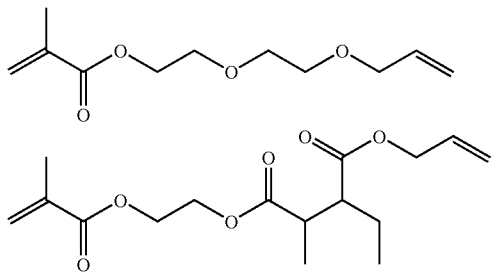

As the monomer having a double bond precursor that is used in the synthetic method (ii) in the above, compounds represented by the following formula (a) and the like may be exemplified.

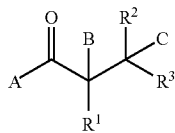

Formula (a)

In the formula (a), A is an organic group having a polymerizable group; $R^1$ to $R^3$ each independently represent a hydrogen atom or a monovalent organic group; and B and C represent leaving groups which are removed by elimination reaction, and the elimination reaction as used herein means that C is drawn by the action of a base, and B is eliminated. It is preferred that B is eliminated as an anion and C is eliminated as a cation.

As for the compound represented by formula (a), specifically the following compounds may be exemplified.

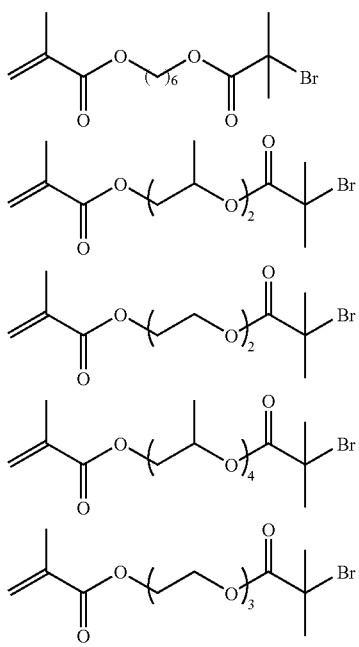

-continued

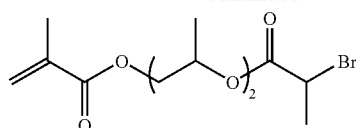

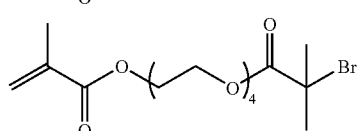

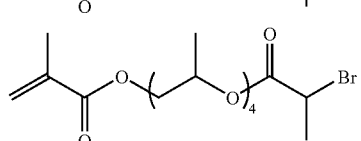

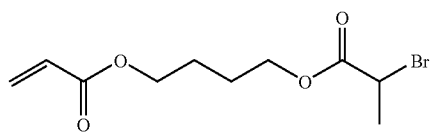

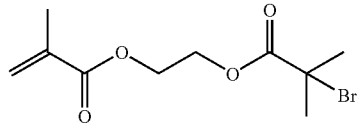

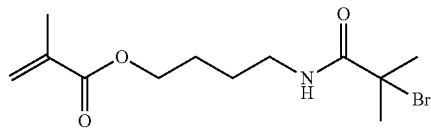

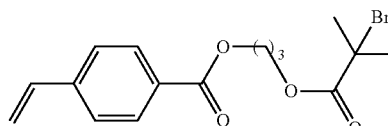

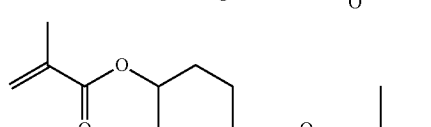

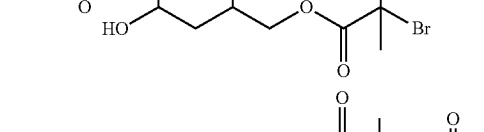

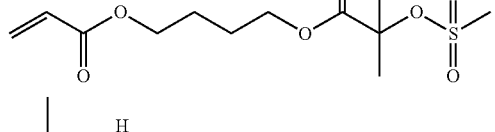

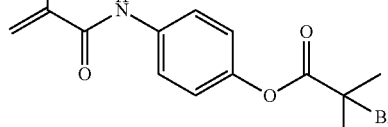

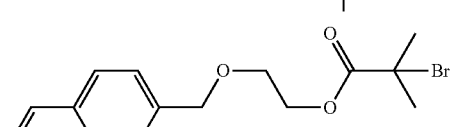

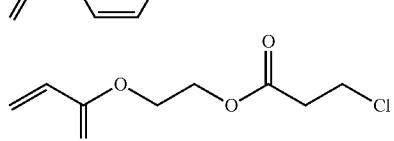

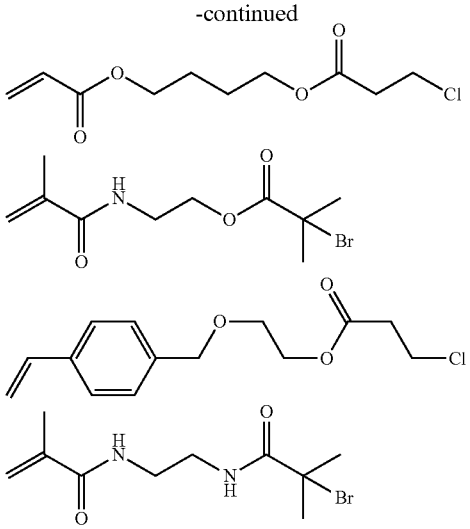

Furthermore, in the synthetic method of (ii) in the above, in order to convert the double bond precursor to the double bond, a method of removing the leaving groups represented by B and C through the elimination reaction as shown below, that is, a method of drawing C by the action of a base so that B is eliminated, is used.

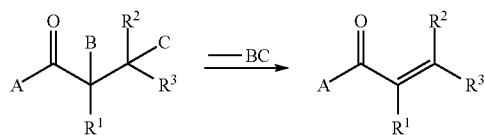

Preferable examples of the base used in the above elimination reaction include hydrides, hydroxides or carbonates of alkali metals, organic amine compounds, and metal alkoxide compounds. Preferable examples of the hydrides, hydroxides or carbonates of alkali metals include sodium hydride, calcium hydride, potassium hydride, sodium hydroxide, potassium hydroxide, calcium hydroxide, potassium carbonate, sodium carbonate, potassium hydrogen carbonate, sodium hydrogen carbonate, and the like. Preferable examples of the organic amine compounds include trimethylamine, triethylamine, diethylmethylamine, tributylamine, triisobutylamine, trihexylamine, trioctylamine, N,N-dimethylcyclohexylamine, N,N-diethylcyclohexylamine, N-methyldicyclohexylamine, N-ethyldicyclohexylamine, pyrrolidine, 1-methylpyrrolidine, 2,5-dimethylpyrrolidine, piperidine, 1-methylpiperidine, 2,2,6,6-tetramethylpiperidine, piperazine, 1,4-dimethylpiperazine, quinuclidine, 1,4-diazabicyclo[2,2,2]-octane, hexamethylenetetramine, morpholine, 4-methylmorpholine, pyridine, picoline, 4-dimethylaminopyridine, lutidine, 1,8-diazabicyclo[5,4,0]-7-undecene (DBU), N,N'-dicyclohexylcarbodiimide (DCC), diisopropylethylamine, Schiff bases and the like. Preferable examples of the metal alkoxide compound include sodium methoxide, sodium ethoxide, potassium t-butoxide and the like. These bases may be used alone, or as a mixture of two or more kinds.

Examples of the solvent used in the above elimination reaction when a base is provided (added), include ethylene dichloride, cyclohexanone, methyl ethyl ketone, acetone, methanol, ethanol, propanol, butanol, ethylene glycol monomethyl ether, ethylene glycol monoethyl ether, 2-methoxyethyl acetate, 1-methoxy-2-propanol, 1-methoxy-2-propyl acetate, N,N-dimethylformamide, N,N-dimethylacetamide, dimethylsulfoxide, toluene, ethyl acetate, methyl lactate, ethyl lactate, water, and the like. These solvents may be used alone or as a mixture two or more kind.

The amount of the base used may be an equivalent or less, or may also be an equivalent or more, relative to the amount of a particular functional group in the compound (leaving group represented by B or C). Furthermore, in the case of the use in excess base, it is also preferable to add an acid or the like for the purpose of removing the excess base after the elimination reaction.

The polymer having a cyano group, which is used in the synthetic method (iii) in the above, is synthesized by radical-polymerizing a monomer which is used in the formation of the cyano group-containing unit recited in the exemplary embodiment (1-2), and a monomer having a reactive group for introducing a double bond.

Examples of the monomer having the reactive group for introducing a double bond include the monomers having a carboxyl group, a hydroxyl group, an epoxy group or an isocyanate group as the reactive group.

Examples of the carboxyl group-containing monomer include (meth)acrylic acid, itaconic acid, vinyl benzoate; ARONIX M-5300, M-5400 and M-5600 (all trade names) manufactured by Toagosei Co., Ltd.; ACRYLESTER PA and HH (all trade names) manufactured by Mitsubishi Rayon Co., Ltd.; LIGHT ACRYLATE HOA-HH (all trade names) manufactured by Kyoeisha Chemical Co., Ltd.; NK ESTER SA and A-SA (all trade names) manufactured by Shin-Nakamura Chemical Co., Ltd.; and the like.

Examples of the hydroxyl group-containing monomer include 2-hydroxyethyl (meth)acrylate, 4-hydroxybutyl (meth)acrylate, 2-hydroxypropyl (meth)acrylate, 2-hydroxybutyl (meth)acrylate, 1-(meth)acryloyl-3-hydroxy-adamantane, hydroxymethyl(meth)acrylamide, 2-(hydroxyethyl)-(meth)acrylate, 3-chloro-2-hydroxypropyl (meth)acrylate, 3,5-dihydroxypentyl (meth)acrylate, 1-hydroxymethyl-4-(meth)acryloylmethyl-cyclohexane, 2-hydroxy-3-phenoxypropyl (meth)acrylate; ARONIX M-554, M-154, M-555, M-155, M-158 (all trade names) manufactured by Toagosei Co., Ltd.; BLENMER PE-200, PE-350, PP-500, PP-800, PP-1000, 70PEP-350B, 55PET800 (all trade names) manufactured by Nippon Oil & Fats Co., Ltd.; and lactone-modified acrylates having the following structure;

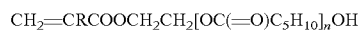

(wherein R represents hydrogen atom or a methyl group, and n represents an integer of from 1 to 5).

Examples of the monomer having an epoxy group include glycidyl (meth)acrylate, CYCLOMER A and M (all trade names) manufactured by Daicel Chemical Industries, Ltd., and the like.

Examples of the monomer having an isocyanate group include KARENZ AOI and MOI (all trade names) manufactured by Showa Denko Kabushiki Kaisha.

The polymer having a cyano group, which is used in the synthetic method (iii), may further contain a third copolymerizable component.

In the synthetic method (iii) in the above, the monomer having a polymerizable group which is reacted with the polymer having a cyano group, varies with the type of the reactive group in the polymer having a cyano group.

Monomers having the following combinations of functional groups may be used.

That is, (reactive group of polymer, functional group of monomer)=(carboxyl group, carboxyl group), (carboxyl group, epoxy group), (carboxyl group, isocyanate group), (carboxyl group, benzyl halide), (hydroxyl group, carboxyl group), (hydroxyl group, epoxy group), (hydroxyl group, isocyanate group), (hydroxyl group, benzyl halide), (isocyanate group, hydroxyl group), (isocyanate group, carboxyl group), (epoxy group, carboxyl group), and the like may be exemplified.

Specific examples include the following monomers.

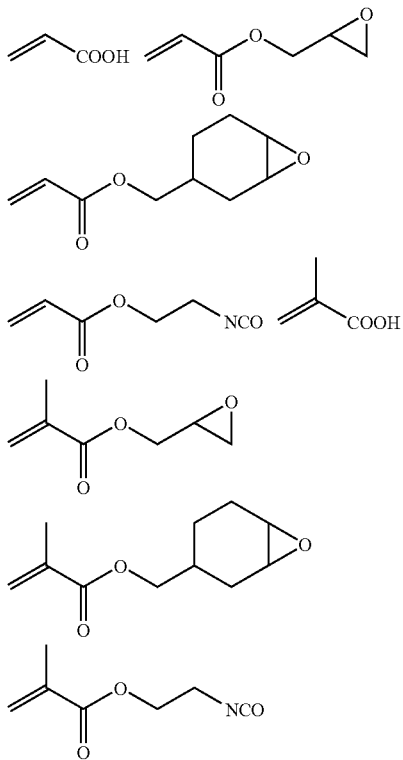

In regard to the cyano group-containing polymerizable polymer of the invention, if $L^1$ in the formula (1), formula (3) or formula (4) has a structure of a divalent organic group having a urethane bond, it is preferable to synthesize the polymer by the synthetic method as shown below (hereinafter, may be referred to as a "synthetic method A").

The synthetic method A of synthesizing the polymer of the invention includes the step in which a polymer having a hydroxyl group at the side chain, and a compound having an isocyanate group and a polymerizable group are used at least in a solvent, and a urethane bond is formed in $L^1$ by adding the isocyanate group to the hydroxyl group.

Here, preferable examples of the polymer having a hydroxyl group at the side chain, which is used in the synthetic method A, include the copolymers formed from the monomers used in the formation of the cyano group-containing unit recited in the exemplary embodiment of (1-2) in the above, and the hydroxyl group-containing (meth)acrylate as shown below.

Examples of the hydroxyl group-containing (meth)acrylate include 2-hydroxyethyl(meth)acrylate, 4-hydroxybutyl (meth)acrylate, 2-hydroxypropyl(meth)acrylate, 2-hydroxybutyl(meth)acrylate, 1-(meth)acryloyl-3-hydroxy-adamantane, hydroxymethyl(meth)acrylamide, 2-(hydroxymethyl)-(meth)acrylate, methyl ester of 2-(hydroxymethyl)-(meth)acrylate, 3-chloro-2-hydroxypropyl (meth)acrylate, 3,5-dihydroxypentyl(meth)acrylate, 1-hydroxymethyl-4-(meth)acryloylmethyl-cyclohexane, 2-hydroxy-3-phenoxypropyl(meth)acrylate, 1-methyl-2-acryloyloxypropyl phthalate, 2-acryloyloxyethyl-2-hydroxyethyl phthalate, 1-methyl-2-acryloyloxyethyl-2-hydroxypropyl phthalate, 2-acryloyloxyethyl-2-hydroxy-3-chloropropyl phthalate; ARONIX M-554, M-154, M-555, M-155, M-158 (all trade names) manufactured by Toagosei Co., Ltd.; BLENMER PE-200, PE-350, PP-500, PP-800, PP-1000, 70PEP-350B, 55PET800 (all trade names) manufactured by Nippon Oil & Fats Co., Ltd.; and lactone-modified acrylates having the following structure;

(wherein R represents a hydrogen atom or a methyl group, and n represents an integer of from 1 to 5).

The polymer having a hydroxyl group at the side chain, which is used in the synthetic method A, may further contain a third copolymerizable component.

Among the polymers having a hydroxyl group at the side chain as described in the above, it is preferable, from the viewpoint of synthesizing a polymer having a high molecular weight, to use the polymer synthesized with the use of the raw material, from which the bifunctional acrylate by-produced during the synthesis of the hydroxyl group-containing (meth) acrylate is removed, as the raw material. As for the method of purifying the hydroxyl group-containing (meth)acrylate, distillation and column purification are preferable. More preferably, a polymer synthesized with the use of the hydroxyl group-containing (meth)acrylate obtained by way of the following processes of (I) to (IV) in sequence, is preferable:

(I) a process of dissolving a mixture containing a hydroxyl group-containing (meth)acrylate and the bifunctional acrylate which is by-produced during the synthesis of the hydroxyl group-containing (meth)acrylate, in water;

(II) a process of adding a first organic solvent which separates from water, into the obtained aqueous solution, and then separating the phase containing the first organic solvent and the bifunctional acrylate, from the aqueous phase;

(III) a process of dissolving a compound having higher water-solubility than the hydroxyl group-containing (meth) acrylate, in the aqueous phase; and (IV) a process of adding a second organic solvent to the aqueous phase to extract the hydroxyl group-containing (meth)acrylate, and thereafter concentrating the extract.

The mixture used in the process (I) contains the hydroxyl group-containing (meth)acrylate and the bifunctional acrylate which is an impurity by-produced during the synthesis of the hydroxyl group-containing (meth)acrylate, and thus corresponds to a commonly commercially available product of hydroxyl group-containing (meth)acrylate.

In the process (I), the commercially available product (mixture) is dissolved in water, and an aqueous solution is obtained.

In the process (II), the first organic solvent which separates from water is added to the aqueous solution obtained in the process (I). Examples of the first organic solvent used herein include ethyl acetate, diethyl ether, benzene, toluene and the like.

Thereafter, the phase containing this first organic solvent and the bifunctional acrylate (oil phase) is separated from the aqueous solution (aqueous phase).

In the process (III), a compound having higher water-solubility than the hydroxyl group-containing (meth)acrylate is dissolved in the aqueous phase separated from the oil phase in the process (II).

Examples of the compound having higher water-solubility than the hydroxyl group-containing (meth)acrylate as used herein, include inorganic salts, such as alkali metal salts such as sodium chloride and potassium chloride; and alkaline earth metal salts such as magnesium sulfate and calcium sulfate; and the like.

In the process (IV), the second organic solvent is added to the aqueous phase to extract the hydroxyl group-containing (meth)acrylate, and thereafter, the extract is concentrated.

Examples of the second organic solvent used herein include ethyl acetate, diethyl ether, benzene, toluene and the like. This second organic solvent may be identical to the first organic solvent, or may also be different from the first organic solvent.

In the concentration in the process (IV), drying with anhydrous magnesium sulfate, distillation off under reduced pressure or the like is used.

The isolated product containing the hydroxyl group-containing (meth)acrylate obtained by way of the processes (I) to (IV) in sequence, preferably contains the bifunctional acrylate in an amount of 0.1% by mass or less of the total mass. That is, by way of the processes (I) to (IV), the bifunctional acrylate which is an impurity is removed from the mixture, and thus the hydroxyl group-containing (meth)acrylate is purified.

A more preferable range of the content of the bifunctional acrylate is 0.05% by mass or less relative to the total mass of the isolated product, and the smaller content is the better.

When the hydroxyl group-containing (meth)acrylate thus purified is used, the bifunctional acrylate which is an impurity does not easily influence the polymerization reaction, and thus the cyano group-containing polymerizable polymer having a weight average molecular weight of 20,000 or more may be synthesized.

As the hydroxyl group-containing (meth)acrylate used in the process (I), those previously recited as the hydroxyl group-containing (meth)acrylate which is used at the time of synthesizing the polymer having a hydroxyl group at the side chain in the synthesis (A), may be used. Among them, from the viewpoint of the reactivity with isocyanate, a monomer having a primary hydroxyl group is preferable, and furthermore, from the viewpoint of increasing the ratio of the polymerizable group per unit weight of the polymer, the hydroxyl group-containing (meth)acrylate having a molecular weight of 100 to 250 is preferable.

As the compound having an isocyanate group and a polymerizable group, which is used in the synthetic method A, 2-acryloyloxyethyl isocyanate (trade name: KARENZ AOI, manufactured by Showa Denko Kabushiki Kaisha), 2-methacryloxy isocyanate (trade name: KARENZ MOI, manufactured by Showa Denko Kabushiki Kaisha) and the like, may be exemplified.

Further, as the solvent used in the synthetic method A, a solvent having an SP value (calculated by the Okitsu method) of 20 MPa$^{1/2}$ to 23 MPa$^{1/2}$ is preferable, and specifically, examples of the solvent include ethylene glycol diacetate, diethylene glycol diacetate, propylene glycol diacetate, methyl acetoacetate, ethyl acetoacetate, 1,2,3-triacetoxy-propane, cyclohexanone, 2-(1-cyclohexenyl)cyclohexanone, propionitrile, N-methylpyrrolidone, dimethylacetamide, acetylacetone, acetophenone, triacetin, 1,4-dioxane, dimethyl carbonate and the like.

Among them, from the viewpoint of synthesizing a high molecular weight polymer, the solvent is more preferably an ester-based solvent, and in particular, a diacetate-based solvent such as ethylene glycol diacetate and diethylene glycol diacetate, or dimethyl carbonate is more preferable.

Here, the SP value of the solvent according to the invention is a value calculated by the Okitsu method (by Toshinao Okitsu, "Journal of the Adhesion Society of Japan," 29(3) (1993)). Specifically, the SP value is calculated by the following formula. Here, ΔF is a value recited in the literature.

$$SP\text{ value }(\delta) = \Sigma \Delta F (\text{molar attraction constants})/V \text{ (molar volume)}$$

In the cyano group-containing polymerizable polymer of the invention thus synthesized, it is preferred that the ratio of the polymerizable group-containing unit or the cyano group-containing unit to the total amount of copolymerizable components is in the following ranges.

That is, the polymerizable group-containing unit is preferably contained in an amount of 5% by mole to 50% by mole, and more preferably 5% by mole to 40% by mole, relative to the total amount of copolymerizable components. If the amount is less than 5% by mole, the reactivity (curability and polymerizability) is deteriorated, while if the amount exceeds 50% by mole, the polymer is easily gelated during the synthesis, resulting in difficulty in the synthesis. The cyano group-containing unit is preferably contained in an amount in the range of 5% by mole to 95% by mole, and more preferably in the range of 10% by mole to 95% by mole, relative to the total amount of copolymerizable components from the viewpoint of the adsorptivity to a plating catalyst or the like.

In addition, the cyano group-containing polymerizable polymer of the invention may further contain another unit, in addition to the cyano group-containing unit and the polymerizable group-containing unit. As for the monomer used for forming another unit, any monomer may be used, provided that the monomer does not impair the effects of the invention.

Examples of monomers used for forming another unit include, specifically, monomers which can form a main chain skeleton such as an acrylic resin skeleton, a styrene resin skeleton, a phenol resin (phenol-formaldehyde resin) skeleton, a melamine resin (polycondensate of melamine and formaldehyde) skeleton, a urea resin (polycondensate of urea and formaldehyde) skeleton, a polyester resin skeleton, a polyurethane skeleton, a polyimide skeleton, a polyolefin skeleton, a polycycloolefin skeleton, a polystyrene skeleton, a polyacryl skeleton, an ABS resin (polymer of acrylonitrile, butadiene and styrene) skeleton, polyamide skeleton, a polyacetal skeleton, a polycarbonate skeleton, a polyphenylene ether skeleton, a polyphenylene sulfide skeleton, a polysulfone skeleton, a polyether sulfone skeleton, a polyallylate skeleton, a polyether ether ketone skeleton, a polyamide imide skeleton and the like. Further, these main chain skeletons may be a main chain skeleton of a cyano group-containing unit or a polymerizable group-containing unit.

However, in the case of introducing the polymerizable group into the polymer as described in the above, if the introduction at the ratio of 100% is difficult, a small amount of the reactive moieties may remain, and there is a possibility that the remained moieties may serve as a third unit.

Specific examples of the monomers include, in the case of forming the polymer main chain by radical polymerization, unsubstituted (meth)acrylates such as ethyl (meth)acrylate, butyl (meth)acrylate, hexyl (meth)acrylate, 2-ethylhexyl (meth)acrylate, cyclohexyl (meth)acrylate, benzyl (meth)acrylate and stearyl (meth)acrylate; halogen-substituted (meth)acrylates such as 2,2,2-trifluoroethyl (meth)acrylate, 3,3,3-trifluoropropyl (meth)acrylate and 2-chloroethyl (meth)acrylate; ammonium group-substituted (meth)acrylates such as 2-(meth)acryloyloxyethyl trimethylammonium chloride; (meth)acrylamides such as butyl(meth)acrylamide, isopropyl(meth)acrylamide, octyl(meth)acrylamide and dimethyl(meth)acrylamide; styrenes such as styrene, vinylbenzoic acid and p-vinylbenzylammonium chloride; vinyl compounds such as N-vinylcarbazole, vinyl acetate, N-vinylacetamide and N-vinylcaprolactam; and also, dimethylaminoethyl (meth)acrylate, diethylaminoethyl (meth)acrylate, 2-ethylthio-ethyl (meth)acrylate, (meth)acrylic acid, 2-hydroxyethyl (meth)acrylate, and the like.

The macromonomers obtained by using the monomers described in the above may also be used.

In the case of forming the polymer main chain by cationic polymerization, vinyl ethers such as ethyl vinyl ether, butyl vinyl ether, isobutyl vinyl ether, cyclohexyl vinyl ether, ethylene glycol vinyl ether, di(ethylene glycol) vinyl ether, 1,4-butanediol vinyl ether, 2-chloroethyl vinyl ether, 2-ethylhexyl vinyl ether, vinyl acetate, 2-vinyloxytetrahydropyran, vinyl benzoate and vinyl butyrate; styrenes such as styrene, p-chlorostyrene and p-methoxystyrene; terminal ethylenes such as allyl alcohol and 4-hydroxy-1-butene may be used.

The weight average molecular weight of the cyano group-containing polymerizable polymer of the invention is preferably from 1,000 to 700,000, and more preferably from 2,000 to 200,000. In particular, from the viewpoint of the polymerization sensitivity, the weight average molecular weight of the cyano group-containing polymerizable polymer of the invention is preferably 20,000 or more.

As for the degree of polymerization of the cyano group-containing polymerizable polymer of the invention, it is preferable to use a polymer of 10-mers or more, and more preferable to use a polymer of 20-mers or more. Furthermore, a polymer is preferably 7000-mers or less, more preferably 3000-mers or less, even more preferably 2000-mers or less, and particularly preferably 1000-mers or less.

The preferable ranges of the molecular weight and the polymerization degree recited herein are the preferable ranges for the specific polymerizable compounds other than the cyano group-containing polymerizable polymer.

Specific examples of the cyano group-containing polymerizable polymer of the invention will be shown below, but the examples are not intended to be limited thereto.

The weight average molecular weights of these specific examples are all in the range of 3,000 to 100,000.

Polymers obtained by the exemplary embodiment (1-1)

1-1-1

1-1-2

1-1-3

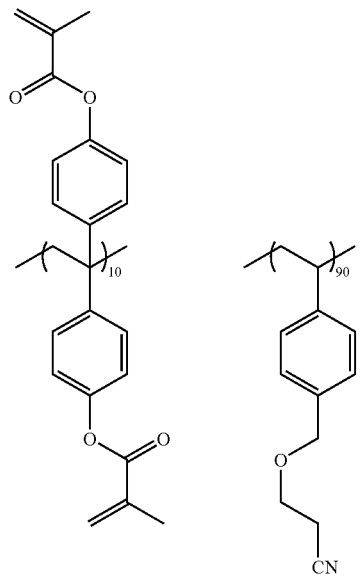

1-1-4

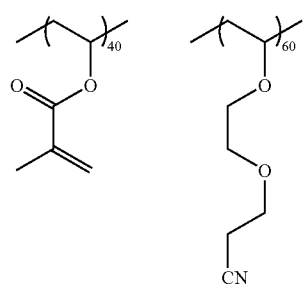
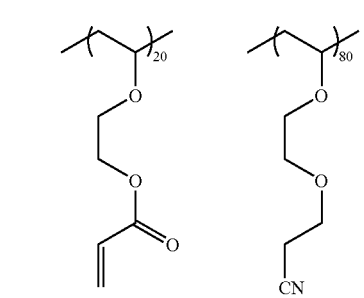

1-1-5

1-1-6

1-1-7

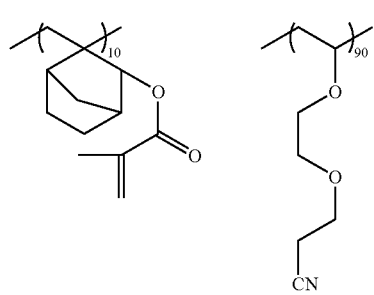
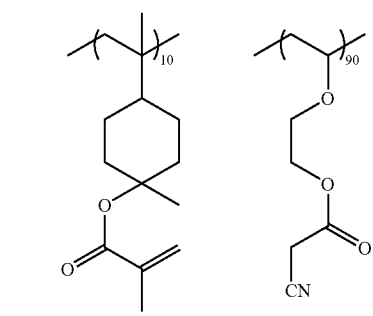

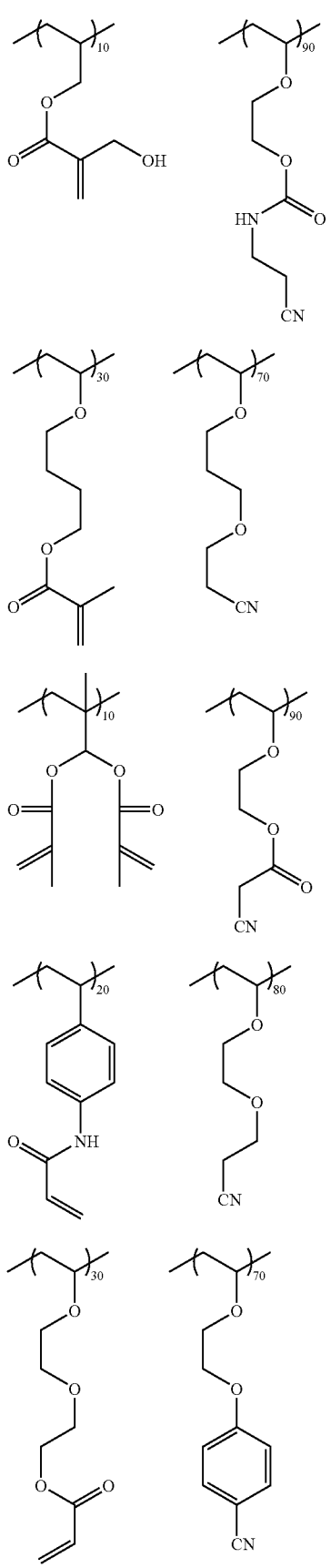
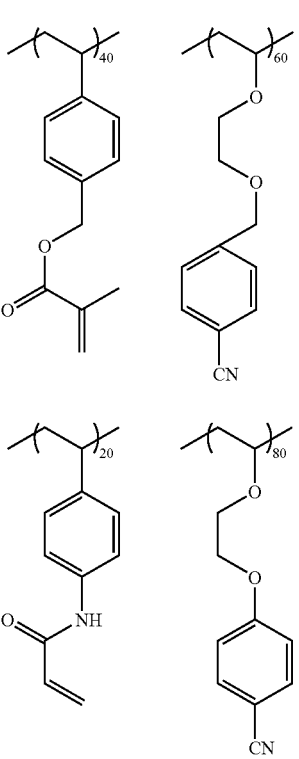
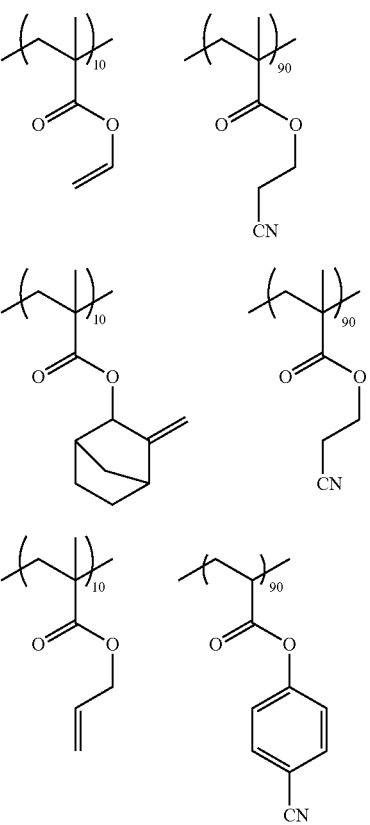
Polymers obtained by the exemplary embodiment (1-2)

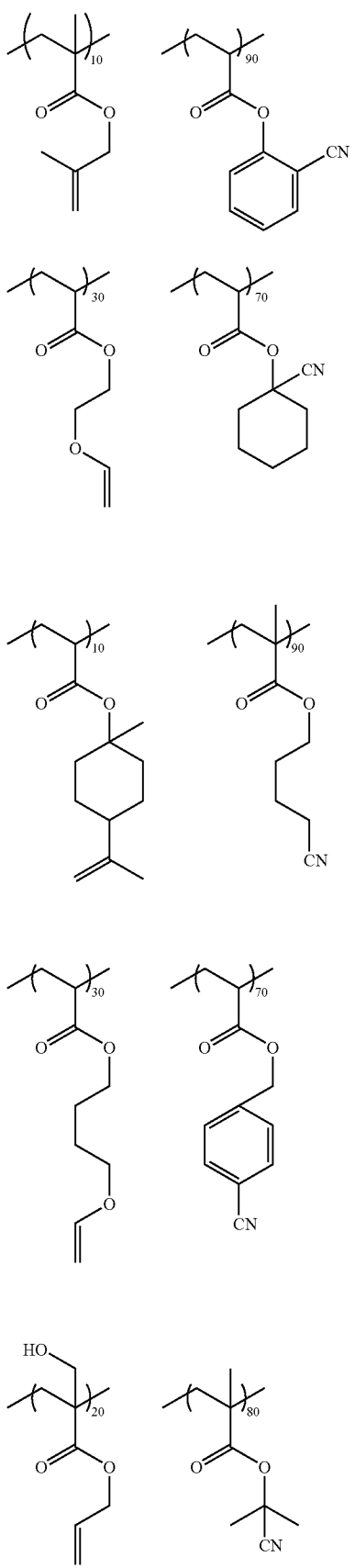
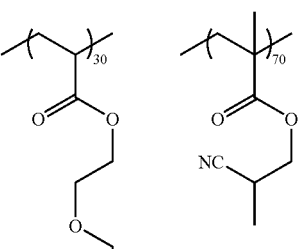
1-2-4
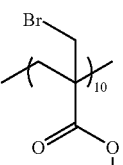
1-2-5
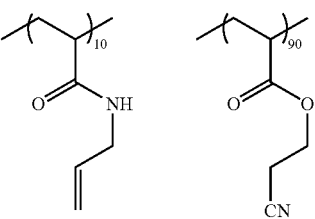
1-2-6
1-2-7
1-2-9
1-2-10
1-2-11
Polymers obtained by the exemplary embodiment (2-1)
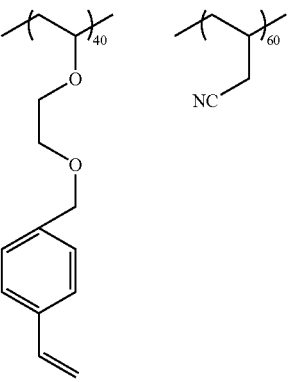
2-1-1
1-2-8

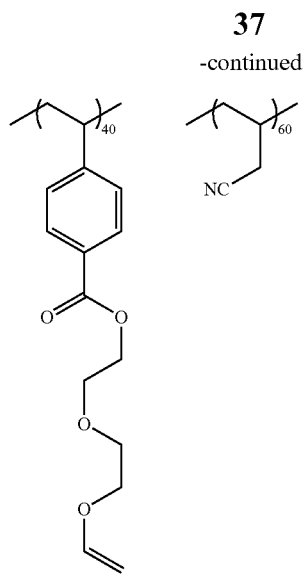
2-1-2
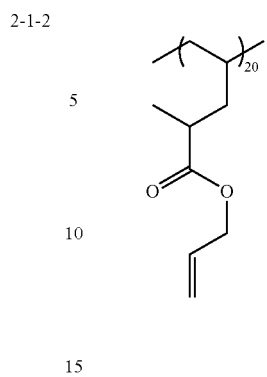
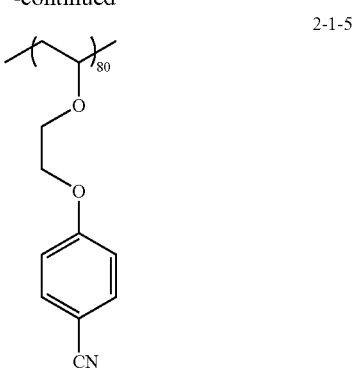
2-1-5
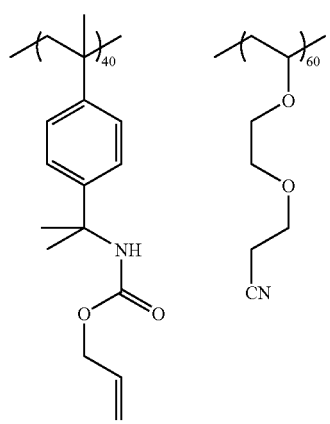
2-1-3
Polymers obtained by the exemplary embodiment (2-2)
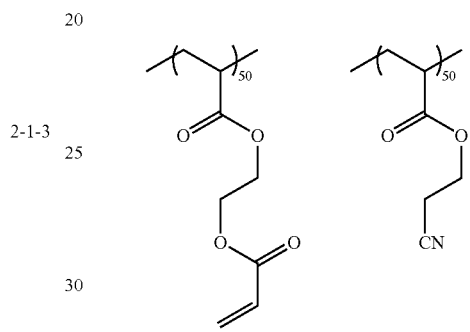
2-2-1
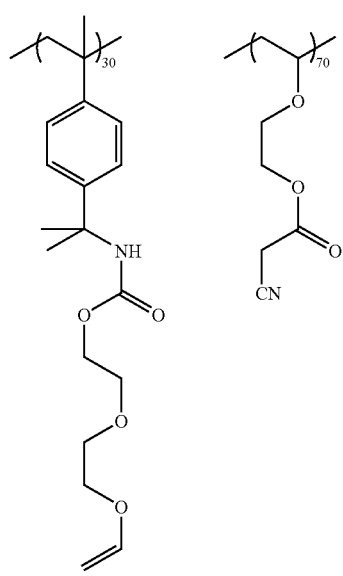
2-1-4
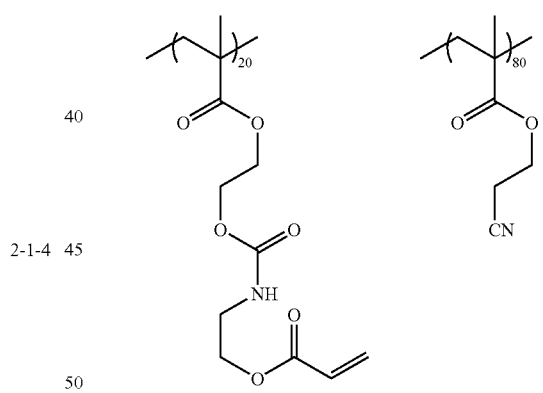
2-2-2
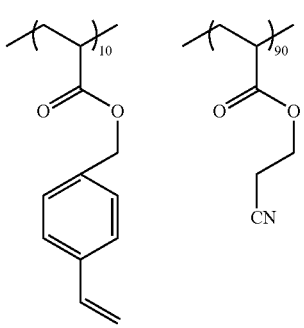
2-2-3

2-2-4
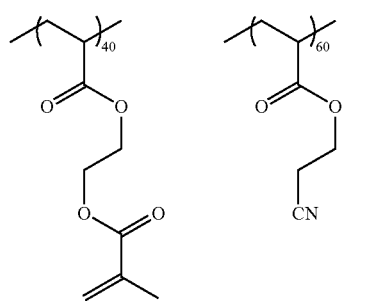
2-2-5
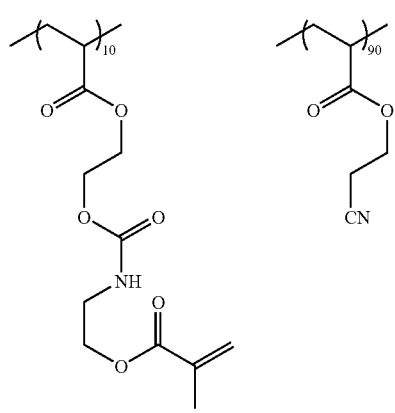
2-2-6
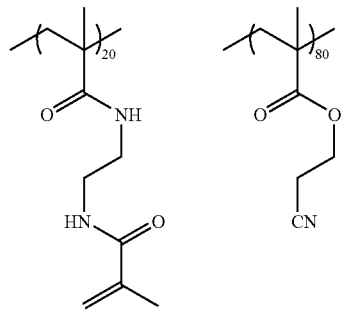
2-2-7
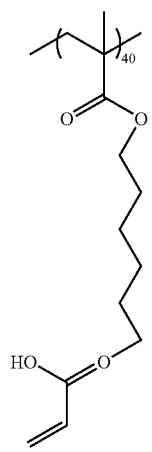
2-2-8
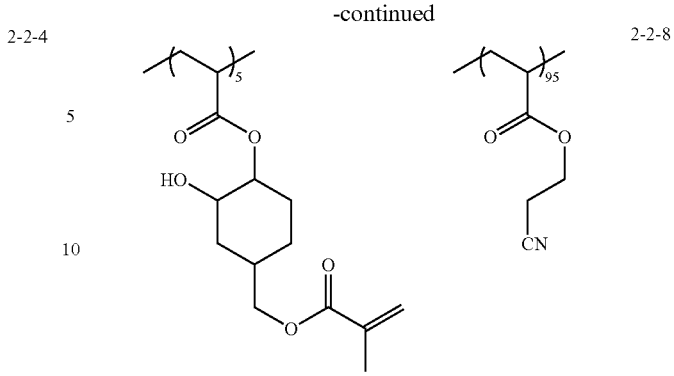
2-2-9
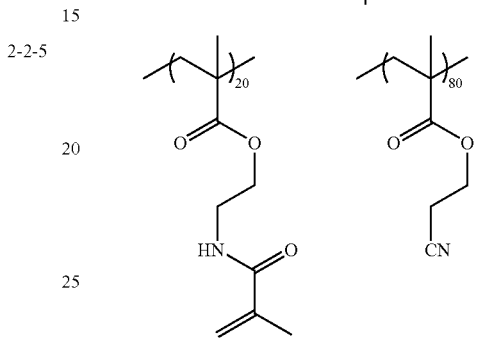
2-2-10
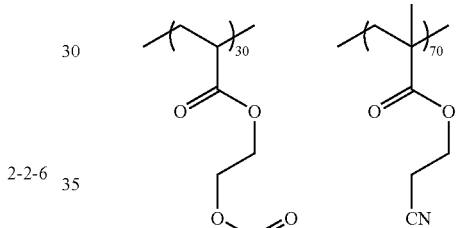
2-2-11
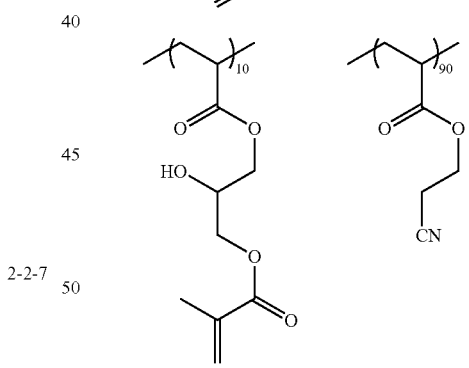
2-2-12
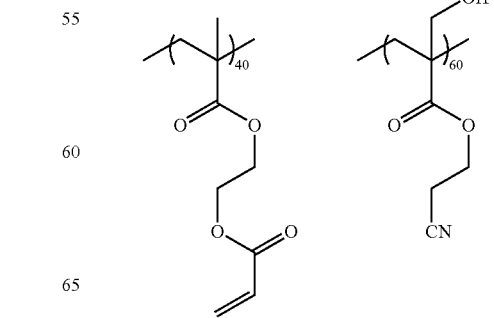

Polymers obtained by the exemplary embodiment (2-2)
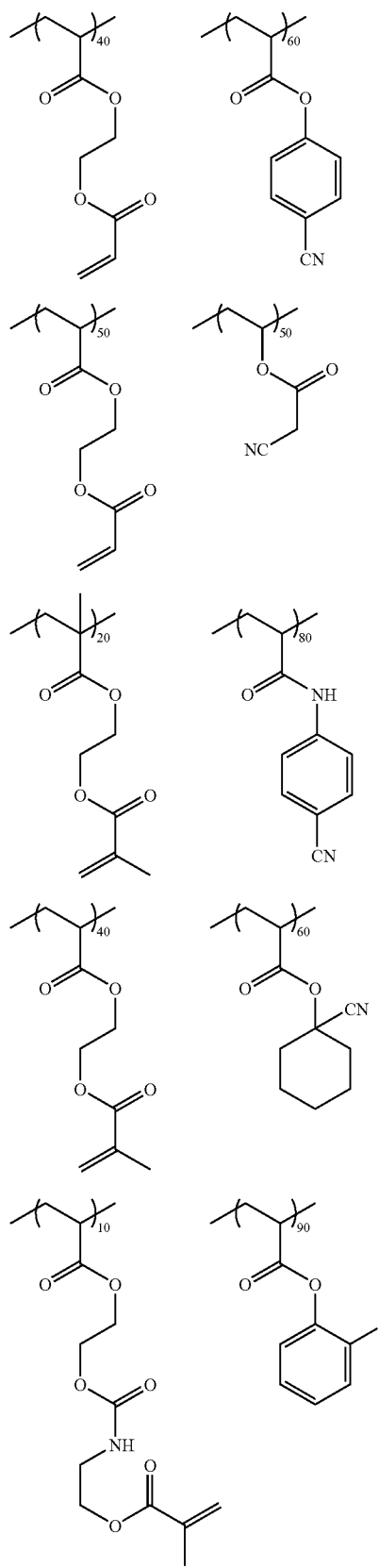
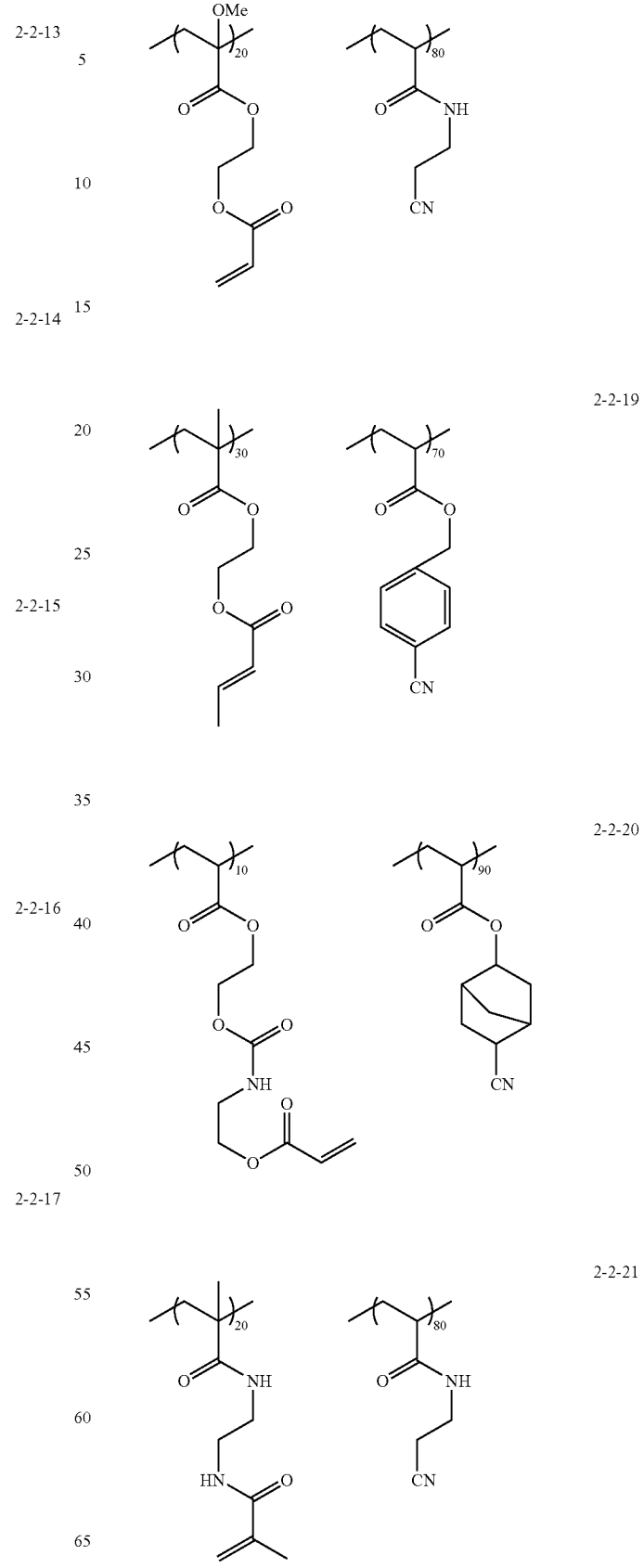

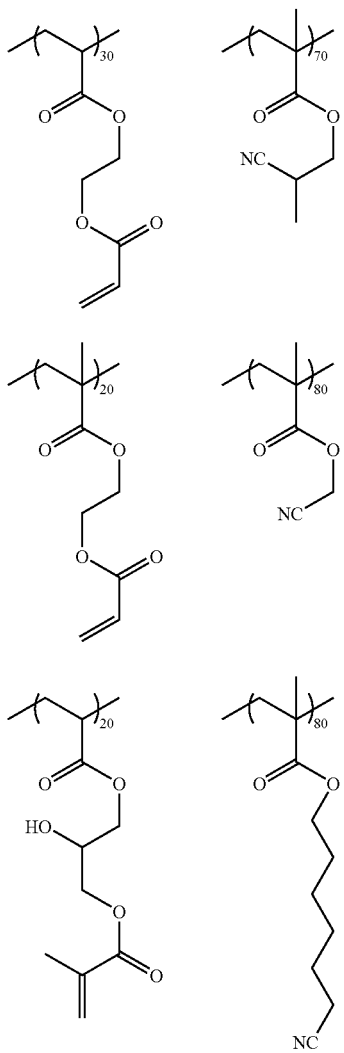
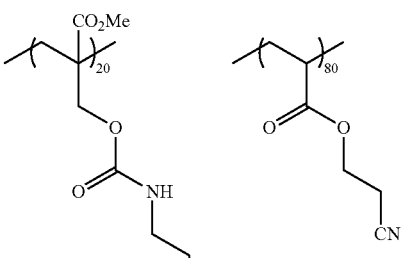
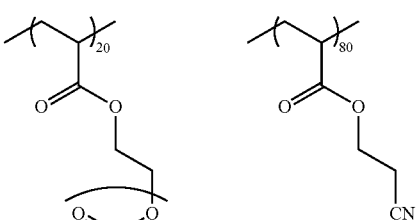
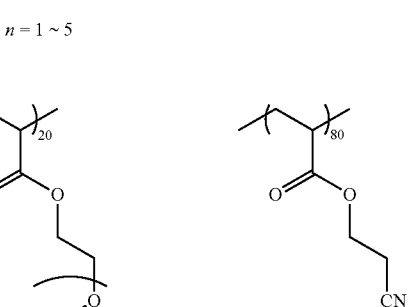
Polymers obtained by the exemplary embodiment (2-2)
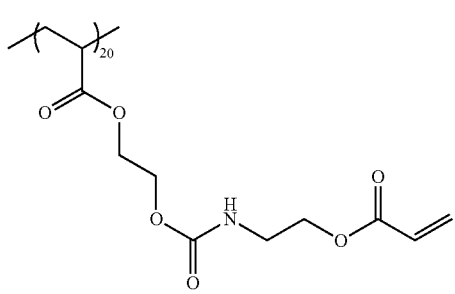
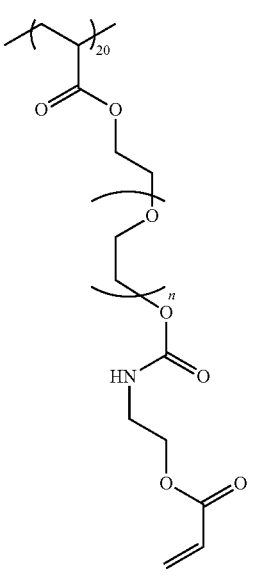
$n = 1\sim5$

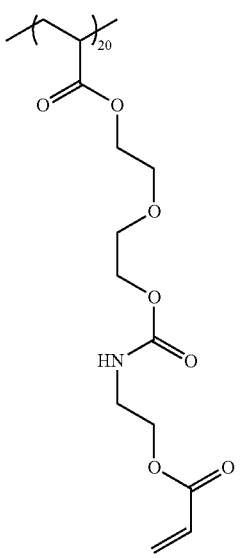 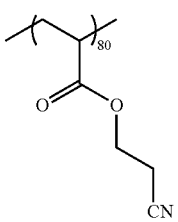

2-2-29

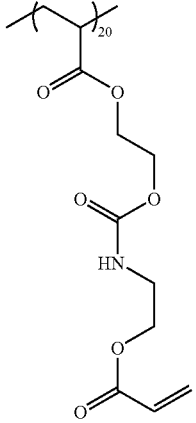 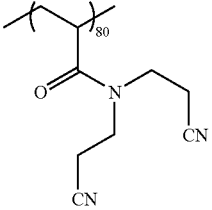

2-2-32

Polymers obtained by the exemplary embodiment (2-2)

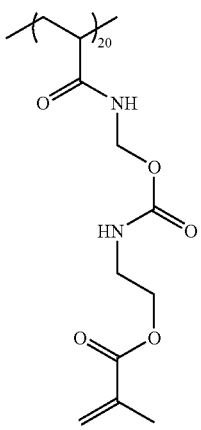 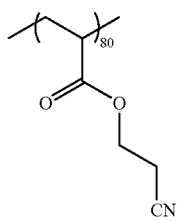

2-2-30

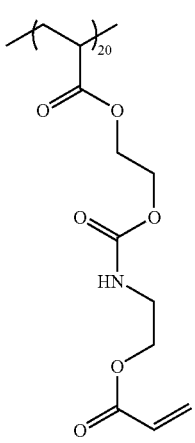 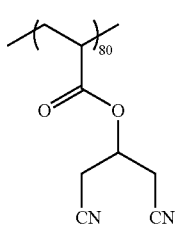

2-2-31

Here, for example, the compound 2-2-11 among the specific examples may be synthesized in such a manner that acrylic acid and 2-cyanoethyl acrylate are dissolved in, for example, N-methylpyrrolidone, and are radically polymerized using, for example, azoisobutyronitrile (AIBN) as a polymerization initiator, and thereafter, the polymerized product is subjected to addition reaction with glycidyl methacrylate with the use of a catalyst such as benzyltriethylammonium chloride, in a state where a polymerization inhibitor such as tertiary-butylhydroquinone is added.

Further, for example, the compound 2-2-19 among the specific examples may be synthesized by dissolving the following monomer and p-cyanobenzyl acrylate in a solvent such as N,N-dimethylacrylamide, performing radical polymerization with the use of a polymerization initiator such as dimethyl azoisobutylate, and then performing dehydrochlorination with the use of a base such as triethylamine.

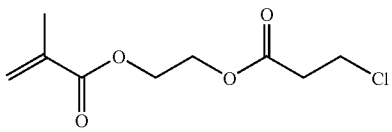

The specific polymerizable compounds such as the cyano group-containing polymerizable polymer in the invention may have polar groups to the extent that the water absorptivity of the formed resin film is not raised, in addition to the polymerizable group and the sites which exhibit metal ion adsorptivity. By adding a polar group to the specific polymerizable compounds, after a plated metal film is formed by a process, which will be described later, for example, when a protective layer is provided, the adhesiveness in the contact area between the resin film and the protective layer can be enhanced.

The solvent used in the composition containing the specific polymerizable compound in the invention is not specifically limited as long as the specific polymerizable compound (monomer and polymer), which is a principal component of the composition, can be dissolved in the solvent. A surfactant may be further added to the solvent.

Examples of the solvent that may be used include alcohol-based solvents such as methanol, ethanol, propanol, ethylene glycol, glycerin and propylene glycol monomethyl ether; acids such as acetic acid; ketone-based solvents such as acetone, methyl ethyl ketone and cyclohexanone; amide-based solvents such as formamide, dimethylacetamide and N-methylpyrrolidone; nitrile-based solvents such as acetonitrile and propionitrile; ester-based solvents such as methyl acetate and ethyl acetate; carbonate-based solvents such as dimethyl carbonate and diethyl carbonate; and the like.

Among them, in the case of preparing a composition using the cyano group-containing polymerizable polymer, an amide-based, ketone-based, nitrile-based solvents and carbonate-based solvents are preferable, and specifically, acetone, dimethylacetamide, methyl ethyl ketone, cyclohexanone, acetonitrile, propionitrile, N-methylpyrrolidone and dimethyl carbonate are preferable.

In the case of coating the composition containing the cyano group-containing polymerizable polymer, a solvent having a boiling point of 50° C. to 150° C. is preferable from the viewpoint of easy handling. In addition, these solvents may be used alone, or may also be used as a mixture.

The surfactant which may be added to the solvent as necessary, may be any surfactant, provided that the surfactant is soluble in the solvent. Examples of such surfactants include anionic surfactants such as sodium n-dodecylbenzenesulfonate; cationic surfactants such as n-dodecyltrimethylammonium chloride; nonionic surfactants such as polyoxyethylene nonylphenol ether (examples of commercially available products include EMULGEN 910, manufactured by Kao Corporation, and the like), polyoxyethylene sorbitan monolaurate (examples of commercially available products include "TWEEN 20" (trade name), and the like), and polyoxyethylene lauryl ether; and the like.

If necessary, a plasticizer may also be added to the composition. As the plasticizer that are usable, common plasticizers may be used, and high boiling point solvents such as phthalates (dimethyl ester, diethyl ester, dibutyl ester, di-2-ethylhexyl ester, di-normal-octyl ester, diisononyl ester, dinonyl ester, diisodecyl ester, butylbenzyl ester), adipates (dioctyl ester, diisononyl ester), dioctyl azelate, sebacates (dibutyl ester, dioctyl ester), tricresyl phosphate, tributyl acetylcitrate, epoxidized soybean oil, trioctyl trimellitate, chlorinated paraffin, dimethylacetamide and N-methylpyrrolidone, may also be used.

A polymerization inhibitor may also be added to the composition containing the specific polymerizable compound, if necessary. Examples of the polymerization inhibitor that may be used include hydroquinones such as hydroquinone, di-tertiary-butylhydroquinone and 2,5-bis(1,1,3,3-tetramethyl-butyl)hydroquinone; phenols such as p-methoxyphenol and phenol; benzoquinones; free radicals such as TEMPO (2,2,6,6-tetramethyl-1-piperidinyloxy free radical) and 4-hydroxy-TEMPO; phenothiazines; nitrosoamines such as N-nitrosophenylhydroxyamine and aluminum salt thereof, and catechols.

A curing agent and/or curing accelerator may also be added to the composition containing the specific polymerizable compound, in order to facilitate the curing of the adhesion auxiliary layer, if necessary. In the case where an epoxy compound is contained in the adhesion auxiliary layer, examples of the curing agent and/or curing accelerator include, aliphatic polyamines, alicyclic polyamines, aromatic polyamines, polyamides, acid anhydrides, phenol, phenol novolac, polymercaptans, compounds having two or more active hydrogen atoms and the like as a polyaddition type accelerator, and aliphatic tertiary amines, aromatic tertiary amines, imidazole compounds, Lewis acid complexes and the like as the catalyst type.

Examples of compounds which initiate curing by the action of heat, light, humidity, pressure, acid, base or the like, include diethylenetriamine, triethylenetetramine, tetraethylenepentamine, diethylaminopropylamine, polyamidoamine, menthenediamine, isophorone diamine, N-aminoethylpiperazine, 3,9-bis(3-aminopropyl)-2,4,8,10-tetraoxyspiro(5,5) undecane adduct, bis(4-amino-3-methylcyclohexyl)methane, bis(4-aminocyclohexyl)methane, m-xylenediamine, diaminodiphenylmethane, m-phenylenediamine, diaminodiphenylsulfone, dicyandiamide, adipic acid dihydrazide, phthalic anhydride, tetrahydrophthalic anhydride, hexahydrophthalic anhydride, methyltetrahydrophthalic anhydride, methylhexahydrophthalic anhydride, methylnadic anhydride, dodecylsuccinic anhydride, chlorendic anhydride, pyromellitic anhydride, benzophenone tetracarboxylic anhydride, ethylene glycol bis(anhydrotrimellitate), methylcyclohexene tetracarboxylic anhydride, trimellitic anhydride, polyazelaic anhydride, phenol novolac, xylylene novolac, bisphenol-A novolac, triphenylmethane novolac, biphenyl novolac, dicyclopentadiene phenol novolac, terpene phenol novolac, polymercaptans, polysulfides, 2,4,6-tris(dimethylaminomethyl)phenol, 2,4,6-tris(dimethylaminomethyl)phenol-tri-2-ethylhexanoate, benzyldimethylamine, 2-(dimethylaminomethyl)phenol, 2-methylimidazole, 2-ethyl-4-methylimidazole, 2-undecylimidazole, 2-heptadecylimidazole, 2-phenylimidazole, 1-benzyl-2-methylimidazole, 1-cyanoethyl-2-methylimidazole, 2,4-di-amino-6-(2-methylimidazolyl-(1))-ethyl S-triazine, $BF_3$ monoethylamine complex, Lewis acid complexes, organic acid hydrazides, diaminomaleonitrile, melamine derivatives, imidazole derivatives, polyamine salts, aminimide compounds, aromatic diazonium salts, diallyliodonium salts, triallylsulfonium salts, triallylselenium salts, ketimine compounds, and the like.

These curing agents and/or curing accelerators are preferably added up to about 0% by mass to 50% by mass relative to the non-volatile components remained after the removal of solvent, from the viewpoint of the coatability of the solution, adhesiveness to a board or a plated film, or the like. Furthermore, the curing agents and/or curing accelerators may also be added to the adhesion auxiliary layer, and in such a case, it is preferred that the total amount of the amount added to the adhesion auxiliary layer and the amount added to the resin film are in the above range.

In addition, rubber components (for example, CTBN), flame retardants (for example, phosphorus-based flame retardants), diluents or thixotropic agents, pigments, defoaming agents, leveling agents, coupling agents, and the like may also be added. These additives may be added into the adhesion auxiliary layer; which will be described hereinafter, as necessary.

When a composition formed by appropriately mixing the specific polymerizable compound with various additives, is used, the properties of the formed resin film, for example, the thermal expansion coefficient, glass transition temperature, Young's modulus, Poisson's ratio, rupture stress, yield stress, thermal decomposition temperature and the like, may be set at the optimal values. Particularly, it is preferred that the rupture stress, yield stress and thermal decomposition temperature be higher.

With regard to the obtained resin film, thermal durability may be measured by a temperature cycle test or a thermal aging test, a reflow test or the like. For example, with regard to the thermal decomposition, if the mass reduction after an exposure to an environment of 200° C. for 1 hour is 20% or less, the resin film can be estimated to have sufficient thermal durability.

When the composition containing a specific polymerizable compound is coated, the amount of coating is preferably 0.1 g/m² to 10 g/m², and particularly preferably 0.5 g/m² to 5 g/m², in terms of the solid content, from the viewpoint of sufficient adsorptivity of a plating catalyst or a plating catalyst precursor.

When a liquid composition containing the specific polymerizable compound is coated on a resin film and dried to form a layer containing the specific polymerizable compound, the remaining solvent may be removed by allowing the coated substrate to stand for 0.5 to 2 hours at temperatures of 20° C. to 40° C., between the coating process and the drying process.

In this way, the multilayer film for plating of the invention having a plating receptive layer formed on the surface of the resin film can be obtained. The plating receptive layer can be formed on the surface of any board with the use of the multilayer film.

(Protective Film)

In addition, a protective film can be adhered onto the surface of the plating receptive layer. As the protective film, the same material as the material used for the resin film may be used, or a material different from the material used for the resin film may be used. Preferable examples usable include resin sheets including polyolefins such as polyethylene, polyvinyl chloride and polypropylene; polyesters such as polyethylene terephthalate; polyamide; and polycarbonate; converted paper having a controlled surface adhesive property such as releasing paper; and metal foils such as copper foil and aluminum foil.

Although the thickness of the protective film is generally 2 μm-150 μm, is preferably 5 μm-70 μm, and more preferably 10 μm-50 μm. Moreover, one of the thickness of the resin film and the thickness of the protective film as a base substrate may be thicker than the other.

The protective film may be subjected to a releasing treatment in addition to a matting treatment and an embossing treatment.

In the multilayer film for plating of the invention, an adhesion auxiliary layer may be further formed on the surface of the plating receptive layer for the purpose of increasing the adhesiveness between a substrate and the plating receptive layer. Further, as described later in detail, although the adhesion auxiliary layer may be formed on the plating receptive layer, may be formed in such a manner that a multilayer film is formed by providing only the adhesion auxiliary layer on the surface of a resin film, subsequently, the adhesion auxiliary layer is transferred onto the surface of a substrate, thereafter, using the multilayer film having only the plating receptive layer on the surface of the resin film, the plating receptive layer is transferred onto the surface of the adhesion auxiliary layer. Hereafter, the adhesion auxiliary layer is explained.

(Adhesion Auxiliary Layer)

It is desirable to form an adhesion auxiliary layer using a resin composition having excellent adhesive property to a board, and an active species (compound) capable of generating active centers which interact with the resin film formed from a photosensitive resin composition. Here, in the case where the resin which forms the resin composition has sites capable of generating active centers which interact with the resin film having metal ion adsorptivity, it is not necessary to add active species (compound), separately.

As the adhesion auxiliary layer in the invention, for example, when a substrate is composed of known insulating resins used as a material for a multilayer laminated board, a build-up board or a flexible board, from the viewpoint of the adhesiveness with the substrate, it is desirable that the insulating resin composition is also used as a resin composition to be used when forming the adhesion auxiliary layer.

Hereafter, exemplary embodiments, in which a substrate is composed of an insulating resin, and an adhesion auxiliary layer is formed from an insulating resin composition, will be explained.

Although the insulating resin composition to be used when forming an adhesion auxiliary layer, may contain the same resin as the electric insulating resin for constituting a substrate, or may contain a resin different from the electric insulating resin for constituting a substrate, it is desirable that resins whose thermal-physical properties such as the glass transition point, modulus of elasticity and coefficient of linear expansion are close to each other, are used. More specifically, it is desirable to use the same kind of insulating resin as the insulating resin for constituting a substrate from the viewpoint of adhesiveness.

Further, as other components, inorganic or organic particles may be added in order to increase the hardness of the adhesion auxiliary layer and to improve electrical properties.

Here, the "insulating resin" in the invention means a resin which has an insulating property to such an extent that the resin may be used in known insulating films, and even though the resin is not a perfectly insulating, as long as the resin has an insulating property in accordance with the intended purpose, the resin is applicable to the invention.

The insulating resin may be a thermosetting resin, a thermoplastic resin, or a mixture thereof. Specifically, examples of the thermosetting resin include epoxy resins, phenolic resins, polyimide resins, polyester resins, bismaleimide resins, polyolefin-based resins, isocyanate-based resins, and the like. Examples of the thermoplastic resins include phenoxy resins, polyethersulfone, polysulfone, polyphenylenesulfone, polyphenylene sulfide, polyphenyl ether, polyetherimide and the like.

The thermoplastic resin and the thermosetting resin each may be used independently, or may also be used in combination of two or more kinds.

Further, as the insulating resin used for the adhesion auxiliary layer, a resin which has a skeleton for generating the active centers capable of interacting with the plating catalyst receptive photosensitive composition, can also be used. For example, a polyimide having polymerization initiation sites in a skeleton as recited in Paragraph Numbers [0018]-[0078] in JP-A No. 2005-307140 may be used.

The adhesion auxiliary layer of the invention may contain a compound having a polymerizable double bond in order to facilitate the crosslinking in the layer, more specifically, may contain an acrylate or methacrylate compound, and in particular, a polyfunctional compound is preferable. In addition, as the compound having the polymerizable double bond, the thermosetting resin or the thermoplastic resin, for example, a resin obtained in such a manner that a part of an epoxy resin, phenolic resin, polyimide resin, polyolefin resin, fluororesin or the like is subjected to the (meth)acrylation reaction using methacrylic acid or acrylic acid, may also be used.

Various compounds in accordance with the intended purpose may be added to the adhesion auxiliary layer in the invention to such an extent that the effect of the invention is not impaired.

More specifically, for example, substances such as rubber and SBR latex which can relax stress at the time of heating, a binder for improving layer property, a plasticizer, a surfactant, a viscosity adjusting agent and the like may be exemplified.

In the adhesion auxiliary layer in the invention, composites (composite materials) of a resin and other components may also be used to strengthen the properties such as mechanical strength, heat resistance, weather resistance, flame resistance, water resistance and electrical properties, of the resin films. Examples of the materials that may be used for producing the composite material include paper, glass fiber, silica particles, phenolic resins, polyimide resins, bismaleimide triazine resins, fluororesins, polyphenylene oxide resins and the like.

Furthermore, in the adhesion auxiliary layer, if necessary, one, or two or more fillers that are used in general resin materials for wiring boards, may be compounded, examples of which include inorganic fillers such as silica, alumina, clay, talc, aluminum hydroxide and calcium carbonate, and organic fillers such as hardened epoxy resins, crosslinked benzoguanamine resins and crosslinked acrylic polymers.

One, or two or more kinds of various additives such as a colorant, a flame retardant, an adhesion-imparting agent, a silane coupling agent, an antioxidant, an ultraviolet absorbent and the like may be added to the adhesion auxiliary layer, if necessary.

When these materials are added to the adhesion auxiliary layer, it is preferred that any materials are added in the range of 0% to 200% by mass, more preferably in the range of 0% to 80% by mass, relative to the resin as a main component. In the case where the adhesion auxiliary layer exhibits the same or equivalent physical properties with respect to heat or electricity as those of the substrate adjacent to the adhesion auxiliary layer, these additives are not necessarily added. If the additives are used in amount of more than 200% by mass, there is a fear that the properties such as the strength inherent in the resin are deteriorated.

As described in the above, it is desirable to use an active species (compound) which can generate active centers capable of interacting with the photosensitive resin composition in the adhesion auxiliary layer. In order to generate the active centers, any energy may be applied, preferably, lights (ultraviolet radiation, visible radiation, X-rays and like), plasma (oxygen, nitrogen, carbon dioxide, argon and the like), heat, electricity and the like may be preferably used. Furthermore, the active centers may be generated by chemically decomposing the surface with the use of an oxidative liquid (potassium permanganate solution) or the like.

As examples of the active species, a thermal polymerization initiator and a photopolymerization initiator may be exemplified.

Examples of the thermal polymerization initiators include peroxide initiators such as benzoyl peroxide (BPO), t-butylperoxy-2-ethyl hexanate (PBO), di-t-butyl peroxide (PBD), t-butylperoxy isopropyl carbonate (PBI), n-butyl-4,4 bis(t-butylperoxy)valerate (PHV); azo-based initiators such as 2,2'-azobisisobutylonitrile, 2,2'-azobis (2-methylbutylonitrile), 1,1'-azobis(cyclohexane-1-carbonitrile), 2,2'-azobis(2-methylpropane), 2,2'-azobis(2-methylbutane), 2,2'-azobis(2-methylpentane), 2,2'-azobis(2,3-dimethylbutane), 2,2'-azobis(2-methylhexane), 2,2'-azobis(2,4-dimethylpentane), 2,2'-azobis(2,3,3-trimethylbutane), 2,2'-azobis(2,4,4-trimethylpentane), 3,3'-azobis(3-methylpentane), 3,3'-azobis(3-methyhexane), 3,3'-azobis(3,4-dimethylpentane), 3,3'-azobis (3-ethylpentane), dimethtyl-2,2'-azobis(2-methylpropionate), diethyl-2,2'-azobis(2-methylpropionate), di-tert-butyl-2,2'-azobis(2-methypropionate) and the like.

Further, the photopolymerization initiator may be low molecular or may be high molecular, and, generally known initiators may be used.

Examples of the low molecular photopolymerization initiators, include, for example, known radical generating agents such as acetophenones, benzophenones, Michler's ketone, benzoyl benzoate, benzoins, α-acyloxim ester, and tetra-methylthiuram monosulfide, trichloromethyl triazine and thioxanthone. Further, since a sulfonium salt, an iodonium salt and the like which are used as a photo-oxygen generator may usually act as a radical generator with exposure to light, these compounds may be used in the invention.

As the high molecular photopolymerization initiator, high molecular compounds having active carbonyl groups at the side chain thereof as recited in JP-A Nos. 9-77891 and 10-45927 may be used.

In general, the amount of the polymerization initiator to be contained in the substrate is preferably from 0.1% by mass to 50% by mass, and more preferably from 1.0% by mass to 30.0% by mass in terms of solid content.

Moreover, the photopolymerization initiator is preferably a high molecular photopolymerization initiator from the viewpoint of adhesiveness.

Moreover, for the purpose of increasing the sensitivity to the generation of active centers, a sensitizer may be added in addition to the photopolymerization initiator. Examples of sensitizers include n-butylamine, triethylamine, tri-n-butylphosphine and a thioxanthone derivative.

Here, it is preferred that the adhesion auxiliary layer is formed using a resin composition having excellent adhesiveness with the substrate, and an active species (compound) which generates active centers capable of interacting with the plating receptive layer (in particular, the specific polymerizable compound contained therein). In addition, in the case where the resin for forming the resin composition has sites which generate active centers capable of interacting with the plating receptive layer, it is not necessary to add the active species (compound), separately.

As the adhesion auxiliary layer in the invention, for example, when a substrate is composed of known insulating resins used as a material for a multilayer laminated board, a build-up board or a flexible board, from the viewpoint of the adhesiveness with the substrate, it is desirable that an insulating resin composition is also used as a resin composition used when forming the adhesion auxiliary layer.

Hereafter, exemplary embodiments in which the substrate is composed of an insulating resin and the adhesion auxiliary layer is formed from the insulating resin composition will be explained.

The insulating resin composition to be used when forming the adhesion auxiliary layer may contain the same resin as the electric insulating resin for constituting a substrate, or may contain a different resin from the electric insulating resin for constituting the substrate. However, it is desirable that the resins whose thermal-physical properties such as a glass transition point, a modulus of elasticity and a coefficient of linear expansion are close to each other are used, in order to further increase adhesiveness with the substrate which functions as an electric insulating layer, and in order to prevent the thermal stress due to the difference in thermal characteristics between the resins in the case of using different resins during thermal hysteresis such as an annealing treatment or solder reflowing treatment after the adhesion auxiliary layer is formed. More specifically, it is desirable to use the same kind of insulating resins as the insulating resin for constituting a substrate from the viewpoint of adhesiveness.

Moreover, in addition to the insulating resin composition, the adhesion auxiliary layer may contain an active species (compound) which generates active centers capable of interacting with the plating receptive layer and may also contain a compound which can interact with a substrate to form a chemical bond with the substrate. Further, a compound containing sites which can generate active centers capable of interacting with the plating receptive layer, and sites which can interact with a substrate to form a chemical bond to the substrate, may be used.

Moreover, as components other than the above, inorganic or organic particles may be added to the adhesion auxiliary layer in order to increase the strength of the adhesion auxiliary layer and to improve an electrical property.

In addition, the insulating resin in the invention means the resin which has an insulating property to such an extent that the insulating resin can be used for known insulating films, and accordingly, the insulating resin may be used in the invention, even though the resin is not perfectly insulative, provided that the resin has an insulating property in accordance with the intended purpose.

Examples of the insulating resin include a thermosetting resin, a thermoplastic resin, and a mixture thereof. Specifically, examples of the thermosetting resin include epoxy resins, phenolic resins, polyimide resins, polyester resins, bismaleimide resins, polyolefin-based resins, isocyanate-based resins, and the like.

Examples of the epoxy resins include cresol novolac type epoxy resins, bisphenol A type epoxy resins, bisphenol F type epoxy resins, phenol novolac type epoxy resins, alkylphenol novolac type epoxy resins, biphenol F type epoxy resins, naphthalene type epoxy resins, dicyclopentadiene type epoxy resins, epoxides of condensates of phenols and an aromatic aldehyde having a phenolic hydroxyl group, triglycidyl isocyanurate, alicyclic epoxy resins and the like. These resins may be used alone, or may be used in combination of two or more kinds, thereby, imparting excellent heat resistance and the like to the resultant product.

Examples of the polyolefin-based resins include polyethylene, polystyrene, polypropylene, polyisobutylene, polybutadiene, polyisoprene, cycloolefin-based resins, copolymers of these resins, and the like.

Examples of the thermoplastic resins include phenoxy resins, polyethersulfone, polysulfone, polyphenylenesulfone, polyphenylene sulfide, polyphenyl ether, polyetherimide, and the like.

Other thermoplastic resins include (1) 1,2-bis(vinylphenylene)ethane resin, or 1,2-bis(vinylphenyl)ethane resin or a modified resin of 1,2-bis(vinylphenyl)ethane resin and a polyphenylene ether resin (described in Satoru Amou, et al., Journal of Applied Polymer Science, Vol. 92, 1252-1258 (2004)), (2) liquid crystalline polymers (specifically, VECSTAR (trade name) manufactured by Kuraray Co., Ltd., and the like), and (3) fluororesins (PTFE), and the like.

The thermoplastic resin and the thermosetting resin each may be used independently, or may also be used in combination of two or more kinds. The combination is made for the purpose of complementing the shortcoming of the individual resin and exerting more excellent effects. For example, since thermoplastic resins such as polyphenylene ether (PPE) have low resistance to heat, the thermoplastic resins are alloyed with thermosetting resins. For example, products from alloying of PPE with epoxy and triallyl isocyanate, or alloying of a PPE resin, into which a polymerizable functional group is introduced, with another thermosetting resin, are used. Further cyanate esters are resins having the most excellent dielectric properties among the thermosetting resins, but the resins are infrequently used alone, and the resins are used as modified resins with epoxy resins, maleimide resins, thermoplastic resins and the like. Details relating to them are described in "Electronic Technology", No. 2002/9, pp. 35.

Furthermore, a mixture, which contains an epoxy resin and/or a phenolic resin as the thermosetting resin, and a phenoxy resin and/or polyethersulfone (PES) as the thermoplastic resin, is also used for improving the dielectric properties.

Further, as the insulating resin used for the adhesion auxiliary layer, it is also to use the resin which has a skeleton which generates active centers capable of interacting with a metal ion-adsorptive resin film. For example, a polyimide having polymerization initiating sites in a skeleton may be used as recited in Paragraph Numbers [0018]-[0078] in JP-A No. 2005-307140.

Furthermore, the adhesion auxiliary layer may contain a compound having a polymerizable double bond, specifically an acrylate or methacrylate compound, in order to facilitate crosslinking in a layer, and in particular, a polyfunctional compound is preferably used. In addition, as the compound having a polymerizable double bond, a resin obtained in such a manner that a part of a thermosetting resin or a thermoplastic resin, for example, an epoxy resin, a phenolic resin, a polyimide resin, a polyolefin resin, a fluororesin or the like, is subjected to a (meth)acrylation reaction using methacrylic acid, acrylic acid or the like, may also be used.

Various compounds in accordance with the intended purpose may be added to the adhesion auxiliary layer in the invention to such an extent that the effect of the invention is not impaired.

More specifically, for example, substances such as rubber and SBR latex which can relax stress at the time of heating, a binder for improving a layer property, a plasticizer, a surfactant, a viscosity adjusting agent and the like may be exemplified.

In the adhesion auxiliary layer in the invention, composites (composite materials) of a resin and other components may also be used to strengthen the properties such as mechanical strength, heat resistance, weather resistance, flame resistance, water resistance and electrical properties, of the resin films. Examples of the materials that may be used for producing the composite materials include paper, glass fiber, silica particles, phenolic resins, polyimide resins, bismaleimide triazine resins, fluororesins, polyphenylene oxide resins and the like.

Furthermore, in the adhesion auxiliary layer, if necessary, one, or two or more kinds of fillers that are used in general resin materials for wiring boards, may be compounded, examples of which include inorganic fillers such as silica, alumina, clay, talc, aluminum hydroxide and calcium carbonate, and organic fillers such as hardened epoxy resins, crosslinked benzoguanamine resins and crosslinked acrylic polymers.

One, or two or more kinds of various additives, including a colorant, a flame retardant, an adhesion-imparting agent, a silane coupling agent, an antioxidant, an ultraviolet absorbent and the like may be added to the adhesion auxiliary layer, if necessary.

When these materials are added to the adhesion auxiliary layer, it is preferred that any materials are added in the range of 0% to 200% by mass, more preferably in the range of 0% to 80% by mass, relative to the resin as a main component. In the case where the adhesion auxiliary layer exhibits the same or equivalent physical properties with respect to heat or electricity as those of the substrate adjacent to the adhesion auxiliary layer, these additives are not necessarily added. If the additives are used in amount of more than 200% by mass, there is a fear that the properties such as strength inherent in the resin are deteriorated.

As described in the above, it is desirable to use an active species (compound) which can generates active centers capable of interacting with the plating receptive layer in the adhesion auxiliary layer. In order to generate the active centers, any energy may be applied, preferably, lights (ultraviolet radiation, visible radiation, X-rays and like), plasma (oxygen, nitrogen, carbon dioxide, argon and the like), heat, electricity and the like may be preferably used. Furthermore, the active centers may be generated by chemically decomposing the surface with the use of an oxidative liquid (potassium permanganate solution) or the like. As an example of the active species, the thermal polymerization initiator and photopolymerization initiator which are added to the resin film (substrate) as described in the above may be exemplified. The amount of the polymerization initiator to be contained in the adhesion auxiliary layer is preferably from 0.1% by mass to 50% by mass, and more preferably from 1.0% by mass to 30% by mass in terms of solid content.

In general, the thickness of the adhesion auxiliary layer in the invention is preferably in the range of from 0.1 μm to 10 μm, and more preferably in the range of from 0.2 μm to 5 μm. When the adhesion auxiliary layer is provided, a sufficient adhesive strength with the substrate or the plating receptive layer adjacent thereto can be obtained as long as the thickness is in the above general range, and even if the adhesion auxiliary layer is thinner as compared with the case where an adhesive is commonly used, the adhesive strength equivalent to that of the case where the adhesive is commonly used can be attained. As a result, a metal film-coated material having a thin overall thickness and excellent adhesiveness can be obtained.

The surface of the adhesion auxiliary layer of the invention has preferably a surface roughness Rz of 3 μm or less, and more preferably Rz of 1 μm or less when measured by the ten point average height method in accordance with JIS B 0601 (1994), from the viewpoint of improving the physical properties of the plated metal film to be formed. If the surface smoothness of the adhesive auxiliary layer is within the above range, namely, in a state of high smoothness, the adhesive auxiliary layer can be favorably used when a printed circuit board having an extremely fine circuit (for example, a circuit pattern with a value of line/space of 25/25 μm or less) is manufactured.

The adhesion auxiliary layer is formed on the surface of the plating receptive layer, or when being used separately, on one surface of a resin film (substrate), with the use of known layer forming methods such as a coating method, a transfer method and a printing method.

In addition, when the transfer method is used, the transfer laminate composed of a two-layer structure of a specific polymerizable compound-containing layer (will be described later) which is used at the time of forming a plating receptive layer, and the adhesive auxiliary layer is prepared, and may be transferred onto the surface of a resin film at once by the laminating method.

With regard to the process for forming the adhesion auxiliary layer with use of the transfer method, first, a coating liquid or a varnish-form composition prepared by dissolving each component in an appropriate solvent, or mutually dissolving components in a solution form, is coated on a suitable temporary support and dried to form a transfer film for forming the adhesion auxiliary layer. Thereafter, the transfer film is laminated on a substrate, only the adhesion auxiliary layer is transferred onto the surface of the substrate, and the temporary support is removed to form the adhesion auxiliary layer. In a preferable exemplary embodiment of the invention, since the adhesion auxiliary layer is formed on the surface of the plating receptive layer, and both the adhesion auxiliary layer and the plating receptive layer are formed by being transferred on the surface of the substrate in order. At this time, by forming the adhesion auxiliary layer in a film-shape, the accuracy of the thickness of the layer becomes high, and the handling characteristics and positioning accuracy are also improved, so that the transfer method is suitably used when the adhesion auxiliary layer is formed on the plating receptive layer or the resin film in a film-shape.

Organic solvents commonly used may be used as a solvent used for preparing the coating liquid or the varnish-form composition. As the organic solvents, although both a hydrophilic solvent and a hydrophobic solvent may be used, a solvent which can dissolve a thermosetting resin or a thermoplastic resin used for forming the adhesion auxiliary layer is useful.

Specifically, examples of the solvents include alcohol-based solvents such as methanol, ethanol, 1-methoxy-2-propanol and isopropyl alcohol; ketone-based solvents such as acetone, methyl ethyl ketone and cyclohexanone; ether-based solvents such as tetrahydrofuran, ethylene glycol monomethyl ether, ethylene glycol monobutyl ether and ethylene glycol monoethyl ether; and nitrile-based solvents such as acetonitrile.

Further, N-methy-2-pyrrolidone, N,N-dimethyl acetamide, N,N-dimethyl formamide, ethylene glycol monomethyl ether, tetrahydrofuran, and the like may be used.

Furthermore, commonly used solvents including, for example, acetates such as ethyl acetate, butyl acetate, isopropyl acetate, cellosolve acetate, propylene glycol monomethyl ether acetate and carbitol acetate; cellosolves such as cellosolve and butyl cellosolve; carbitols such as carbitol and butyl carbitol; and aromatic hydrocarbons such as toluene, xylene, benzene, naphthalene, hexane and cyclohexane, and further, dimethyl formamide, dimethylacetamide and N-methyl pyrrolidone may be used alone, or may also be used in combination of two or more kinds thereof.

The compounding amount of the solvent used for the coating liquid or the varnish-form composition is preferably from 5 parts by mass to 2,000 parts by mass, and more preferably from 10 parts by mass to 900 parts by mass, relative to 100 parts by mass of the coating liquid or the varnish-form composition from the viewpoint of the viscosity, workability, coating property, drying time and working efficiency.

Further, the viscosity of the composition is preferably from 5 cps to 5,000 cps, more preferably from 10 cps to 2,000 cps, and still preferably from 10 cps to 1,000 cps, from the viewpoint of the coating property, workability, drying time, and the like.

The varnish-form composition, may be prepared by known methods by use of a mixer, a bead mill, a pearl mill, a kneader, a three rolls or the like. All compounding components may be added simultaneously, or may be added in an appropriate addition order. Further, some of compounding components may be added after being kneaded preliminary, if necessary.

The coating of the coating liquid or the varnish-form composition on a temporary support is performed by common methods, for example, such as a blade coat method, a rod coat method, a squeeze coat method, a reverse roll coat method, a transfer roll coat method, a spin coat method, a bar coat method, a air knife method, a gravure method and a spray coat method.

Further, the method of removing the solvent is not particularly limited, but is desirable to perform by evaporation of the solvent. It may be considered that methods such as heating, reduced pressure or ventilation is used as the method of evaporating the solvent. In particular, it is desirable to evaporate the solvent with heating from the viewpoint of the production efficiency and handling characteristics, and is still more desirable to evaporate the solvent with heating and ventilating.

For example, the coating liquid or the varnish-form composition is coated on one surface of the temporary support, which will be described hereinafter, and the solvent is removed by drying at temperatures of from 80° C. to 200° C. for 0.5 minute to 10 minutes, and the resultant coated film in a semi-cured state is used as a transfer film for forming the adhesion auxiliary layer.

Examples of the resin film in the case of forming only the adhesion auxiliary layer on the resin film, include polyolefin such as polyethylene, polypropylene and polyvinyl chloride; polyesters such as polyethylene terephthalate; resin sheets such as polyamide, polyimide and polycarbonate; converted paper having a controlled surface-adhesive property such as releasing paper; and metal foils such as copper foil and aluminum foil.

The thickness of the temporary support is generally from 2 µm to 200 µm, is preferably from 5 µm to 50 µm, and still more preferably from 10 µm to 30 µm. When the temporary support is too thick, there may be problems in handling characteristics or the like in the case of transferring with the use of the transfer film for forming the adhesion auxiliary layer actually.

The lamination conditions using the transfer film for the adhesion auxiliary layer is performed under a reduced pressure, and the method may be a batch-type system, or may be a continuous-type system using a roll-shaped transfer film for forming an adhesion auxiliary layer.

Although the lamination conditions in the above may vary with the viscosity of the composition for constituting the adhesive auxiliary layer in a molten state at the time of being heated, the thickness of the layer and the thickness of the substrate, in general, it is preferable to be laminated at a contact-pressurized temperature of from 70° C. to 200° C., a contact-pressure of from 1 kgf/cm$^2$ to 10 kgf/cm$^2$, and under a reduced pressure of 20 mmHg or less.

Further, although the surface smoothness of the resin composition after laminating is higher with an increase in the thickness of the temporary support, the thickness is desirably from 5 µm to 200 µm. When the thickness is less than 5 µm, the strength of the temporary support may become insufficient, and may cause cracks or creases, and when the thickness is more than 200 µm, material cost may increase. After laminating, the temporary support is peeled off after being cooled to temperatures close to room temperature.

When the transferring is performed by lamination, the temperature is preferably from 80° C. to 250° C., more preferably from 100°C. to 200° C., and still more preferably from 110° C. to 180° C. The pressure to be applied is preferably from 0.5 MPa to 3 MPa, and more preferably from 0.7 MPa to 2 MPa. The period for applying pressure is preferably from 10 seconds to one hour, and more preferably from 15 seconds to 30 minutes. Further, the lamination is preferably performed under a reduced pressure using a vacuum laminator or the like in order to enhance the adhesiveness. Furthermore, the laminated film for plating of the invention is used for forming extremely fine wiring, each of these multilayer films to be the materials therefor is preferably laminated in clean room.

When the adhesion auxiliary layer is provided on the surface of the resin film or the plating receptive layer by coating (printing), the method in which the coating liquid or the varnish-form composition is coated or printed on one surface of the substrate, is used. Here, it is possible that the coating or printing is repeated until a predetermined thickness is obtained.

When the adhesion auxiliary layer is formed by coating, the adhesion auxiliary layer and the specific polymerizable compound-containing layer (will be described later) used for forming the plating receptive layer in the above may be simultaneously coated in two layers.

For this coating, conventional methods may be used, for example, known methods such as a blade coat method, a rod coat method, a squeeze coat method, a reverse roll coat method, a transfer roll coat method, a spin coat method, a bar coat method, an air knife method, a gravure method, a spray coat method, a dispenser method and a dip method may be used.

When a printing method is used, in addition to the usual gravure printing method, a printing method such as an inkjet method may be used. Moreover, after coating onto a substrate, it is desirable to dry the coated layer sufficiently, in order to prevent the sticking between the substrate and the adhesion auxiliary layer, or between the sticking between the auxiliary layers each other.

Moreover, when the adhesion auxiliary layer is formed on the resin film, after the layer is formed, any energy may be applied to the layer to perform a curing treatment step. Although the energy to be applied is light, heat, pressure, electron beam or the like, in the exemplary embodiment, heat and light are generally used. In the case of heat, the heat at temperatures of 100° C. to 300° C. for 5 minutes to 120 minutes is desirably applied. Moreover, although the conditions of heat-curing may vary with the kind of materials for the resin film (substrate), the kind of the resin composition for forming the adhesion auxiliary layer and the like, and may vary with the curing temperature for these materials, but the conditions are preferably selected from the range of the temperatures of 120° C. to 220° C., and time period of from 20 minutes to 120 minutes.

This curing treatment step may be carried out immediately after the formation of the adhesion auxiliary layer, but the curing treatment step may be performed after each process of all the other steps is performed after the adhesion auxiliary layer is formed, provided that a preliminary curing processing is performed for about 5 minutes to 10 minutes after the adhesion auxiliary layer is formed.

The adhesion auxiliary layer may be subjected to a surface roughening treatment with a dry method and/or a wet method, for the purpose of improving the adhesiveness with the plating receptive layer adjacent to the adhesion auxiliary layer, or with the specific polymerizable compound used in forming the plating receptive layer. As the dry surface-roughening method, a mechanical polishing such as buffing and sandblasting, or plasma etching may be exemplified. On the other hand, as the wet surface-roughening method, treatment with chemicals such as the methods using oxidizers such as a permanganate, dichromate, ozone, hydrogen peroxide/sulfuric acid, and nitric acid; a strong base; and a resin swelling solvent and the like may be exemplified.

<Method of Manufacturing Metal Film-Coated Material>

The method of manufacturing the metal film-coated material using the above multilayer film includes at least the following process (a1)-process (a3):

process (a1); transferring a plating receptive layer containing a polymer which has a polymerizable group and a functional group capable of interacting with a plating catalyst or a plating catalyst precursor or a polymer precursor capable of forming a polymer which has a polymerizable group and a functional group capable of interacting with a plating catalyst or a plating catalyst precursor, with the use of the multilayer film for plating of the invention onto another substrate to form a board;

process (a2); applying the plating catalyst or a plating catalyst precursor to the plating receptive layer; and process (a3); performing plating on the plating catalyst or a plating catalyst precursor.

As described above, in process (a1), the plating receptive layer in the multilayer film for plating of the invention or the adhesion auxiliary layer formed on the surface thereof is provided on an arbitrary substrate by transfer process.

(Substrate)

The substrate to be transferred used in this process to form a board is formed in a film-like shape from a glass epoxy board, polyester, polyimide, thermosetting polyphenylene ether, polyamid, polyaramid, paper and liquid crystal polymer, which are generally used for an electronic board.

Further, any resins which constitute such a substrate capable of being formed in a film-like shape may be used, and, for example, a phenol resin, epoxy resin, imide resin, BT resin, PPE resin, tetrafluoroethylene resin, liquid crystal resin, polyester resin, PEN, aramid resin, polyamide resin, polyether sulfone, triacetyl cellulose, polyvinyl chloride, polyvinylidene chloride, polyethylene, polypropylene, polystyrene, polybutadiene and polyacethylen, may be exemplified.

In addition, when the metal film-coated material obtained according to the invention is used for forming a flexible printed circuit board, for example, it is desirable to use resin films such as a polyimide, liquid crystal polymer and polyethylene terephthalate which are usually used for the flexible printed circuit board.

Here, in the substrate, the surface of the substrate on which the plating receptive layer is formed, has preferably a surface roughness Rz of 5 μm or less and more preferably Rz of 1 μm or less measured by the ten point average height method in accordance with JIS B 0601 (1994) from the viewpoint of improving the physical properties of the metal film to be formed. If the surface smoothness of the substrate is within the above range, namely, in a state of high smoothness, the substrate can be favorably used when a printed circuit board having an extremely fine circuit (for example, a circuit pattern with a value of line/space of 25/25 μm or less) is manufactured.

Moreover, when the substrate is used in a flexural state as a film, the thickness of the substrate is preferably in the range of from 3 μm to 500 μm, more preferably in the range of from 5 μm to 300 μm, and still more preferably in the range of 7 μm to 200 μm.

In order to enhance the adhesiveness of the substrate to the plating receptive layer in the invention, for example, it is desirable that the substrate contains active centers capable of interacting with the specific polymerizable compound contained therein. More specifically, the active species which generates active centers may be added beforehand at the time of forming the substrate, or a skeleton which generates active centers may be contained in the molecules of the resin for constituting the substrate. For example, as a resin having a skeleton which generates active centers, a polyimide having polymerization initiation sites in a skeleton may be used as recited in JP-A No. 2005-307140.

In addition, when the adhesive auxiliary layer is provided between the substrate and the plating receptive layer, the addition of the active species is not necessarily required.

Here, it is desirable that the process (a1) includes: a process (a1-1) preparing, on a substrate, a polymerization initiating layer which contains a polymerization initiator or a functional group capable of initiating polymerization to form a board; and a process (a1-2) chemically bonding a polymer containing the functional group and the polymerizable group which interact with the plating catalyst or a plating catalyst precursor directly to the polymerization initiating layer, after the plating receptive layer is transferred to the polymerization initiating layer. The process (a1-1) is a process for forming the adhesion auxiliary layer, and the process (a1-2) is a process for applying energy.

(Polymerization Initiation Layer)

In the multilayer film for plating of the invention, as another method of enhancing chemical bonding formability with the plating receptive layer, a polymerization initiation layer containing an active species (compound) may be provided on the surface of a substrate. The polymerization initiation layer in the invention is preferably formed as a layer containing a polymerizable compound and a polymerization initiator.

The polymerization initiation layer in the invention may be formed by dissolving necessary components in a solvent capable of dissolving the components, and forming a film on the surface of a substrate by methods such as coating, and curing the film with heating or photoirradiation.

(a) Polymerizable Compound

The polymerizable compound to be used in the polymerization initiation layer may be any compound without particular limitation, as long as the compound has a good adhesiveness to the substrate, and forms a surface graft polymer by application of energy such as actinic ray irradiation. Specifically, a polyfunctional monomer may be used, and in particular, an exemplary embodiment, in which a hydrophobic polymer having a polymerizable group in the molecule is used, is preferable.

Examples of such a hydrophobic polymer include, specifically, diene-based homopolymers such as polybutadiene, polyisoprene and polypentadiene, homopolymers of allyl group-containing monomers such as allyl (meth)acrylate and 2-allyloxyethyl methacrylate;

dipolymer or multipolymers of styrene, (meth)acrylic acid ester, (meth)acrylonitrile and the like, containing a diene-based monomer such as butadiene, isoprene or pentadiene, or an allyl group-containing monomer as the constituent unit;

linear polymers or three-dimensional network polymers having carbon-carbon double bonds in the molecules, such as unsaturated polyesters, unsaturated polyepoxides, unsaturated polyamides, unsaturated polyacrylates, and high density polyethylene; and the like.

Additionally, in the present specification, in the case of referring to both or any one of "acryl and methacryl," the term may be denoted as "(meth)acryl."

The content of these polymerizable compounds is preferably in the range of 0% by mass to 100% by mass, and particularly preferably 10% by mass to 80% by mass, in terms of the solid content in the polymerizable layer.

(b) Polymerization Initiator

The polymerization initiation layer contains a polymerization initiator for exhibiting the polymerization initiation ability by energy applied thereto. The polymerization initiators used herein are recited in Paragraph Nos. [0043]-[0044] of JP-A No. 2007-154306, and initiators appropriately selected from the known polymerization initiators represented by those initiators may be used in accordance with the intended purpose. Among them, it is suitable to use photopolymerization from the viewpoint of production applicability, and accordingly, it is preferable to use a photopolymerization initiator.

The photopolymerization initiator may be any compound without particular limitation, as long as the photopolymerization initiator is active to actinic ray to be irradiated, and for example, although a radical polymerization initiator and an anionic polymerization initiator, a cationic polymerization initiator or the like may be used, the radical polymerization initiator is desirable from the viewpoint of reactivity.

The content of the polymerization initiator is desirably in the range of from 0.1% by mass to 70% by mass and particularly desirably in the range of from 1% by mass to 40% by mass in terms of solid content in the polymerization initiation layer.

Further, as the polymerization initiator, a photocationic polymerization initiator and a photoradical polymerization initiator, which will be explained in detail below, may be used.

-Photocationic Polymerization Initiator-

The photo cationic-polymerization initiator refers to the compound which generates an acid upon being irradiated with actinic ray or radiation ray, and known compounds and the mixtures thereof may be used, by suitably selecting therefrom.

As photocationic polymerization initiators, the compounds as recited in Paragraph Nos. [0043]-[0092] of JP-A No. 2006-274052 may be used.

-Photoradical Polymerization Initiator-

A photoradical polymerization initiator may be low molecular, or may be high molecular.

Examples of low molecular photopolymerization initiators, include, for example, known radical generating agents such as acetophenones, hydroxy alkylphenones, benzophenones, Michler's ketone, benzoyl benzoate, benzoins, α-acyloxim ester, and tetramethylthiuram monosulfide, trichloromethyl triazine and thioxanthone. Further, since a sulfonium salt, an iodonium salt and the like which usually act as a photoacid generator also act as a radical generator upon being irradiated with light, these compounds may be used in the invention.

As the high molecular photoradical polymerization initiator, high molecular compounds having an active carbonyl group, trichloromethyl triazine group and thioxanthone at the side chain thereof as recited in JP-A Nos. 9-77891 and 10-45927, Paragraph Numbers [0094]-[0107] of JP-A No. 2007-146103, and Japanese Patent Application No. 2006-264706, and Photochemistry & Photobiology, Vol.5, pp. 46 (1999), may be used.

As the photoradical polymerization initiator, a high molecular type photoradical polymerization initiator is preferably used from the viewpoint of graft-polymerizability. The weight average molecular weight of the high molecular type photoradical polymerization initiator is preferably 10,000 or more, and more preferably 30,000 or more. The upper limit of the weight average molecular weight is 100,000 from the view point of solubility. Moreover, when an epoxy resin is used as a polymerizable compound contained in the polymerization initiation layer, the high molecular type photoradical polymerization initiator may serve as the epoxy resin as well. As such a high molecular type photoradical polymerization initiator, the compounds as recited in Paragraph Numbers [0094]-[0107] of JP-A No. 2007-146103, and compounds represented by (26)-(30) below may be preferably used. In (26)-(30), x and y each represent a molar fraction, and x+y=100 (x≠0, y≠0).

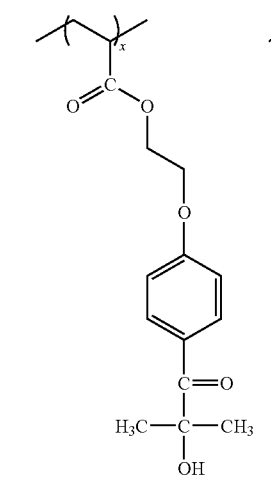

(26)

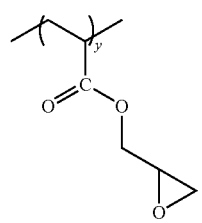

(27)

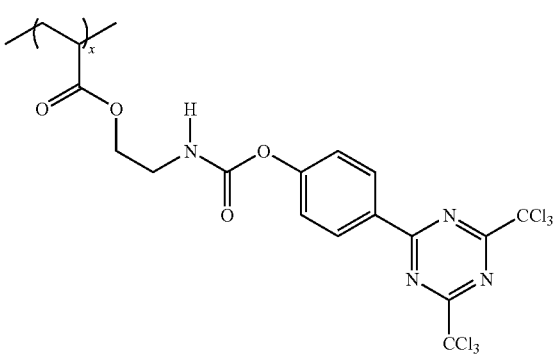

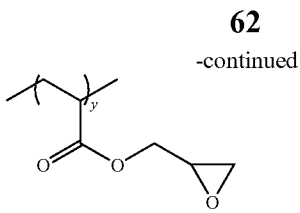

(28)

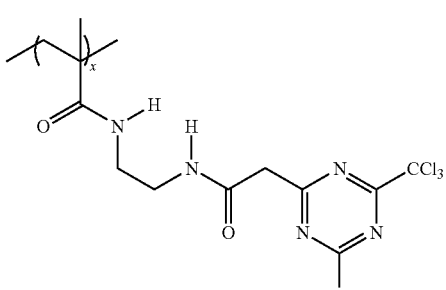

(29)

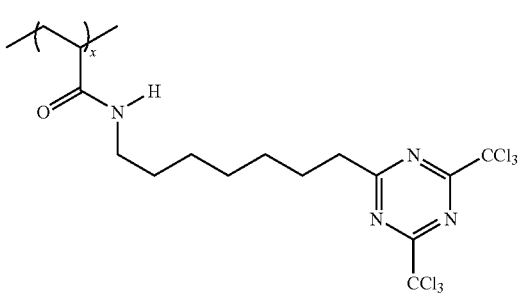

(30)

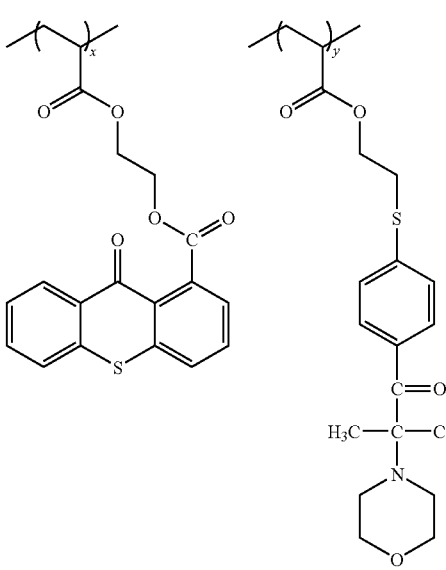

When the photoradical polymerization initiator is used, the content of the initiator is preferably from about 0.1% by mass to 50% by mass, and more preferably from about 1.0% by mass to 30.0% by mass with respect to the total solid content, in view of the graft polymerizability, the prevention of reduction in the strength of adhesiveness resulting from the graft polymerizability, and the prevention of occurrence of problems in the thermal property or electrical property such as reduction in Tg of the cured product, and an increase in the dielectric constant of the cured product.

The solvent that may be used when the polymerizable compound and the polymerization initiator are coated, is not particularly limited as long as the solvent can dissolve those components. From the viewpoint of the ease of drying and workability, a solvent having a boiling point which is not excessively high is preferable, and specifically, a solvent having a boiling point of about 40° C. to 150° C. may be selected.

More specifically, the solvents as recited in Paragraph No. [0045] of JP-A No. 2007-154306 may be used.

These solvents may be used alone or as mixtures. The concentration of solid components in the coating solution is suitably from 2% by mass to 50% by mass.

The coating amount in the case of forming a polymerization initiation layer on a substrate, from the viewpoint of sufficiently exhibiting the polymerization initiation ability and preventing layer-removal by maintaining the film formability, is preferably in the range of from 0.1 g/m$^2$ to 20 g/m$^2$, and more preferably 1 g/m$^2$ to 15 g/m$^2$, in terms of mass after drying.

When the polymerization initiation layer is formed in the invention, as described in the above, the polymerization initiation layer is formed by arranging the composition for polymerization initiation layer formation on a substrate by coating or the like, and removing the solvent therefrom to form a film, but at this point, it is preferable to cure the film by performing heating and/or photoirradiation. In particular, after the polymerizable compound is dried with heating, the polymerizable compound is preliminarily cured with photoirradiation beforehand to some extent, and a state in which the polymerization initiation layer is detached overall after the completion of the graft polymerization, can be effectively avoided, and it is desirable.

The heating temperature and time may be selected so as to remove the coating solvent sufficiently, but in view of production suitability, a temperature of 100° C. or less and a drying time of 30 minutes or less are preferable, and it is more preferable to select heating under the condition in the range of a drying temperature of 40° C. to 80° C. and a drying time of 10 minutes or less.

In the photoirradiation which is optionally carried out subsequently after heating and drying, a light source used in the graft polymerization reaction, which will be described later, may be used. In the subsequent graft polymerization process, from the viewpoint that the formation of bonding of the active centers to the graft chain in the polymerization initiation layer performed by applying energy is not inhibited, it is preferable to perform the photoirradiation to such an extent that even if the polymerization compound which is present in the polymerization initiation layer is partially radical-polymerized, but is not completely radical-polymerized. The time for photoirradiation may vary depending on the light intensity of the light source, but in general, is preferably within 30 minutes. As the criteria for such preliminarily curing, it may be said that the film residual ratio after washing with solvent is 10% or less, and the initiator residual ratio after preliminary curing is 1% or more.

Any energy may be applied to order to increase adhesiveness due to interaction, and this will be described hereinafter in detail.

(Application of Energy)

As the method of applying energy for example, a method of utilizing irradiation with radiant rays such as heat or light exposure may be used. Examples of the methods include photoirradiation with a UV lamp or visible light, heating with a hot plate, and the like. The light sources that may be used for the methods include, for example, a mercury lamp, a metal halide lamp, a xenon lamp, a chemical lamp, a carbon arc lamp and the like. Examples of the radiation rays include electron beam, X-rays, ion beam, far-infrared rays, and the like. Furthermore, g-rays, i-rays, deep-UV light, and high density energy beam (laser beam) may also be used.

Suitable examples of generally used specific exemplary embodiment include direct imagewise recording with a thermal recording head or the like, scanning exposure to infrared laser, high illumination intensity flash exposure to a xenon discharge lamp or the like, and, exposure to an infrared lamp and the like.

The time required for applying energy may vary with the amount of production of the desired graft polymer and the light source, but the time is usually from 10 seconds to 5 hours.

In the case of applying energy with light exposure, the exposure power is preferably in the range of from 500 mJ/cm$^2$ to 5,000 mJ/cm$^2$, for facilitating graft polymerization, and for suppressing the decomposition of the produced graft polymer.

If a polymer having an average molecular weight of 20,000 or more and a degree of polymerization of 200-mers or more is used as the specific polymerizable compound, the graft polymerization process proceeds easily with exposure to low energy radiation, and thus decomposition of the produced graft polymer may be further suppressed.

A polymer which is a specific polymerizable compound that interacts with a plating catalyst or a plating catalyst precursor is generated by applying energy on a substrate or polymerization initiation layer formed on the surface of a substrate or an adhesion auxiliary layer formed on the surface of a substrate, so that a plating receptive layer formed from the polymer may be bonded to the substrate or to the adhesion auxiliary layer firmly.

The thickness of the plating receptive layer thus obtained is as thinner as possible, from the viewpoint of less influence on the electrical property of metal wiring and suppressing increase in costs, and is preferably from 0.01 μm to 10 μm, and more preferably from 0.2 μm to 2 μm.

In addition, when the plating receptive layer is formed on the adhesion auxiliary layer, it is desirable that the total thickness of the adhesion auxiliary layer and the plating receptive layer is in the above range.

For example, in the case where the decomposition of the moiety of the polymerizable group is 50% or less, when the plating receptive layer obtained is immersed in an alkaline solution with a pH value of 12 and the solution is stirred for one hour, the resin film may be washed with a high alkaline solution.

As examples of details of the method of manufacturing the metal film-coated material according to the invention, the method of forming the metal film-coated material by transferring the plating receptive layer and the adhesion auxiliary layer, separately, will be described, This method includes; onto one surface or both surfaces of a substrate on which a metal film is to be provided, an insulation layer or a circuit board having a predetermined circuit pattern thereon, a process (I) in which an adhesion auxiliary layer is adhered by a transfer method, and energy is applied thereto to fix the adhesion auxiliary layer onto one surface or both surfaces of the substrate, the insulation layer or the circuit board having a predetermined circuit pattern thereon; a process (II) in which on the surface of the adhesion auxiliary layer, a plating receptive layer is provided by a transfer method; and a process (III) in which an interaction between the plating receptive layer and the adhesion auxiliary layer is caused to firmly adhere the both layers each other.

Thereafter, a process (a2) in which a plating catalyst or a plating catalyst precursor is applied to a polymer compound in the plating receptive layer; and a process (a3) in which a conductive layer is plated utilizing the plating catalyst or a plating catalyst precursorf, are performed, thereafter, a heating treatment after the conductive layer is optionally formed, is performed in random order, if necessary,.

Moreover, a drilling process for forming holes in the board, the insulation layer or the circuit board having a predetermined circuit pattern thereon may be provided, if necessary. Although each process may be carried out in sequence, or may be omitted, if not necessary, the process forming the conductive layer is performed in such a manner that (II) the transfer process of the plating receptive layer is preformed, (I) in the process of forming the adhesive auxiliary layer, simultaneously or the later process; or (III) an energy applying process is performed for causing an interaction between the plating receptive layer and the adhesion auxiliary layer to firmly adhere the both layers with each other, (I) in the process of forming the adhesive auxiliary layer simultaneously, or (II) in the process of the transfer process of the plating receptive layer simultaneously or the later process; or (a3) the conductive layer is formed by plating is preformed (a1) in the process after the process of forming the plating receptive layer.

Moreover, when the plating receptive layer can be firmly adhered directly to one surface or both surfaces of the substrate as a base material, the insulation layer or the circuit board having a predetermined circuit pattern thereon, by interaction with the conductive layer, the process (I) may be omitted, and the process (II) is made to the process for providing the plating receptive layer by transfer one surface or both surfaces of the substrate as a base material, the insulation layer or the circuit board having a predetermined circuit pattern thereon, and after this process, the wiring board is prepared similarly.

Moreover, when the transfer film in the form of the adhesion auxiliary layer and the plating receptive layer being laminated beforehand is used, the processes of the above (I) and (II) can be performed simultaneously.

In this process, the plating receptive layer and the adhesion auxiliary layer can be patterned on a temporary support, a pattern latent image can be formed, and the pattern can be also transferred.

Moreover, it is also possible to use methods in which when the plating receptive layer and the adhesion auxiliary layer are transferred, the method in which energy is applied in a pattern form and the pattern is transferred, or energy is applied to one of the plating receptive layer and the adhesion auxiliary, and the pattern is transferred and the entire face of the other is transferred.

According to these methods, since the plating receptive layer is formed in a pattern form from the beginning, a patterned metal film can be formed on any substrate surfaces by performing the process (a2) and the process (a3), which will be described below.

In the more detailed explanations, as a method of forming the patterned latent image of the plating receptive layer and the adhesion auxiliary layer on a temporary support, for example, if the adhesion auxiliary layer is patterned with a pattern formed of a cured portion and uncured portion on the temporary support with the use of a device such as a thermal pen, a thermal head and an IR laser which are capable of locally heating and curing the adhesion auxiliary layer, and the pattern can be transferred by utilizing the difference in the adhesiveness between the cured portion and the uncured portion. In this case, it is preferred that the shape of the uncured portion is patterned in a desired shape of the plated metal pattern.

When the plating receptive layer is patterned, a patterned latent image is beforehand formed by being locally irradiated with UV light or the like on a temporary support, and the pattern can be transferred by controlling the adhesiveness or reactivity to the adhesion auxiliary layer or the substrate.

For example, the portions of the plating adhesive layer to be transferred are not irradiated with UV light, so that the adhesiveness or reactivity of the portions to the adhesion auxiliary layer or the substrate is maintained, but, the adhesiveness or reactivity of the portions where UV light is irradiated is lost, and the portions other than the patterned portions can be easily peeled off through a later peeling-off process or the like.

Thus, patterning is performed on a temporary support and thereafter, the patterned latent image formed on the temporary support can be transferred onto a desired surface of the substrate by a transfer process such as a usual laminating process or the like.

As the method of transferring a pattern by applying energy in a patterned form when the plating receptive layer or the adhesive auxiliary layer is transferred, the method in which after a protective film is peeled off, and the plating receptive layer or the adhesive auxiliary layer is temporarily adhered to a substrate or an insulation layer onto which the layer is to be adhered, and pressure or heat is applied from the temporary support side with the use of a device such as a thermal pen, a thermal head and an IR laser which are capable of locally heating and curing, may be used.

In the case of the plating receptive layer, after a protective film is peeled off, and the plating receptive layer is temporarily adhered to the substrate or an adhesion auxiliary layer onto which the plating receptive layer is to be adhered, and is irradiated only in the portions to be patterned with active energy such as UV light, so that transfer and reaction can be simultaneously performed.

Moreover, when the substrate is not directly reactive with the plating receptive layer, the adhesion auxiliary layer is patterned on the temporary support in some way, and after the adhesion auxiliary layer is transferred in a pattern, the plating receptive layer is transferred thereon without being patterned, and irradiated with energy so that the plating receptive layer and the adhesive auxiliary layer only in the portion where the adhesive auxiliary layer is present are allowed to react with each other, to be adhered and fixed, and thereafter, by being peeled off, the portion of the plating receptive layer where the plating receptive layer is not adhered due to interaction can be removed, thereby a patterned plating receptive layer can be formed.

Further, the adhesion auxiliary layer is transferred without being patterned, after a plating receptive layer is patterned on a temporary support, the patterned layer is transferred, and thereby a patterned plating receptive layer can be formed.

Furthermore, a combination of a layer formation by usual coating and a pattern transfer may be used in such a manner that, for example, the adhesion auxiliary layer is formed by coating without being patterned and thereon, the plating receptive layer formed by being patterned on a temporary support is transferred, so that a patterned plating receptive layer is formed. Alternatively, it is possible that an adhesion auxiliary layer is formed in a pattern shape by pattern transferring, and thereon, a plating receptive layer is formed by usual coating method.

When a pattern is formed on a temporary support, as a base film which can be used for the temporary support or the protective film, of the temporary support and the protective film, as described hereinbefore in the transfer film for forming the adhesion auxiliary layer and the transfer film for forming a protective layer, it is effective to select a temporary support which is not softened with heat in the case of a patterned latent image formation using heat, or a temporary support which has high light transmittance and smooth surface in the case of a patterned latent image formation using light. Furthermore, it is more preferable to select a temporary support which has less expansion or contraction at the time of forming a patterned latent image.

In addition, the surface of a sheet for constituting the temporary support may be subjected to a releasing treatment in addition to a matting treatment and a corona treatment. For example, when the pattern transfer is performed with heating, the pattern transfer can be improved by being subjected to a releasing treatment with the use of a material which is fused with heating. Further, a cushion layer may be provided in order to reduce transfer irregularities.

[Process (a2)]

In this process, the plating catalyst or a plating catalyst precursor is adsorbed to the plating receptive layer formed in the process (a1).

In this process, the plating catalyst liquid is suitably used. The plating catalyst liquid contains a plating catalyst or a plating catalyst precursor and organic solvent selected so as to be suitable for the plating process.

First, a plating catalyst is described.

(Electroless Plating Catalyst)

In regard to the electroless plating catalyst used in the invention, any compound may be used as long as it serves as active nuclei during electroless plating. Examples thereof include metals having catalytic ability for the self-catalytic reduction reaction (those known as metals capable of electroless plating with lower ionization tendency than that of Ni), and the like. Specific examples include Pd, Ag, Cu, Ni, Al, Fe, Co and the like. Among them, metals capable of forming a multidentat are preferable. In particular, from the viewpoint of the number of kinds of the functional group capable of forming a multidentat and the degree of the catalytic ability, Pd is particularly preferable.

This electroless plating catalyst may be used in the form of a metal colloid. In general, the metal colloid may be produced by reducing metal ions in a solution containing a surfactant carrying an electrical charge or a protective agent carrying an electrical charge. The electrical charge of the metal colloid may be controlled by the surfactant or protective agent used herein.

(Electroless Plating Catalyst Precursor)

As the electroless plating catalyst precursor used in this process, any compound may be used without particularly limitation as long as the compound may become an electroless plating catalyst by chemical reaction. In most cases, metal ions of those metals, which are referable as the electroless plating catalysts, are used. When a metal ion that is an electroless plating catalyst precursor, is reduced through reduction reaction, a zero-valent metal which is an electroless plating catalyst is formed. The metal ion which is an electroless plating catalyst precursor may be converted to zero-valent metal through a separate reduction reaction after being applied to the polymer layer and before being immersed into an electroless plating bath, to obtain an electroless plating catalyst, or may be immersed in an electroless plating bath while still being an electroless plating catalyst precursor, and is converted to metal (electroless plating catalyst) by the action of a reducing agent in the electroless plating bath.

Actually, the metal ion as the electroless plating precursor is applied onto the cured product layer which has plating catalist receptivity with the use of a metal salt. The metal salt to be used is not particularly limited as long as it may be dissolved in an appropriate solvent to be dissociated into a metal ion and a base (anion). Specific examples thereof include $M(NO_3)_n$, $MCl_n$, $M_{2/n}(SO_4)$, $M_{3/n}(PO_4)$ and M(OAc)n (wherein M represents an n-valent metal atom and Ac represents an acetyl group), and the like. As the metal ions, metal ions formed by the dissociation of the above metal salts may be suitably used. Specific examples thereof include, for example, Ag ion, Cu ion, Al ion, Ni ion, Co ion, Fe ion, and Pd ion. Among them, a metal ion capable of forming a multidentat is preferable. In particular, from the viewpoint of the number of kinds of the functional group capable of forming a multidentat and the catalytic ability, Pd ion is preferable.

(Other Catalysts)

In the invention, in regard to the process (a3), which will be described below, as the catalyst used to directly perform electroplating to the plating catalyst receptive cured product layer, to which the plating catalyst is applied, without performing electroless plating, a zero-valent metal may be used. Examples of the zero-valent metal include Pd, Ag, Cu, Ni, Al, Fe, Co and the like. Among them, those capable of forming a multidentat are preferable. In particular, from the viewpoint of the adsorptivity (adherence) to the interactive group (cyano group) and the degree of the catalytic ability, Pd, Ag and Cu are preferable.

The addition amount of the plating catalyst or a plating catalyst precursor in the plating catalyst liquid is suitably determined in accordance with the intended purpose, but, in general, is desirably in the range of from 0.01% by mass to 10% by mass, more desirably from 0.1% by mass to 5% by mass, and most desirably from 0.5% by mass to 2% by mass. Since in the above range of the addition amount, sufficient adsorptivity of the plating catalyst or the plating catalyst precursor to a desired plating catalyst receptive area and the suppressibility of surface adherence to the exposed area of the substrate are balanced, so that an excellent selective adsorption of the catalyst can be attained, and as a metal layer pattern formed in the subsequent plating process, a high definition pattern can be formed.

(Organic Solvent)

An organic solvent is contained in the plating catalyst liquid in the invention. By containing this organic solvent, the permeability of the plating catalyst or the precursor metal thereof into the hydrophobic cured product layer can be improved, and the plating catalyst or a plating catalyst precursor can be effectively adhered to the interactive group contained in the cured product layer.

The solvent used for preparing the plating catalyst liquid in this process is not specifically restricted, as long as the solvent can permeate in the cured product layer formed from the photosensitive resin composition, but the water-soluble organic solvent which will be described later in detail is preferable, since water is generally used as a main solvent (dispersion medium) for a plating catalyst liquid. However, even if an organic solvent is a common "non-aqueous" solvent, when the solvent can be dissolved in water within the range of the solvent content, which will be described later, as far as water is a main component, the organic solvent is not limited to the water soluble organic solvent, but a "non-aqueous" organic solvent may also be used.

(Water Soluble Organic Solvent)

Water soluble organic solvent used for the plating catalyst solution according to the invention is not specifically restricted, as long as the solvent dissolves in water in an amount of 1% by mass or more. Examples of the water soluble organic solvent include, for example ketone-based solvent, ester-based solvent, alcohol-based solvent, ether-based solvent, amine-based solvent, thiol-based solvent and halogen-based solvent.

As ketone-based solvent, acetone, 4-hydroxy-4-methyl-2-pentanone, γ-butyrolactone and hydroxyacetone are exemplified.

As ester-based solvent, ethyl acetate, ethyl 2-(2-ethoxyethoxy)acetate, ethylene glycol monomethyl ether acetate, diethylene glycol monoethyl ether acetate, methyl cellosolve acetate, ethyl 2-hydroxyethyl acrylate, hydroxypropyl acrylate, methyl glycolate and ethyl glycolate are exemplified.

As alcohol-based solvent, ethanol, isopropyl alcohol, normal propyl alcohol, 3-acetyl-1-propanol, 2-(allyloxy)ethanol, 2-aminoethanol, 2-amino-2-methyl-1-propanol, (±)-2-amino-1-propanol, 3-amino-1-propanol, 2-dimethylaminoethanol, 2,3-epoxy-1-propanol, ethylene glycol, 2-fluoroethanol, diacetone alcohol, 2-methylcyclohexanol, 4-hydroxy-4-methyl-2-pentanone, glycerin, 2,2',2"-nitrilotriethanol, 2-pyrdine methanol, 2,2,3,3-tetrafluoro-1-propanol, 2-(2-aminoethoxy)ethanol, 2-[2-(benzyloxy)ethoxy]ethanol, 2,3-butanediol, 2-butoxyethanol, 2,2'-thiodiethanol, 1,3-butanediol, 1,4-butanediol, 2,3-butanediol, 2-methyl-2,4-pentanediol, 1,3-propanediol, diglycerin, 2,2'-methyliminodiethanol and 1,2-pentanediol are exemplified.

As ether-based solvent, bis(2-ethoxyethyl)ether, bis[2-(2-hydroxyethoxy)ethyl]ether, 1,2-bis(2-methoxyethoxy)ethane, bis[2-(2-methoxyethoxy)ethyl]ether, bis(2-methoxyethyl)ether, 2-(2-butoxyethoxy)ethanol, 2-[2-(2-chloroethoxy)ethoxy]ethanol, 2-ethoxyethanol, 2-(2-ethoxyethoxy)ethanol, 2-isobutoxy ethanol, 2-(2-isobutoxyethoxy)etahnol, 2-isopropoxyethanol, 2-[2-(2-methoxyethoxy)ethoxy]ethanol, 2-(2-methoxyethoxy)ethanol, 1-ethoxy-2-propanol, 1-methoxy-2-propanol, tripropylene glycol monomethyl ether, methoxy acetate and 2-methoxy ethanol are exemplified.

As glycol-based solvent, diethylene glycol, triethylene glycol, ethylene glycol, hexaethylene glycol, propylene glycol, dipropylene glycol and tripropylene glycol are exemplified.

As amine-based solvent, N-methyl-2-pyrolidone and N,N-dimethyl formamide are exemplified.

As thiol-based solvent, mercaptoacetic acid and 2-mercaptoethanol are exemplified.

As halogen-based solvent, 3-bromobenzylalcohol, 2-chloroethanol and 3-chloro-1,2-propanediol are exemplified.

Other than the above examples, various organic solvent shown in the following table may be used as water soluble organic solvent.

TABLE 1

| | | |
|---|---|---|
| Acrylic acid | Ethyl 2-(dimethylamino)acrylate | Acetylmethylcarbinol |
| 1-amino-4-methylpiperazine | 3-aldehydepyridine | Isobutyric acid |
| Aluminium ethyl acetoacetate diisopropylate (that of water soluble type) | | Ethyl glycol |
| Ethylene glycol monobutyl ether | Ethylene chlorohydrin | N-ethylmorpholine |

TABLE 1-continued

| | | |
|---|---|---|
| Ethylenediamine | 3-ethoxy propylamine | Formic acid (that of 86% or more) |
| Isoamyl formate | Acetic acid | 1,4-diaminobutane |
| 1,2-diaminopropane | 1,3-diaminopropane | 3-diethylamino-propylamine |
| N,N-diethylethanolamine | cyclohexylamine | N,N-dimethylacetamide |
| Di-n-butoxy-bis(triethanolaminato)titanium | | Dimethylamino-propylamine |
| 2-dimethylaminoacetoaldehyde dimethyl acetal | | N,N-dimethyl ethanol amine |
| 2,5-dimethyl pyrazine | Pyrethrum (for stored grain: emulsion) | Hydrated hydrazine (that of 79% or less) |
| Sodium alcoholate (liquid) | Tetramethyl-1,3-diaminopropane | Sodium methoxide |
| 1,1,3-trihydrotetrafluoro-propanol | Ethyl lactate | Methyl lactate |
| α-picoline | β-picoline | γ-picoline |
| Hydrazine (that of 79% of less) | Propionic acid | Propylene chlorohydrin |
| Benzylaminopurine (3% emulsion) | Trimethyl borate | Methylaminopropyl-amine |
| N-methylpiperazine | 2-methylpyrazine | 3-methoxypropylamine |
| 2-mercaptoethanol | Morpholine | Diethylenetriamine |
| N,N-dimethyl acrylamide | Dimethylaminopropyl methacrylamide | Dimethylsulfoxide |
| N,N-dimethylamino-propyl acrylamide | | (−)-D-diisopropyl tartrate |
| Hydrated hydrazine (that of 80% or more) | Sulfolane(anhydride exists in a solid state, which is non-dangerous material) | Thioglycolic acid |
| Thiodiglycol | Tetraethylene pentamine | n-tetradecane |
| N,N,N',N'-tetramethyl-1,6-hexamethylene diamine | | Triethyl phosphate (TEP) |
| Triethylene glycol | Triethylene tetramine | Trimethyl phosphate |
| d-valerolactone | Bisaminopropyl piperazine | Hydrazine (that of 80% or more) |
| 2-hydroxyethyl acylate | 2-hydroxyethyl aminopropylamine | Hydroxyethyl pyperazine |
| 4-hydroxy-2-butanone | Vinyltris(β-methoxyethoxy)silane | 2-pyridine methanol |
| 3-pyridine methanol | 4-pyridine methanol | Pyruvic acid |
| Phenethylamine | Formamide | 1,3-butanediol |
| 1,4-butanediol | Butyldiglycol | γ-butyrolactone |
| Furfuryl alcohol | Hexylene glycol | Benzylamine |
| Pentaethylene hexamine | Polyethylene glycol diglycidyl ether (that of n is about 13 or less) | |
| Polypropylene glycol diglycidyl ether (that of n is about 11 or less) | | Methacrylic acid |
| 2-hydroxyethyl methacrylate | Methylimino-bispropylamine | N-methylethanol-amine |
| N-methyl-N,N'-diethanolamine | 3-methyl-3-methoxybutyl acetate | β-mercapto-propionic acid |
| Monoethylene glycol acetate | | |

Further, as organic solvent which can be used other than above, specifically, methyl acetoacetate, ethyl acetoacetate, ethylene glycol diacetate, cyclohexanone, acetylacetone, acetophenone, 2-(1-cyclohexenyl), propylene glycol diacetate, triacetin, diethylene glycol diacetate, dioxane, N-methyl pyrrolidone, dimethyl carbonate, dimethyl cellosolve and the like may be used. From the viewpoint of the compatibility of the plating catalyst or the plating catalyst precursor, and the hydrophobic cured product layer, in particular, combination of acetone, dimethyl carbonate and dimethyl cellosolve is desirable.

Further, as solvents which can be used in combination, diacetone alcohol, methyl cellosolve, ethyl cellosolve, ethylene glycol tertiary butylether, tetrahydrofuran, 1,4-dioxane, n-mehyl-2-pyrrolidone and the like are exemplified. In addition, with respect to the non-water-soluble solvent contained in the above exemplified solvents, the mixing thereof to the solubility limit to water is permissible. For example, mixing up to 12.5% in the case of dimethyl carbonate, mixing up to 7.2% in the case of triacetin and mixing up to 9% in the case of cyclohexanone, with water are possible.

Among above water soluble organic solvents, as one of preferable embodiments, from the view point of less concern of oxidation due to the catalytic metal, organic solvent not containing alcohol, such as ketone-based solvent, ester-based solvent and ether-based solvent is preferable from the view point of storage stability of the solution as catalytic solution. In particular, acetone, dimethyl carbonate, ethylene glycol dimethyl ether, ethyl 2-(2-ethoxyethoxy) acetate, 1-acetoxy-2-methoxyethane, bis(2-ethoxyethyl)ether (also refer to as diethylene glycol diethyl ether), 1,2-bis(2-methoxyethoxy)ethane, bis[2-(2-methoxyethoxy)ethyl]ether and bis(2-methoxyethyl)ether (also refer to as diethylene glycol dimethyl ether) are preferably exemplified.

The content of the solvent is desirably in the range of from 0.5% by mass to 40% by mass, more desirably from 5% by mass to 30% by mass, and particularly desirably from 5% by mass to 20% by mass, relative to the total quantity of the plating catalyst liquid.

Further, when solvent is water soluble organic solvent, which is preferable embodiment, from the view point of permeability to the substance to be plated, which will be described later, the content is desirably in the range of from 0.1% by mass to 40% by mass, more desirably from 5% by mass to 40% by mass relative to the total quantity of the plating catalyst liquid.

In the above range, while the penetration of the plating catalyst or the plating catalyst precursor into the substrate in an exposed area (area where cured product is not formed) and undesirable dissolution or erosion of the board of the board are suppressed, the permeability of the catalyst liquid into the hydrophobic cured product surface layer having catalyst receptivity and the adsorptivity are maintained, and metal deposits not only on the surface layer but onto the inside in the vicinity of the surface layer of the cured product layer, so that the adhesiveness at the interface between the substrate and the metal can be sufficiently maintained.

In the plating catalyst liquid of the invention, other additives in addition to plating catalyst or plating catalyst precursor and water which is a main solvent, may be contained in accordance with the intended purpose to such an extent that the effect of the invention is not impaired.

As the other additives, the following compounds may be exemplified.

For example, acids (inorganic acids such as hydrochloric acid and nitric acid; organic acids such as acetic acid and citric acid), swelling agents (organic compounds such as ketone, aldehyde, ether, ester and the like), and surfactants (anionic, cationic, amphoteric, nonionic, and low molecular or high molecular), and the like may be exemplified.

It is preferred that water which is an essential component and main solvent in the plating catalyst liquid of the invention does not contain impurities, and from such a viewpoint, RO water, deionized water, distilled water and purified water are preferably used, and, in particular, deionized water and distilled water are preferably used.

In order to adsorb metal as the metal catalyst, or metal salt as the precursor of the plating catalyst to the hydrophobic cured product surface layer, a catalyst liquid according to the invention is prepared, and the catalyst liquid is coated on the board surface formed from a plating catalyst receptive layer, or the board is immersed in the catalyst liquid.

In addition, in the above process (a1), when the composition containing the specific polymerizable compound is brought into contact with the substrate, the method in which metal ions are added to the composition, may be used. In addition, when this method is used, the process (a1) and process (a2) in the invention can be carried out in one step.

In this process, when the plating catalyst or the plating catalyst precursor is brought into contact with the plating receptive layer, the electroless plating catalyst or the plating catalyst precursor may be adsorbed to the functional group having metal ion adsorptivity in the resin film, with the use of the interaction based on intermolecular force such as van der Waals force, or the interaction based on the coordinate covalent bonding with lone pair electrons.

In view of sufficiently achieving such adsorption, the metal ion concentration in the solution or composition, is preferably in the range of 0.01% by mass to 50% by mass, and more preferably in the range of 0.1% by mass to 30% by mass. The contact time is preferably about 1 minute to 24 hours, and more preferably about 1 minute to 1 hour.

(Washing)

Thus, after the plating catalyst or the plating catalyst precursor is adsorbed to the interactive group, in order to remove excess plating catalyst or the plating catalyst precursor adhered to the plating receptive layer, it is preferable to wash the surface of the board after the board contacts the plating catalyst liquid.

Since the washing after the adsorption of the catalyst is to remove excess plating catalyst or the plating catalyst precursor, which is adhered to the surface of the board and is not adsorbed particularly by the interaction or the like, the surface is washed with any liquid such as water, as long as the liquid does not exert any adverse effect on the subsequent process even if the liquid remains on the surface of the board, but from the viewpoint of increasing the removal efficiency of adhered metal fine particles or metal ions, it is preferable to use a liquid, which does not contain the plating liquid of the precursor thereof, namely, a washing liquid containing an organic solvent in a solvent containing water as a main component, and more preferably to use a washing liquid containing the water-soluble organic solvent used in the preparation of the plating catalyst liquid in an amount of from 0.5% by mass to 40% by mass.

[Process (a3)]

In the process (a3), a plated metal film is formed by performing plating after metal ions adsorbed in the plating receptive layer is reduced.

As the type of plating performed in this process, electroless plating, electroplating or the like may be exemplified, and the plating method may be selected based on the quantity and density of the metal deposited by reducing the metal ions.

Among them, in the invention, it is preferable to perform the electroless plating, from the viewpoint of the formability of an organic-inorganic hybrid structure in the resin film and the enhancement of adhesiveness of the plating metal film. Further, in order to obtain a plating layer with a desired thickness, in a more preferable exemplary embodiment, the electroplating after the electroless plating is performed.

Here, the reduction method of metal ion is explained.

The reducing agent used for reduction of metal ions, is not specifically limited, but boron-based reducing agents such as sodium borohydride (tetrahydroborate), dimethylamine borane; formaldehyde, hypophosphorous acid, hydrazine and the like may be used.

Although such reducing agents can be suitably selected in relation to metal ion, for example, it is preferred that when the metal ion is silver ion, and sodium tetrahydroborate and formaldehyde are selected, and the metal ion is palladium ion, hydrazine and formaldehyde are selected.

As a method of applying the reducing agent, for example, the method in which after washing the resin film, to which metal ions are adhered, and removing excess metal ions, the substrate having the resin film is immersed in water such as ion exchange water, and a reducing agent is added thereto, and the method in which a solution of reducing agent in a predetermined concentration is directly coated or added dropwise onto the resin film, may be exemplified.

Further, it is desirable that the reducing agent is preferably used in an amount of an equivalent or more, and more preferably in an amount of ten equivalents or more with respect to metal ions.

This reduction process may be carried out at the same time of the plating process by adding a reducing agent to the plating bath.

By this reduction process, metal ions deposit and metal particles are obtained. That is, metal particles are present in the resin film after the reduction process.

(Electroless Plating)

Electroless plating means an operation of depositing metal by a chemical reaction, with the use of a solution in which the metal ions to be deposited as a plating are dissolved.

The electroless plating in this process is carried out in such a manner that, for example, a substrate having a resin film, in which metal particles are present, is washed with water to remove excess metal ions or excess metal particles, and thereafter the substrate is immersed in an electroless plating bath. As the electroless plating bath to be used, generally known electroless plating baths may be used.

In the case where a board having an electroless plating catalyst precursor provided thereon is immersed in the electroless plating bath while the electroless plating catalyst precursor is still adsorbed or impregnated in the polymer layer, the board is washed with water to remove excess precursor (metal salt or the like), and then is immersed into the electroless plating bath. In this case, in the electroless plating bath, the reduction of the plating catalyst precursor is performed, followed by electroless plating. Also as the electroless plating bath to be used herein, generally known electroless plating baths may be used, in a manner similar to the above.

Furthermore, the reduction of the electroless plating catalyst precursor may also be carried out in a separate process prior to the electroless plating, by preparing a catalyst activating liquid (reducing liquid) different from the exemplary embodiment of using the electroless plating liquid as described above. The catalyst activating liquid is a liquid in which a reducing agent capable of reducing an electroless plating catalyst precursor (mainly metal ions) to zero-valent metal, is dissolved at a concentration in the range of from 0.1% to 50%, and is preferably in the range of from 1% to 30%. Examples of the reducing agent that may be used include boron-based reducing agents such as sodium borohydride and dimethylamineborane, and reducing agents such as formaldehyde and hypophosphorous acid.

As the composition of a common electroless plating bath, in addition to the solvent, (1) metal ions for plating, (2) a reducing agent, and (3) additives for enhancing the stability of the metal ions (stabilizer) are mainly contained. In addition to these components, the plating bath may also contain known additives such as a stabilizer for the plating bath.

The solvent used in the plating bath preferably contains an organic solvent which has high affinity for the polymer layer with low water absorptivity and high hydrophobicity (the plating receptive layer satisfying any of the above-described conditions 1 to 4). Selection of the type or the content of the organic solvent may be determined in accordance with the physical properties of the hydrophobic cured product surface layer. In particular, it is preferred that the content of the organic solvent is lowered with increasing the saturated water absorption rate according to the condition 1 in the hydrophobic cured product surface layer. Specifically, details are as follows.

That is, if the saturated water absorption rate according to the condition 1 is from 0.01% by mass to 0.5% by mass, the content of the organic solvent in the entire solvent in the plating bath is preferably from 20% to 80%, and if the saturated water absorption rate is from 0.5% by mass to 5% by mass, the content of the organic solvent in the entire solvent in the plating bath is preferably from 10% to 80%. If the saturated water absorption rate is from 5% by mass to 10% by mass, the content of the organic solvent in the entire solvent in the plating bath is preferably from 0% to 60%, and if the saturated water absorption rate is from 10% by mass to 20% by mass, the content of the organic solvent in the entire solvent in the plating bath is preferably from 0% to 45%.

The organic solvent used in the plating bath needs to be a solvent miscible with water, and from this viewpoint, ketones such as acetone, and alcohols such as methanol, ethanol and isopropanol are preferably used.

As the kind of metal used in the electroless plating bath, copper, tin, lead, nickel, gold, palladium and rhodium are known, and among them, from the viewpoint of electrical conductivity, copper and gold are particularly preferable.

Further, there are optimal reducing agents and additives corresponding to the aforementioned metals. For example, the electroless plating bath for copper contains $CuSO_4$ as a copper salt, HCOH as a reducing agent, and as additives, a chelating agent such as EDTA and Rochelle salt which are stabilizers for copper ions, and trialkanolamine and the like. The plating bath used for electroless plating of CoNiP contains cobalt sulfate and nickel sulfate as metal salts, sodium hypophosphite as a reducing agent, and sodium malonate, sodium malate or sodium succinate as a complexing agent. The electroless plating bath for palladium contains $(Pd(NH_3)_4)Cl_2$ as a metal ion, $NH_3$ and $H_2NNH_2$ as reducing agents, and EDTA as a stabilizer. These plating baths may also include components other than the above components.

Commercially available plating liquid may be used, and, for example, SULCUP PGT ((trade name) manufactured by Uemura & Co., Ltd.), and ATS ADCOPPER IW ((trade name) manufactured by Okuno Chemical Industries Co., Ltd. may be exemplified.

In the invention, from the viewpoint of enhancing the surface smoothness of the plated metal film, in an exemplary embodiment, it is preferable to use an electroless plating bath that the internal stress becomes a tensed state slightly at the time of plating. More specifically, in particular, when the film thickness of the electroless plating is in the range of 0 µm to 2 µm, it is preferable to use a bath that the internal stress is from −300 MPa to +500 MPa, more preferably to use a bath that the internal stress is from −100 MPa to +350 MPa, and still more preferably to use a bath that the internal stress is from −50 MPa to +250 MPa, provided that a larger force in the contraction direction is the negative side. In the case where the internal stress is too large in the negative side, defects such as bumps or blisters in the metal film arise easily, on the other hand, in the case that the internal stress is too large in the positive side, defects such as cracks in the metal film arise easily.

Preferable examples of electroless plating bath solutions which form the internal stress in the above range include, as commercially available electroless plating bath solutions SULCUP PGT ((trade name) manufactured by Uemura & Co., Ltd.),and ATS ADCOPPER IW ((trade name) manufactured by Okuno Chemical Industries Co., Ltd., ENPLATE NI 426 ((trade name) (electroless plating liquid) manufactured by Meltex Inc.), and ENPLATE NI 2250 ((trade name) (electroless plating liquid) manufactured by Meltex Inc.). The electroless plating bath solutions are not limited to them, but all the electroless plating bath solutions including commercially available products may be used, as long as the electroless plating bath solutions have the characteristics within the above ranges. Further, electroless plating bath solutions prepared by adding additives such as foreign metals, phosphorus, organic materials, to commercially available plating bath solutions or plating bath solutions having high compressive stress, or by controlling the deposition speed, the forming speed of plating nuclei and the density of plating nuclei of the commercially available plating bath solutions or plating bath solutions having high compressive stress, so as to be within the above stress ranges, may be used.

As the method of measuring the stress of electroless plating bath solutions, it has been known that there have been known a glass bulb method, a method of measuring the flexure of a flake, a strain gage method, an X-ray method, an electron diffraction method, optical method and the like, and further, as the method of measuring the flexure of a flake, Ragid Flat-Strip method, a strip contract meter method, a spiral contract meter method and the like have been known.

In the invention, although any methods may be used as the method of measuring the stress of electroless plating bath solutions, for example, the following method may be used.

That is, as a stress meter, a strain gage type precise stress meter manufactured by Yamamoto-MS Co., Ltd., is used, a test piece to which a sensor is adhered is plated under the same condition as the condition generally used in plating of a board, and by measuring the changing rate of resistance of the test piece, the stress of an electroless plating bath solution can be obtained.

The thickness of the plated metal film formed by the electroless plating can be controlled by the concentration of the plating bath, immersion time in the plating bath or the temperature of the plating bath, and the thickness is preferably 0.5 µm or more, and more preferably 3 µm or more, from the viewpoint of the electroconductivity. However, when a metal film is formed as a power supply layer for electric plating, the thickness is not necessarily limited thereto, and the metal film with a thickness of 0.1 µm or more is sufficient.

Further, the immersing time in the plating bath is preferably about from one minute to 6 hours, and more preferably from about one minute to three hours.

The cross-sectional view of the plated film obtained by electroless plating in the above manner is observed under an SEM, and it was confirmed that particles composed of electroless plating catalyst and plated metal are densely dispersed in the hydrophobic surface cured product layer, in particular, in the vicinity of the surface thereof, and further, the plated metal is deposited on the cured product layer. Since the interface between the board and the plated layer is a hybrid state of the polymer and fine particles, even if the interface between the board (organic component) and the inorganic product (catalyst metal or plated metal) is smooth (for example, in the case of the plating receptive layer according to the invention, Ra is 0.1 µm or less in the area of 1 mm$^2$), the adhesiveness between the substrate and the formed metal layer is good.

(Electroplating)

In this process, when the metal particles deposited during the above reduction process are densely packed and function as an electrode, electroplating may be performed on the resin film to which the catalyst or the catalyst precursor has been applied.

The electroplating may further be carried out after the above electroless plating, with the use of the formed plated film as an electrode. Thus, the electroless plated film as a base having excellent adhesiveness to the board, and a metal film with any thickness may be newly and easily formed thereon. As such, by performing electroplating after electroless plating, a metal film may be formed to have a thickness in accordance with the intended purpose, and thus the metal film of the invention is suitable to be applied to various applications.

As the method for electroplating in the invention, conventionally known methods may be used. In addition, examples of metals used in the electroplating of this process include copper, chromium, lead, nickel, gold, silver, tin, zinc and the like. From the viewpoint of electrical conductivity, copper, gold and silver are preferable, and copper is more preferable.

The thickness of the metal film obtained by electroplating may vary with the use, and may be controlled by adjusting the metal concentration contained in the plating bath, current density or the like. In addition, from the viewpoint of electrical conductivity, the film thickness in the case of being used in general electrical wiring or the like is preferably 0.5 µm or more, and more preferably 3 µm or more.

The metal film formed in the process (a3), from the viewpoint of improving the physical properties of the metal film has preferably a surface roughness Rz of 5 µm or less, and more preferably Rz of 1 µm or less, measured by the ten point average height method in accordance with JIS B 0601 (1994) to be formed. If the surface smoothness of a substrate is within the above range, namely, in a state of high smoothness, the substrate can be favorably used when a printed circuit board having an extremely fine circuit (for example, a circuit pattern with a value of line/space of 25/25 µm or less) is manufactured.

Further, in the invention, the metal or metal salt resulting from the above plating catalyst or a plating catalyst precursor, and/or the metal deposited in the resin film by electroless plating form a fractal-like microstructure in the layer, and thereby the adhesiveness between the metal film and the resin film may be further enhanced.

With regard to the amount of metal present in the resin film, when the cross-section of the substrate are photographed with a metal microscope, the proportion of metal contained in a region extending from the outermost surface of the resin film down to a depth of 0.5 µm is 5% by area to 50% by area, and when the arithmetic average roughness Ra (JIS B 0633-2001) of the interface between the resin film and the metal is from 0.05 µm to 0.5 µm, even stronger adhesive power is exhibited.

When the film with a double-sided metal film obtained by the invention is used for formation of wiring, a via for connecting between the metal films provided on the both surfaces of the resin film (substrate) may be provided.

Thus, in order to manufacture the film with the double-sided metal film using the substrate having a via (through hole) in the invention, it is desirable to have further the process (a4) for forming a via in a resin film, and the process (a5) for forming the resin film which has metal ion adsorptivity on the side surface of the via.

[Process (a4)]

In the process (a4), a via is formed in a resin film (substrate).

Although drill machining is generally used for forming the via, in the case of a micro machining, a method of forming a via hole with use of laser beam machining or the like may also be applicable.

As laser used for this process, the oscillation wavelength in the wavelength from the ultraviolet light region to the infrared light region, may be used. In addition, here, the ultraviolet light region refers to the wavelength region in the range of from 50 nm to 400 nm, and, the infrared light region refers to the wavelength region in the range of from 750 nm to 1 mm. As the laser which can be used, an ultraviolet laser, a carbon dioxide laser or the like may be exemplified.

As the ultraviolet laser, in general, the light-emitting wavelength region is preferably from 180 nm to 380 nm, more preferably from 200 nm to 380 nm, and more preferably from 300 nm to 380 nm. Examples of the laser sources for obtaining the ultraviolet laser beam include gas lasers such as Ar, $N_2$, ArF, KrF, XeCL, XeF, He—Cd and He—Ne; solid-state lasers such as YAG, NdYAG, Nd glass and alexandrite; and dye lasers with use of a dye dissolved in an organic solvent. In particular, YAG laser and NdYAG laser which are capable of oscillating high-output energy, have long-life and maintainability with low cost, are preferable. As the oscillation wavelength of the ultraviolet radiation region, the high harmonic wave of these lasers is suitably used. The laser harmonic wave can be obtained in such a manner that by oscillating a YAG laser, for example, a laser beam with a wavelength of 1.06 μm (fundamental harmonic) is emitted, the emitted laser beam is passed through two non-linear crystals (LBO crystal) in parallel with the optical path and is converted to THG beam (ultraviolet light) with a wavelength of 0.355 μm through SHG beam with a wavelength of 0.53 μm. As a device for obtaining such a high harmonic wave, a laser beam machine as recited in JP-A No. 11-342485 is exemplified. Although a laser may irradiate continuously or intermittently, intermittent irradiation with short pulses is desirable, because occurrence of cracks can be prevented.

The number of times of irradiation in the short pulse irradiation (the number of shots) is usually from 5 times to 500 times, and preferably from 10 times to 100 times. If the number of times of irradiation increases, machining time becomes longer and cracks tend to arise. The pulse cycles are usually 3 kHz -8 kHz, and preferably 4 kHz -5 kHz. The carbon dioxide laser is a molecular laser, the efficiency for changing from electric power to laser beam is 10% or more, and a high output power with several tens of kW can be generated at the oscillation wavelength of 10.6 μm. The carbon dioxide laser has usually energy of about 20 mJ to 40 mJ, and the machining is performed at the short pulse for about $10^{-4}$ second to $10^{-8}$ second. The number of pulse shots required for the via formation is usually about 5 shots-about 1,000 shots. The via formed is used as a through hole and a blind via hole.

The ratio (hole size ratio: d1/d0×100[%]) of the inner diameter (d1) at the bottom portion of a via to the inside diameter (d0) at the inlet (surface) portion of the via is usually 40% or more, preferably 50% or more, and more preferably 65% or more. Further, d0 is preferably in the range of from 10 μm to 250 μm, and more preferably in the range of from 20 μm to 80 μm. The via with a large hole size ratio is hard to arise the continuity failure and is highly reliable.

The timing when this process is performed not particularly limited, but, the process may be performed in the state of a resin (substrate) film alone in an independent state, or may be performed in the state after an adhesion auxiliary layer, a specific polymerizable compound-containing layer, a resin film, a metal film, a metal plated film or the like is formed on the substrate.

However, in the process (F), which will be described later, a resin film having metal ion adsorptivity is formed on the side surface (inner periphery) of a via formed in the resin film (substrate), and thereafter, the process (a2) and the process (a3) as describe above are performed, so that the metal film having excellent adhesiveness can be formed in the inside of the via at the same time formation of the metal film on the one surface of the substrate. From this point of view, it is preferred that this process is performed for the resin film (substrate) independently, or after a metal film is formed on the substrate by the processes (a1)-(a3), or after the metal film and the resin film are formed on the substrate. In particular, it is preferred that this process is performed for the substrate after the metal film is formed on the substrate by the processes (a1)-(a3).

In addition, although it is possible to form a metal film by plating, without providing a resin film having metal adsorptivity in the inside of a via, in order to ensure a better adhesiveness, it is preferred that a conditioning treatment or a catalyst applying treatment, which are commonly performed, is performed prior to the plating process.

Moreover, in the invention, a desmear process for removing smear which remains in the formed via may be carried out. This is carried out by roughening the surface of the inside of a via hole by a dry method and /or a wet method. Examples of the dry roughening methods include mechanical polishing such as buffing and sandblasting; and plasma etching and the like. On the other hand, examples of the wet roughening methods include chemical processes using oxidizers such as permanganate, dichromate, ozone, hydrogen peroxide/sulfuric acid and nitric acid; a strong base, and a resin swelling solvent and the like. The desmear process may be carried out after the metal film to be a power supply layer is formed by electroless plating utilizing a seed on an insulation film. This process includes a swelling process, an etching process, a neutralizing process and the like. For example, a swelling process using an organic solvent-based swelling liquid at 60° C. for 5 minutes, an etching process using a sodium permanganate-based etching liquid at 80° C. for 10 minutes, a neutralizing process using a sulfaric acid-based neutralizing liquid at 40° C. for 5 minutes and the like may be exemplified.

When the desmear process is not performed, it is effective to wash the resin film (substrate) with a solvent capable dissolving or swelling the film.

[Process (a5)]

In this process, a resin film having metal ion adsorptivity is formed on the side surface of the via formed in the above process (a4).

The resin film having metal ion adsorptivity to be formed in this process is similar to the resin film having metal ion adsorptivity formed in the above process (a3), and preferable examples are also similar thereto.

In the invention, as the methods for forming the resin film having metal ion adsorptivity formed on the side surface of a via, for example, the methods described below are exemplified, but is not limited to these methods.

As a first method, first, after the process (a1) and the process (a4) and the process (a2) in the above are performed in this order, a protective layer is provided on the resin film having adsorptivity for the plating catalyst or the plating catalyst precursor formed in the process (a2), thereafter, the protective layer at the via portion is removed, and the substrate having the via portion is immersed in a liquid composition containing a specific polymerizable compound. Thereafter, the substrate having the via portion is drawn up, and the side surface of the via is exposed to light using a diffuse type exposure method to form a resin film having metal ion adsorptivity.

As a second method, first, after the process (a1) and the process (a4) and the process (a2) in the above are performed in this order, only the inside of the via is filled with a liquid composition containing a specific polymerizable compound without providing a protective layer as described above. Thereafter, excess liquid is removed and the side surface of the via is exposed to light using a diffuse type exposure method to form a resin film having metal ion adsorptivity.

As a third method, first, after the process (a1)—the process (a3) and the process (a4) in the above are performed in this order, the substrate having the via portion is immersed in a liquid composition containing a specific polymerizable compound. Thereafter, the substrate having the via portion is drawn up, and the one surface of the substrate and the side surface of the via are simultaneously exposed to light using a diffuse type exposure method to form a resin film having metal ion adsorptivity on one surface of the substrate and on the side surface of the via.

As a fourth method, first, after the process (a1)—the process (a3) and the process (a4) in the above are performed in this order, a protective layer is formed on the surface of the substrate other than the via, and a liquid composition containing a specific polymerizable compound is brought into contact with the via, and exposure is performed by any one of the above first to the third method to form a resin film having metal ion adsorptivity on the side surface of the via. Thereafter, the protective layer is removed and the resultant substrate is used for the subsequent process.

As described in the third method in the above, except that the resin films are formed on the one surface of the substrate and the side surface of the via simultaneously, the parallel type exposure method can be used at the time of forming a resin film having metal ion adsorptivity on one surface of the substrate, so that formation of a fine pattern becomes possible and the patterning of the resin film having metal ion adsorptivity itself becomes possible.

[Protective Layer Forming Process]

In the invention, a protective layer may be formed on the surface of the metal film prepared in the process (a1)—process (a3), and the surface of the plated metal film prepared in process (a4).

As this protective layer, a dry film resist, a coverlay, a solder resist and the like are used.

The thickness of the protective layer is preferably from 5 μm to 200 μm. When the thickness of the protective layer is less than 5 μm, the film tears easily, the handling property becomes worse, and on the other hand, and the film which exceeds 200 μm does not satisfy the conditions for folding endurance. Thus, the thickness of the film is preferably in the range of from 10 μm to 50 μm.

The metal film-coated material obtained by the manufacturing method of the metal film-coated material according to the invention (production method of the metal film-coated material the invention) has the plated metal film formed by using a plating receptive layer as an anchor.

This plated metal film exhibits excellent adhesiveness to a substrate with high surface smoothness. Accordingly, a high definition (for example a value of line/space of 25/25 μm or less) wiring excellent in adhesiveness can be formed, without being influenced by the irregularity on the surface of the substrate.

As described above, according to the production method of the invention, the metal film capable of forming wiring with fine line/space can be simply prepared. As a result, effect of a wide range of selections for use can be attained.

<Formation of Wiring (Metal Pattern)>

A wiring (metal pattern) can be formed by patterning the metal film of a metal film-coated material (metal film-coated material of the invention) obtained by the method of manufacturing the metal film-coated material according to the invention by known methods for patterning a metal film.

That is, in this process, a desired metal pattern can be formed by removing the unnecessary portion of the plated film formed over the entire surface of the board by etching.

Any techniques can be used for forming the metal pattern, and more specifically, the subtractive method and the semi-additive process which are generally known are used.

In the subtractive method, a dry film resist layer formed on the formed metal film is pattern-exposed, the same pattern in the resist layer as the metal pattern is formed by development, and the metal layer is removed with an etching solution using the dry film resist pattern as a mask to form a metal pattern. As the dry film resist, any materials can be used and a negative type resist, a positive type resist, a liquid type resist and a film-shaped resist may be used. Moreover, as the etching method, any method used at the time of manufacturing a printed circuit board may be used, and a wet etching, dry etching and the like may be used, and the methods may be freely selected. In view of workability, the wet etching is desirable because of the simplicity of devices. As the etching solution, for example, aqueous solutions such as cupric chloride and ferric chloride may be used.

In addition, the thickness of the metal film to which the subtractive method is applied, is desirably 5 μm or more, and more desirably in the range of from 5 μm to 30 μm.

Further, in the semi-additive process, a dry film resist layer provided on the formed metal film, is pattern- exposed, the same pattern in the resist layer as the portion where the metal pattern is not present is formed by development, and an electroplating is performed using the dry film resist pattern as a mask. Thereafter, the metal film is removed in a pattern-shape by quick etching after the dry film resist pattern is removed to form a metal pattern. The same material for the dry film resist, the etching solution and the like as those of the subtractive method can be used. Moreover, as the technique of electroplating, the technique described in the above may be used. In addition, the thickness of the metal film to which the semi-additive process is applied, is desirably in the range of from 0.3 μm to 3 μm so as to be able to perform the etching processing in a short time.

A desired metal pattern (wiring) can be formed through the above processes.

In addition, the electroplating or the electroless plating may be further performed on the metal pattern formed by the above methods.

In the invention, a process, in which the resin layer remained in a area where the metal film is not formed after the metal pattern is formed is inactivated, may be performed. Failures such as ion migration or the like may also be prevented by the inactivating process. As the method of inactivation, the method in which a certain ionic compound is allowed to react with the resin layer to form an insoluble salt structure, or the method in which a moiety (in particular, polar group) having ion adsorptivity is chemically modified to form an insulating group or a hydrophobic group, may be exemplified.

Furthermore, when the obtained metal pattern is used for wiring, in order to enhance the adhesiveness between the metal pattern and an electric insulating layer or a solder resist layer to be formed on the metal pattern, the metal pattern may be modified to a functional group capable of forming a chemical bond to these layers.

Further, a process, in which the resin layer remained in a area where the metal film is not formed after the metal pattern is formed is removed, may be performed. For example, the desmear method used in the surface roughening process may be used. As the desmear process, a method using alkaline permanganate is known. This process includes a swelling process, an etching process, a neutralizing process and the like. By performing this process, when the obtained metal pattern is used for wiring, the adhesiveness between the metal pattern and an electric insulating layer or a solder resist layer to be formed on the metal pattern can be enhanced. Furthermore, since the metal pattern is not surface-roughened at the time of forming wiring, a high definition wiring pattern can be obtained.

When the formed metal pattern is made of copper, known copper surface treatment may be performed. Examples of the copper surface treatment methods includes the black oxide treatment method, the copper oxide reducing method, the copper surface-roughening method, the surface-roughening electroless copper plating method and the like. By performing this process, when the obtained metal pattern is used for wiring, the adhesiveness between the metal pattern and the electric insulating layer or the solder resist layer to be formed on the metal pattern can be enhanced.

Further, the formed metal pattern may be subjected to an anti-corrosive treatment for preventing the surface thereof from oxidation.

A multilayer wiring board can be prepared by laminating the substrates formed metal pattern thereon through electric insulating layers.

Hereinafter, exemplary embodiments of the invention are to be exemplified.

<1> A multilayer film for plating comprising, on a surface of a first substrate, a plating receptive layer which contains a polymer having a polymerizable group and a functional group that interacts with a plating catalyst or a plating catalyst precursor, or which contains a polymer precursor capable of forming a polymer having a polymerizable group and a functional group that interacts with a plating catalyst or a plating catalyst precursor, wherein the plating receptive layer on the first substrate is transferable to a second substrate to form the plating receptive layer on the second substrate, and the plating receptive layer satisfies at least one of the following (1)-(4):

(1) the saturated water absorption ratio of the plating receptive layer is from 0.01% by mass to 10% by mass in an environment of a temperature of 25° C. and relative humidity of 50%;

(2) the saturated water absorption ratio of the plating receptive layer is from 0.05% by mass to 20% by mass in an environment of a temperature of 25° C. and relative humidity of 95%;

(3) the water absorption ratio of the plating receptive layer is from 0.1% by mass to 30% by mass after immersion of the plating receptive layer in boiling water at 100° C. for one hour; and (4) the surface contact angle of distilled water is from 50° to 150° after 5 μl of the distilled water is dropped onto the plating receptive layer and allowed to stand for 15 seconds in an environment of a temperature of 25° C. and relative humidity of 50%.

<2> The laminatemultilayer film for plating according to <1>, wherein the plating receptive layer comprises a plating catalyst or a plating catalyst precursor.

Here, as a more preferable range of the hydrophobic group, the plating receptive layer satisfies at least one of the following (1')-(4'):

(1') the saturated water absorption ratio is from 0.01% by mass to 5% by mass under the condition of a temperature of 25° C. and a relative humidity of 50%;

(2') the saturated water absorption ratio is from 0.05% by mass to 10% by mass under the condition of a temperature of 25° C. and a relative humidity of 95%;

(3') the water absorption ratio of from 0.1% by mass to 20% by mass after being immersed in boiling water at 100° C. for one hour; and (4') the surface contact angle is from 55° to 150° after 5 μl of distilled water is dropped and is allowed to stand for 15 seconds under the condition of a temperature of 25° C. and a relative humidity of 50%.

<3> The multilayer film for plating according to the above <1> or <2>, wherein the multilayer film comprises, on a surface of the plating receptive layer, an adhesion auxiliary layer which contains a compound capable of covalent bonding interaction with the polymerizable group.

<4> The laminate film for plating according to any of the above <1> to <3>, wherein a protective layer is provided on the plating receptive layer or on the adhesion auxiliary layer.

<5> A method of manufacturing a metal film-coated material, the method comprising:

transferring a plating receptive layer, with the use of the multilayer film for plating according to claim 1, onto a second substrate to form a board;

applying a plating catalyst or a plating catalyst precursor to the plating receptive layer; and performing plating on the plating catalyst or the plating catalyst precursor.

<6> The method of manufacturing the metal film-coated material according to the above <5>, the method further comprising applying energy after the plating receptive layer is transferred onto the second substrate and chemically bonding the polymer to the second substrate.

<7> The method of manufacturing the metal film-coated material according to any of the above <5> or <6>, the method further comprising forming a polymerization initiating layer which contains a polymerization initiator or a functional group capable of initiating polymerization on the second substrate, and chemically bonding the polymer directly to the polymerization initiating layer after the plating receptive layer is transferred to the second substrate.

<8> The method of manufacturing the metal film-coated material according to any of the above <5>-<7>, wherein the thickness of the plating receptive layer is from 0.1 μm to 50 μm, and is thicker than the Ra value of the surface roughness of the second substrate onto which the plating receptive layer is to be transferred.

<9> The method of manufacturing the metal film-coated material according to any of the above <5>-<8>, wherein the functional group that interacts with a plating catalyst or a plating catalyst precursor is an alkyl cyano group.

<10> The method of manufacturing the metal film-coated material according to any of the above <5>-<9>, wherein the polymer which has a polymerizable group and a functional group that interacts with a plating catalyst or a plating catalyst precursor, is a copolymer comprising a unit (1) represented by the following formula (1) and a unit (2) represented by the following formula (2):

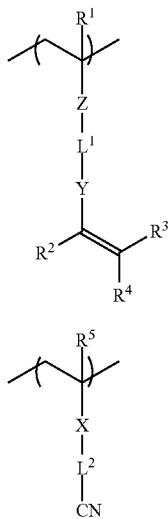

Formula (1)

Formula (2)

(In the formula (1) and formula (2), $R^1$ to $R^5$ each independently represent a hydrogen atom, or a substituted or unsubstituted alkyl group; X, Y and Z each independently represent a single bond, a substituted or unsubstituted divalent organic group, an ester group, an amide group or an ether group; and $L^1$ and $L^2$ each independently represent a substituted or unsubstituted divalent organic group).

<11> The method of manufacturing the metal film-coated material according to any of the above <7>-<10>, wherein the chemical bonding is performed by irradiation with an energy ray.

<12> The method of manufacturing the metal film-coated material according to any of the above <5>-<11>, wherein the plating catalyst or the plating catalyst precursor contains a metal selected from the group consisting of Cr, Ag, Ti, Zn, Au, Pd and Cu.

<13> A metal film-coated material obtained by the method of manufacturing metal film-coated material according to any of <5>-<12>.

EXAMPLES

Hereinafter, the invention will be described in detail with reference to examples, but the invention is not intended to be limited to these examples. Particularly, unless otherwise specified, "%" and "part" are on the mass basis.

Example 1

The following adhesion auxiliary layer was formed on one surface of a polyimide film with a thickness of 25 μm.
[Formation of Adhesion Auxiliary Layer]
 -Synthesis of Polyimide Precursor (Polyamic Acid)-
Under nitrogen gas flow, 4 4'-diaminodiphenyl ether (5.75 g: 28.7 mmol) was dissolved in N-methyl pyrrolidone (30 ml), and the mixture was stirred at room temperature for about 30 minutes.

To this solution, was added 3,3',4,4''-benzophenone tetracarboxylic acid dianhydride (9.25 g:28.7 mmol) at 0° C., and the mixture was stirred for 5 hours. The reaction liquid was reprecipitated and a polyimide precursor was obtained. The molecular weight (Mw) of the polyimide precursor determined with the use of a GPC was 28,000. Further, the structure was identified with $^1$H-NMR and FT-IR.

The polyamic acid synthesized in the above method was dissolved in DMAc (manufactured by Wako Pure Chemical Industries, Ltd.) to form a 20% by mass solution.

After the solution was coated on the surface of the above polyimide film using a spin coater (after rotated at a speed of 300 rpm for 5 seconds, rotated at a speed of 1,500 rpm for 25 seconds), dried at 100° C. for 5 minutes, and cured by heating at 250° C. for 30 minutes to form an adhesive auxiliary layer having a thickness of 1 μm.

A laminate of the resin film on which the adhesion auxiliary layer was formed was obtained. The surface roughness (Rz) of the adhesion auxiliary layer was 0.3 μm.
(Formation of Plating Receptive Layer)
Synthesis of Polymer A having Non-dissociable Functional Group and Polymerizable Group A polymer A having a non-dissociable functional group and polymerizable group was synthesized as follows:

N,N-dimethylacetamide (35 g) was placed in a 1000-ml three-necked flask, and was heated to 75° C. under a nitrogen gas stream. To this, a solution of 6.60 g of 2-hydroxyethyl acrylate, 28.4 g of 2-cyanoethyl acrylate, and 0.65 g of V-601 ((trade name) manufactured by Wako Pure Chemical Industries, Ltd.) in 35 g of N,N-dimethylacetamide was added dropwise over 2.5 hours. After completion of the dropwise addition, the mixture was heated to 80° C., and was further stirred for 3 hours. Thereafter, the reaction solution was cooled to room temperature.

To this reaction solution, 0.29 g of di-tertiary-butylhydroquinone, 0.29 g of dibutyltin dilaurate, 18.56 g of KARENZ AOI ((trade name) manufactured by Showa Denko Kabushiki Kaisha), and 19 g of N,N-dimethylacetamide were added, and the mixture was reacted at 55° C. for 4 hours. Subsequently, 3.6 g of methanol was added to the reaction liquid, and the mixture was reacted further for 1.5 hours. After completion of the reaction, reprecipitation was conducted with ethyl acetate:hexane=1:1, and the solid product was collected, and 32 g of the polymer A having a non-dissociable functional group and polymerizable group was obtained.
(Preparation of Coating Solution)

The polymer A (10.5 parts by mass) having a non-dissociable functional group and a polymerizable group, 73.3 parts by mass of acetone, 33.9 parts by mass of methanol and 4.8 parts by mass of N,N-dimethylacetamide were mixed and stirred, to prepare a coating solution.

The prepared coating solution was coated on one surface of the polyimide film with a thickness of 25 μm by a spin coating method to a thickness of 1 μm, and the film was dried at 80° C. for 30 minutes, to form a plating receptive layer to obtain a laminate film for plating in Example 1.

When the obtained multilayer film for plating was stored for one week under the condition of 40° C. and relative humidity of 90%, and thereafter, was subjected to a transfer test of the plating receptive layer. Transfer unevenness was not observed on the plating receptive layer, and it was found that the multilayer film for plating is excellent in storability.

A polyimide film with a film thickness of 25 μm was used as a board, first, an adhesion auxiliary layer was formed on the board by a transfer method, and subsequently, the plating receptive layer was adhered on the surface of the adhesion auxiliary layer by a transfer method. As the transfer method, first, after a transfer film was temporarily adhered onto the board, the temporarily adhered laminate is subjected to a vacuum lamination with the use of a vacuum laminator ((Model V130) manufactured by Nichigo-Morton Co., Ltd.) at a lamination temperature of 110° C. and a pressure of 0.15 Mpa for 30 seconds. Thereafter, in order to further improve uniformity, the laminate was subjected to an additional lamination with use of a regular roll laminator ((Model VA400-3) Taisei Laminator Co., Ltd.) at a lamination temperature of 110° C., a lamination speed of 0.5 m/minute and a pressure of 1.5 kgf/cm², and 15 minutes later, the temporary support was peeled off.

After transfer, when a tape stripping test was carried out prior to energy application, which will be described later, removal of the plating receptive layer on the surface of the adhesion auxiliary layer was not observed, and it was found that a good adhesiveness between the both layers can be attained.

Thereafter, the laminate was exposed to UV rays for 660 seconds with the use of a UV exposure machine ((Model No. UVF-502S, lamp:UXM-501MD manufacture by Sanei Electric Co., Ltd.) at an irradiation power of 1.5 mW/cm² ((irradiation power was measured by Accumulated UV Meter UIT150 (trade name) with a light receiving sensor UVD-S254) manufactured by Ushio Inc.) to form a graft polymer over the entire surface of the polyimide film.

The board on which the graft polymer was formed was immersed into acetone for 5 minutes in the state where being stirred, and subsequently washed with distilled water.

The film thickness of the resin film (resin film composed of graft polymer) thus obtained was 0.5 μm.

In this way, the board having a layer composed of the plating receptive polymer bonded to the board was obtained.

[Application of Metal Ion and Reduction of Metal Ion]

The board having the plating receptive layer was immersed in a 1% water/acetone mixed solution of paradium nitride (mixing ratio of water/acetone is 6/4 by weight, hereinafter refer to catalyst solution A) at 25° C. for 30 minutes, and was washed by being immersed in water/acetone mixed solution (mixing ratio of water/acetone is 6/4 by weight).

Subsequently, with the use of a 1% dimethyl borane water/methanol (water/methanol=1/3) mixed solution as an activating liquid for catalyst (reduction liquid), in this solution, was immersed the board having the plating receptive layer for 15 minutes, and washed by being immersed in water/acetone mixed solution (mixing ratio of water/acetone is 6/4 by weight).

[Electroless Plating]

The board having the plating receptive layer containing metal particles obtained by reducing metal ions was subjected to electroless plating with the use of an electroless plating bath having the following composition, at 60° C. for 5 minutes. The obtained electroless copper plated film had a thickness of 0.3 μm.

(Composition of Electroless Plating Bath)

| | |
|---|---|
| Distilled water | 859 g |
| Methanol | 850 g |
| Copper sulfate | 18.1 g |
| Ethylenediaminetetraacetic acid•disodium salt | 54.0 g |
| Polyoxyethylene glycol (molecular weight: 1000) | 0.18 g |
| 2,2'-Bipyridyl | 1.8 mg |
| 10% Aqueous solution of ethylenediamine | 7.1 g |
| 37% Aqueous solution of formaldehyde | 9.8 g |

The pH value of the plating bath having the above composition was adjusted to 12.5 (60° C.) with sodium hydroxide and sulfuric acid.

[Electroplating]

Subsequently, electroplating was performed using the electroless copper plated film as a power supply layer, and using a copper electroplating bath having the following composition, under the condition of 3 A/dm² for 20 minutes. The obtained copper electroplating film had a thickness of 18 μm.

(Composition of Electroplating Bath)

| | |
|---|---|
| Copper sulfate | 38 g |
| Sulfuric acid | 95 g |
| Hydrochloric acid | 1 mL |
| Copper Gleam PCM (trade name, manufactured by Meltex, Inc.) | 3 mL |
| Water | 500 g |

<Evaluation of Durability of Metal Pattern>

The obtained metal film was heated at 270° for 30 minutes, and was visually observed as to whether blisters or exfoliations were formed, and blisters or exfoliations were not observed, and it was found that a metal film excellent in adhesiveness even under severe conditions was formed.

[Formation of Metal Pattern]

On the surface of the obtained plated film, an etching resist was formed on the areas to be remained as a metal pattern (wiring pattern), and the plating film in the areas where the resist was not formed, was removed with an etching solution containing $FeCl_3$/HCl. Subsequently, the etching resist was removed with an alkali stripping solution containing a 3% NaOH solution to form an extremely thin wiring (metal pattern) with line·and·space=10 μm/10 μm. The thus formed extremely thin wiring was observed with a color 3D laser microscope VK-9700 ((trade name) manufactured by Keyence Corporation, it was confirmed that an extremely thin copper wiring having a thickness of 18 μm was formed.

Example 2

Using the laminate having the adhesion auxiliary layer obtained in Example 1, an adhesion auxiliary layer was formed on the surface of the plating receptive layer of the multilayer film for plating obtained in Example 1, using a transfer method, to form a multilayer film for plating of Example 2.

When the obtained multilayer film for plating was stored for one week under the condition of 40° C. and relative humidity of 90%, and was subjected to a transfer test of the plating receptive layer. The adhesion auxiliary layer and the plating receptive layer were transferred onto the board, and transfer unevenness was not observed, and it was found that the multilayer film for plating is excellent in storability even in the case that the adhesion auxiliary layer was provided.

Using the multilayer film for plating, a polyimide film having a thickness of 25 μm as a board, in a state where the adhesion auxiliary layer and the plating receptive layer were laminated in two layers, and adhered by transfer method in a manner similar to Example 1.

After transfer, a tape stripping test was carried out prior to the energy application, which is described later, exfoliation of the plating receptive layer on the surface of the adhesion auxiliary layer was not observed, and it was found that a good adhesiveness between the both layers can be attained.

Thereafter, the laminate was exposed to UV rays for 660 seconds with the use of a UV exposure machine ((Model No. UVF-502S, lamp:UXM-501MD manufacture by Sanei Electric Co., Ltd.) at an irradiation power of 1.5 mW/cm² ((irradiation power was measured by Accumulated UV Meter UIT150 (trade name) with a light receiving sensor UVD-S254) manufactured by Ushio Inc.) to form a graft polymer over the entire surface of the polyimide film.

The board on which the graft polymer was formed was immersed into acetone for 5 minutes with stirring, and subsequently washed with distilled water.

The film thickness of the resin film (resin film composed of graft polymer) thus obtained was 0.5 μm.

In this way, the board having the plating receptive layer was obtained. Thereafter, a metal film-coated material was formed in a manner similar to Example 1 was formed, a similar evaluation was performed, and the thickness of the obtained electroplated copper film was 18 μm. The obtained plated metal film was heated at 270° for 30 minutes, and the metal pattern after being heated was visually observed as to whether blisters or exfoliations were formed, and blisters or exfoliations were not observed, and it was found that a metal film excellent in adhesiveness even under severe conditions is formed.

An object of the invention is to provide a multilayer film for plating capable of forming a metal film having an excellent adhesiveness, and forming a plating receptive layer which can form a metal film with highly reliable insulation among the patterns of the formed metal layer on any surface with ease.

Moreover, another object of the invention is to provide a method of manufacturing a metal film-coated material capable of forming a metal pattern excellent in adhesiveness and insulation reliability among patterns on any smooth substrate surfaces, and a metal film-coated material manufactured by the method.

The metal film-coated material formed by the method of the invention is a layer having a plating receptive layer formed from a hydrophobic polymer, and since such a layer formed on a transfer film is transferred onto any substrate surfaces with a transfer method, when a hydrophobic plating receptive layer is formed, a uniform layer which does not easily cause coating spots or coating unevenness at the time of forming a hydrophobic plating receptive layer can be formed. Furthermore, the plating receptive layer formed from the hydrophobic polymer can be easily adhered to a hydrophobic board, and is advantageous because further uniformity of the layer and embedding of defects is expected in a laminating process.

Since a hydrophobic polymer is used in the multilayer film for plating of the invention, the transfer film itself is less hygroscopic, and has an excellent storability superior to the conventional multilayer film in which a aqueous polymer is used.

When such a multilayer film for plating is used, not only a plating receptive layer over entire areas on the surface of the substrate where the plating receptive layer is needed can be formed, but a plating receptive layer is beforehand patterned on the transfer film, and only an area needed to be transferred can also be transferred. Accordingly, the multilayer film according to the invention exerts an outstanding effect on the full additive process and the semi-additive process, at the time of forming a metal film.

According to the invention, a multilayer film for plating capable of forming a metal film having an excellent adhesiveness, and forming a plating receptive layer which can form a metal film having high reliability of insulation among the patterns of the formed metal layer on any substrate surface with ease.

Moreover, the invention can provide a method of manufacturing a metal film-coated material capable of forming a metal pattern excellent in adhesiveness and insulation reliability among patterns on any smooth substrate surfaces, and a metal film-coated material manufactured by the method.

What is claimed is:

1. A multilayer film for plating comprising, on a surface of a first substrate, a plating receptive layer which contains a polymer having a polymerizable group and an alkylcyano group, or which contains a polymer precursor capable of forming a polymer having a polymerizable group and an alkylcyano group, wherein the plating receptive layer on the first substrate is transferable to a second substrate to form the plating receptive layer on the second substrate, and the plating receptive layer satisfies at least one selected from the group consisting of the following (1)-(4):

(1) the saturated water absorption ratio of the plating receptive layer is from 0.01% by mass to 10% by mass in an environment of a temperature of 25° C. and relative humidity of 50%;

(2) the saturated water absorption ratio of the plating receptive layer is from 0.05% by mass to 20% by mass in an environment of a temperature of 25° C. and relative humidity of 95%;

(3) the water absorption ratio of the plating receptive layer is from 0.1% by mass to 30% by mass after immersion of the plating receptive layer in boiling water at 100° C. for one hour; and (4) the surface contact angle of distilled water is from 50° to 150° after 5 μl of the distilled water is dropped onto the plating receptive layer and allowed to stand for 15 seconds in an environment of a temperature of 25° C. and relative humidity of 50%.

2. The multilayer film for plating according to claim 1, wherein the plating receptive layer comprises a plating catalyst or a plating catalyst precursor.

3. The multilayer film for plating according to claim 1, wherein the multilayer film comprises, on a surface of the plating receptive layer, an adhesion auxiliary layer which contains a compound capable of covalent bonding interaction with the polymerizable group.

4. The multilayer film for plating according to claim 1, wherein a protective layer is provided on the plating receptive layer.

5. The multilayer film for plating according to claim 3, wherein a protective layer is provided on the adhesion auxiliary layer.

6. The multilayer film for plating according to claim 1, wherein the polymer which has a polymerizable group and an alkylcyano group, is a copolymer comprising a unit (1) represented by the following formula (1) and a unit (2) represented by the following formula (2):

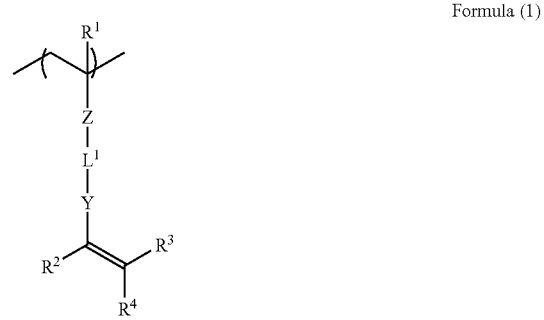

Formula (1)

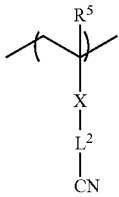

Formula (2)

wherein, in Formulae (1) and (2), $R^1$ to $R^5$ each independently represent a hydrogen atom, or a substituted or unsubstituted alkyl group; X, Y and Z each independently represent a single bond, a substituted or unsubstituted divalent organic group, an ester group, an amide group or an ether group; and $L^1$ and $L^2$ each independently represent a substituted or unsubstituted divalent organic group.

7. A method of manufacturing a metal film-coated material, the method comprising:
transferring a plating receptive layer, with the use of the multilayer film for plating according to claim 1, onto a second substrate to form a board;
applying a plating catalyst or a plating catalyst precursor to the plating receptive layer; and
performing plating on the plating catalyst or the plating catalyst precursor.

8. The method of manufacturing the metal film-coated material according to claim 7, the method further comprising applying energy after the plating receptive layer is transferred onto the second substrate and chemically bonding the polymer to the second substrate.

9. The method of manufacturing the metal film-coated material according to claim 7, the method further comprising forming a polymerization initiating layer which contains a polymerization initiator or a functional group capable of initiating polymerization on the second substrate, and chemically bonding the polymer directly to the polymerization initiating layer after the plating receptive layer is transferred to the second substrate.

10. The method of manufacturing the metal film-coated material according to claim 7, wherein the thickness of the plating receptive layer is from 0.1 μm to 50 μm, and is thicker than the Ra value of the surface roughness of the second substrate onto which the plating receptive layer is to be transferred.

11. The method of manufacturing the metal film-coated material according to claim 7, wherein the functional group that interacts with a plating catalyst or a plating catalyst precursor is an alkyl cyano group.

12. The method of manufacturing the metal film-coated material according to claim 7, wherein the polymer which has a polymerizable group and a functional group that interacts with a plating catalyst or a plating catalyst precursor, is a copolymer comprising a unit (1) represented by the following formula (1) and a unit (2) represented by the following formula (2):

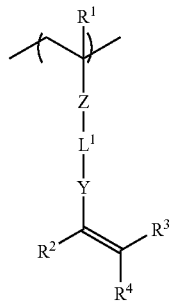

Formula (1)

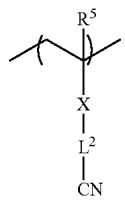

Formula (2)

wherein, in Formulae (1) and (2), $R^1$ to $R^5$ each independently represent a hydrogen atom, or a substituted or unsubstituted alkyl group; X, Y and Z each independently represent a single bond, a substituted or unsubstituted divalent organic group, an ester group, an amide group or an ether group; and $L^1$ and $L^2$ each independently represent a substituted or unsubstituted divalent organic group.

13. The method of manufacturing the metal film-coated material according to claim 9, wherein the chemical bonding is performed by irradiation with an energy ray.

14. The method of manufacturing the metal film-coated material according to claim 7, wherein the plating catalyst or the plating catalyst precursor contains a metal selected from the group consisting of Cr, Ag, Ti, Zn, Au, Pd and Cu.

15. A metal film-coated material obtained by the method of metal film-coated material according to claim 7.

\* \* \* \* \*